United States Patent
Son et al.

(10) Patent No.: US 9,793,368 B2
(45) Date of Patent: Oct. 17, 2017

(54) SEMICONDUCTOR DEVICES INCLUDING A RARE EARTH ELEMENT AND METHODS OF FORMING SEMICONDUCTOR DEVICES INCLUDING A RARE EARTH ELEMENT

(71) Applicants: Hyeok-jun Son, Seoul (KR); Wan-don Kim, Yongin-si (KR); Hoon-joo Na, Hwaseong-si (KR); Sang-jin Hyun, Suwon-si (KR); Yoon-tae Hwang, Seoul (KR); Jae-yeol Song, Seoul (KR)

(72) Inventors: Hyeok-jun Son, Seoul (KR); Wan-don Kim, Yongin-si (KR); Hoon-joo Na, Hwaseong-si (KR); Sang-jin Hyun, Suwon-si (KR); Yoon-tae Hwang, Seoul (KR); Jae-yeol Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/048,797

(22) Filed: Feb. 19, 2016

(65) Prior Publication Data

US 2016/0315164 A1    Oct. 27, 2016

(30) Foreign Application Priority Data

Apr. 23, 2015   (KR) ........................ 10-2015-0057537

(51) Int. Cl.
*H01L 29/49* (2006.01)
*H01L 29/78* (2006.01)
*H01L 29/51* (2006.01)

(52) U.S. Cl.
CPC ........ *H01L 29/4958* (2013.01); *H01L 29/513* (2013.01); *H01L 29/517* (2013.01); *H01L 29/7851* (2013.01)

(58) Field of Classification Search
CPC .................. H01L 21/28185; H01L 21/823842
See application file for complete search history.

(56) References Cited

U.S. PATENT DOCUMENTS

| | | | |
|---|---|---|---|
| 6,753,567 B2 | 6/2004 | Maria et al. |
| 7,498,247 B2 | 3/2009 | Ahn et al. |
| 7,507,652 B2 | 3/2009 | Cho et al. |
| 7,947,549 B2 | 5/2011 | Park et al. |
| 8,232,606 B2 | 7/2012 | Chudzik et al. |

(Continued)

FOREIGN PATENT DOCUMENTS

KR    1020120125017 A    11/2012

OTHER PUBLICATIONS

Huang et al., "Device and Reliability Improvement of HFSION+LAOX/Metal Gate Stacks for 22NM Node Application", Sematech, IEEE International Electron Devices Meeting, Dec. 15-17, 2008, 4 pages.

(Continued)

*Primary Examiner* — Fernando L Toledo
*Assistant Examiner* — Valerie N Newton
(74) *Attorney, Agent, or Firm* — Myers Bigel, P.A.

(57) ABSTRACT

Semiconductor devices are provided. A semiconductor device includes an insulating layer. The semiconductor device includes a rare earth element supply layer on the insulating layer. Moreover, the semiconductor device includes a metal layer that is on the rare earth element supply layer. The rare earth element supply layer is between the insulating layer and the metal layer. Methods of forming semiconductor devices are also provided.

18 Claims, 68 Drawing Sheets

(56) References Cited

U.S. PATENT DOCUMENTS

| | | |
|---|---|---|
| 8,334,183 B2 | 12/2012 | Clark et al. |
| 8,786,030 B2 | 7/2014 | Ando et al. |
| 2010/0261342 A1* | 10/2010 | Clark .................. H01L 21/3141 |
| | | 438/591 |
| 2012/0280330 A1 | 11/2012 | Lee et al. |
| 2013/0154019 A1 | 6/2013 | Ando et al. |
| 2013/0256803 A1 | 10/2013 | Clark |
| 2014/0048865 A1 | 2/2014 | Toh et al. |
| 2014/0124876 A1 | 5/2014 | Kim et al. |

OTHER PUBLICATIONS

Kang et al., "The Impact of LA-Doping on the Reliability of Low VTHHigh-K/Metal Gate NMOSFETSUnder Various Gate Stress Conditions", Sematech, IEEE International Electron Devices Meeting, Dec. 15-17, 2008, 4 pages.

* cited by examiner

SEMICONDUCTOR DEVICES INCLUDING A RARE EARTH ELEMENT AND METHODS OF FORMING SEMICONDUCTOR DEVICES INCLUDING A RARE EARTH ELEMENT

CROSS-REFERENCE TO RELATED APPLICATION

This U.S. non-provisional patent application claims priority under 35 U.S.C. §119 to Korean Patent Application No. 10-2015-0057537, filed on Apr. 23, 2015, in the Korean Intellectual Property Office, the disclosure of which is hereby incorporated herein in its entirety by reference.

BACKGROUND

The present disclosure relates to semiconductor devices and, more particularly, to semiconductor devices including a gate structure and methods of forming the same. With their miniaturization, multi-functions, and/or low manufacturing costs, semiconductor devices have been in the limelight in the electronics industry. Semiconductor devices may be divided into semiconductor memory devices for storing data, semiconductor logic devices for calculating logic data, and hybrid semiconductor devices including memory elements and logic elements. As the electronics industry has rapidly developed, requirements for characteristics of the semiconductor devices have increased. For example, requirements for high reliability, high speed, and/or multi-functions of the semiconductor devices have increased. To satisfy these requirements, structures of the semiconductor devices have become more complicated. Also, the semiconductor devices have continuously become more highly integrated.

SUMMARY

Various example embodiments of present inventive concepts may provide a semiconductor device having various threshold voltages without any deterioration in reliability and characteristics of the semiconductor device, and may provide a method of manufacturing the same. The semiconductor device may include at least two transistors having different threshold voltages from each other as a result of a threshold voltage adjustment.

According to various embodiments of present inventive concepts, a semiconductor device is provided that includes a semiconductor substrate. An upper portion of the semiconductor substrate may include an active area of the semiconductor substrate. Moreover, the semiconductor device may include a gate structure on the active area of the semiconductor substrate. The gate structure may include an interface layer, a high-dielectric layer, a rare earth element (RE) supply layer, a first metal layer including rare earth elements, and a second metal layer, which are sequentially stacked.

In various embodiments, the semiconductor device may include a transistor that includes the active area and the gate structure. A threshold voltage of the transistor may be determined according to a thickness of the first metal layer and a change in a work function of the first metal layer due to aluminum (Al). The threshold voltage may be shifted to a first threshold voltage based on rare earth elements at an interface between the interface layer and the high-dielectric layer. Moreover, the first threshold voltage may be shifted to a second threshold voltage based on the Al and the rare earth elements in the first metal layer.

According to various embodiments, the first threshold voltage may be constant due to a constant quantity of atoms of the rare earth elements at the interface between the interface layer and the high-dielectric layer. Moreover, the second threshold voltage may be adjusted based on a composition ratio of the Al to the rare earth elements in the first metal layer.

In various embodiments, a quantity of atoms of the rare earth elements at the interface between the interface layer and the high-dielectric layer may be independent of a quantity of atoms of the Al in the first metal layer. Moreover, the second metal layer may include aluminum (Al), and the first metal layer may include Al that diffused from the second metal layer.

According to various embodiments, the first metal layer may include the rare earth elements and aluminum (Al). An interface between the interface layer and the high-dielectric layer may include rare earth elements that diffused from the RE supply layer. In some embodiments, the RE supply layer may include at least one of lanthanum (La), scandium (Sc), erbium (Er), strontium (Sr), and yttrium (Yt).

In various embodiments, the high-dielectric layer may include a hafnium (Hf)-based material or a zirconium (Zr)-based material. The first metal layer may include titanium (Ti) nitride, tantalum (Ta) nitride, Ti oxynitride, or Ta oxynitride. Moreover, the second metal layer may include an aluminum (Al) compound that includes Ti or Ta.

According to various embodiments, the second metal layer may be free of rare earth elements. Additionally or alternatively, the semiconductor device may include a barrier metal layer between the first metal layer and the second metal layer, and may include a gap-fill metal layer on the second metal layer.

A semiconductor device, according to various embodiments, may include a semiconductor substrate. The semiconductor device may include at least one fin protruding from the semiconductor substrate and extending in a first direction. Moreover, the semiconductor device may include a gate structure on the at least one fin and extending in a second direction that is perpendicular to the first direction. The gate structure may include an interface layer, a high-dielectric layer, a rare earth element (RE) supply layer, and at least one metal layer including rare earth elements and aluminum (Al), which layers are sequentially stacked.

In various embodiments, a threshold voltage of a fin transistor that includes the at least one fin and the gate structure may be determined according to a thickness of the at least one metal layer and an adjustment of a work function of the at least one metal layer due to the Al. Moreover, the threshold voltage may be adjusted according to a quantity of atoms of rare earth elements at an interface between the interface layer and the high-dielectric layer, and according to a composition ratio of the Al to the rare earth elements in the at least one metal layer.

According to various embodiments, the threshold voltage may first be changed according to the quantity of atoms of rare earth elements at the interface between the interface layer and the high-dielectric layer. Moreover, the threshold voltage may subsequently be changed according to the composition ratio of the Al to the rare earth elements in the at least one metal layer.

In various embodiments, the at least one metal layer may include a work function adjusting layer and an Al supply layer. Moreover, the work function adjusting layer may include the rare earth elements and may further include Al that diffused from the Al supply layer. In some embodiments, the Al supply layer may be free of rare earth elements diffused from the RE supply layer.

According to various embodiments, an interface between the interface layer and the high-dielectric layer may include rare earth elements diffused from the RE supply layer. Moreover, the rare earth elements may be diffused to the interface independently of a quantity of atoms of the Al that is in the at least one metal layer.

In various embodiments, the at least one metal layer may include a work function adjusting layer and an Al supply layer. The RE supply layer may include at least one of lanthanum (La), scandium (Sc), erbium (Er), strontium (Sr), and yttrium (Yt). The high-dielectric layer may include a hafnium (Hf)-based material or a zirconium (Zr)-based material. The work function adjusting layer may include titanium (Ti) nitride, tantalum (Ta) nitride, Ti oxynitride, or Ta oxynitride. Moreover, the Al supply layer may include an Al compound including Ti or Ta.

According to various embodiments, the at least one metal layer may include a work function adjusting layer, a barrier metal layer, an Al supply layer, and a gap-fill metal layer. Moreover, the semiconductor device may include a spacer on the at least one fin and on a side surface of the gate structure.

A method of manufacturing a semiconductor device, according to various embodiments, may include forming a plurality of dummy gate structures that extend on a semiconductor substrate. Each of the dummy gate structures may include a dummy insulating layer and a dummy gate electrode. The method may include forming a spacer on a sidewall of the dummy gate electrode. The method may include forming an interlayer insulating layer on the semiconductor substrate and on the plurality of dummy gate structures. The method may include planarizing the interlayer insulating layer to expose an upper surface of the dummy gate electrode. The method may include removing the dummy gate electrode. The method may include forming an interface layer, a high-dielectric layer, a rare earth element (RE) supply layer, a first metal layer, and a second metal layer, in a sequential stack where the dummy gate electrode has been removed and on the interlayer insulating layer. Moreover, the method may include forming a gate structure that includes the interface layer, the high-dielectric layer, the RE supply layer, the first metal layer, and the second metal layer, by planarizing the stack to expose an upper surface of the interlayer insulating layer. When forming the stack, rare earth elements may be diffused to an interface between the interface layer and the high-dielectric layer, and into the first metal layer.

In various embodiments, a quantity of atoms of the rare earth elements at the interface between the interface layer and the high-dielectric layer may be adjusted according to a layer structure and a thickness of the high-dielectric layer. Additionally or alternatively, a quantity of atoms of the rare earth elements at the interface between the interface layer and the high-dielectric layer may be adjusted by a heat process after the RE supply layer is formed.

According to various embodiments, the second metal layer may include aluminum (Al), and the first metal layer may include Al that diffused from the second metal layer. Moreover, a quantity of atoms of the Al in the first metal layer may be adjusted according to at least one of an Al source pulse time period, a thickness of the second metal layer, and a process temperature, when forming the second metal layer. Alternatively, a quantity of atoms of the Al in the first metal layer may be adjusted by a heat process after the second metal layer is formed.

In various embodiments, a quantity of atoms of the rare earth elements in the first metal layer may be adjusted according to at least one of a layer structure of the first metal layer, a metal composition of the first metal layer, a thickness of the first metal layer, a process temperature when forming the first metal layer, and a process time period when forming the first metal layer.

A method of manufacturing a semiconductor device, according to various embodiments, may include forming a gate structure on at least one fin that protrudes from a device isolation layer on a semiconductor substrate. The gate structure may include an interface layer, a high-dielectric layer, a rare earth element (RE) supply layer, a first metal layer, and a second metal layer. Moreover, when forming the gate structure, rare earth elements may diffuse to an interface between the interface layer and the high-dielectric layer, and into the first metal layer.

In various embodiments, the forming of the gate structure may include forming a dummy gate structure on the semiconductor substrate, the device isolation layer, and the at least one fin. The dummy gate structure may include a dummy insulating layer and a dummy gate electrode. The forming of the gate structure may include forming a spacer on a side surface of the dummy gate structure. The forming of the gate structure may include forming an interlayer insulating layer on the semiconductor substrate and the dummy gate structure. The forming of the gate structure may include planarizing the interlayer insulating layer to expose an upper surface of the dummy gate structure. The forming of the gate structure may include removing the dummy gate structure and forming, in a sequential stack where the dummy gate structure is removed, the interface layer, the high-dielectric layer, the RE supply layer, the first metal layer, and the second metal layer. Moreover, the forming of the gate structure may include planarizing the stack to expose an upper surface of the interlayer insulating layer.

According to various embodiments, a quantity of atoms of the rare earth elements in the interface between the interface layer and the high-dielectric layer may be adjusted according to a layer structure and a thickness of the high-dielectric layer, or by a heat process after the RE supply layer is formed.

In various embodiments, the second metal layer may include aluminum (Al), and the first metal layer may include Al that is diffused from the second metal layer. Moreover, a quantity of atoms of the Al in the first metal layer may be adjusted either: according to at least one of an Al source pulse time period, a thickness of the second metal layer, and a process temperature, when forming the second metal layer; or by a heat process after the second metal layer is formed.

According to various embodiments, a quantity of atoms of the rare earth elements in the first metal layer may be adjusted according to at least one of a layer structure of the first metal layer, a metal composition of the first metal layer, a thickness of the first metal layer, a process temperature when forming the first metal layer, and a process time period when forming the first metal layer.

A semiconductor device, according to various embodiments, may include an insulating layer that includes a rare earth element. The semiconductor device may include a rare earth element supply layer on the insulating layer. Moreover, the semiconductor device may include a metal electrode that includes the rare earth element and that is on the rare earth element supply layer. The rare earth element supply layer is between the insulating layer and the metal electrode.

In various embodiments, the metal electrode may include first and second metal layers, and the first metal layer may be between the rare earth element supply layer and the second metal layer. Moreover, the first metal layer may include the rare earth element and a metal element of the second metal layer. In some embodiments, the insulating layer may include first and second insulating layers, and an interface of the first and second insulating layers may include the rare earth element.

According to various embodiments, the rare earth element is lanthanum, and the interface of the first and second insulating layers includes a plurality of lanthanum elements. Moreover, the second insulating layer may include a high-k dielectric layer, the metal element of the second metal layer that is in the first metal layer may include aluminum, and the first metal layer may be a work function adjusting layer. Lanthanum may be absent from the second metal layer. Additionally or alternatively, a threshold voltage of a transistor that includes the metal electrode may be controlled by: the rare earth element that is at the interface of the first and second insulating layers; and the metal element and the rare earth element that are in the first metal layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
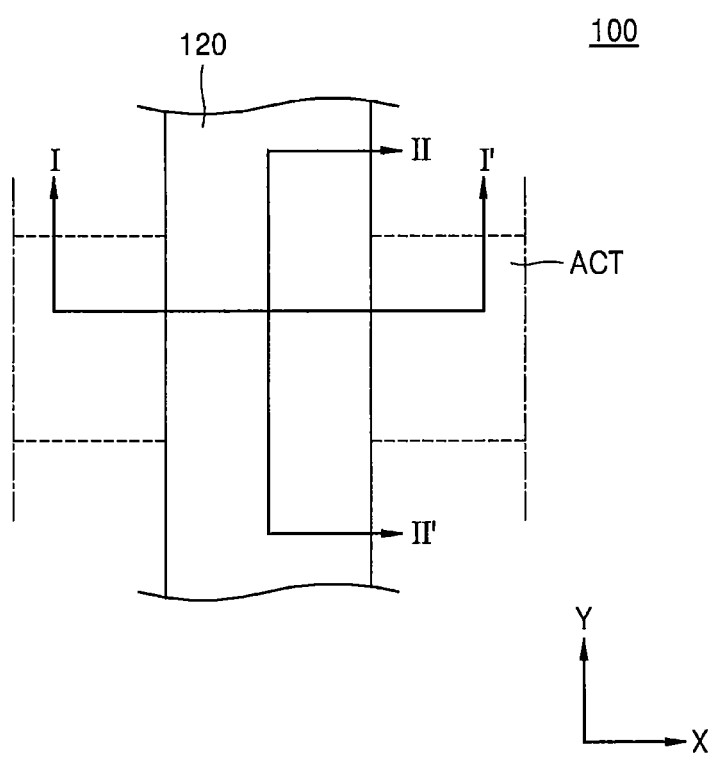
FIG. 1 is a plan view for describing a semiconductor device according to some example embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, the term "dummy" is used herein to indicate a component having a structure and a shape that is the same as, or similar to, those of other components but which is merely present as a pattern without possessing the ability to perform substantial functions. Therefore, an electrical signal may not be applied to a "dummy" component and the "dummy" component may not be able to perform certain electrical functions even in the case that an electrical signal is applied thereto.

Figure 2A:
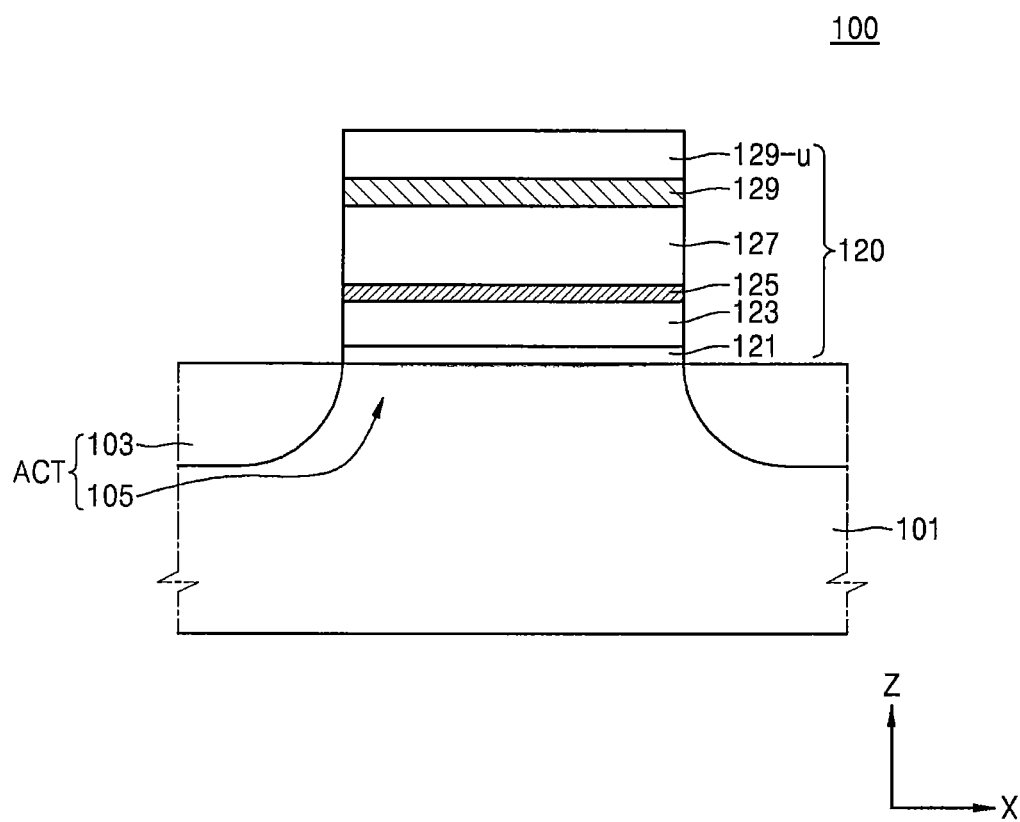
FIGS. 2A and 2B are cross-sectional views taken along lines I-I' and II-IP of the semiconductor device of FIG. 1, respectively.
Figure 2B:
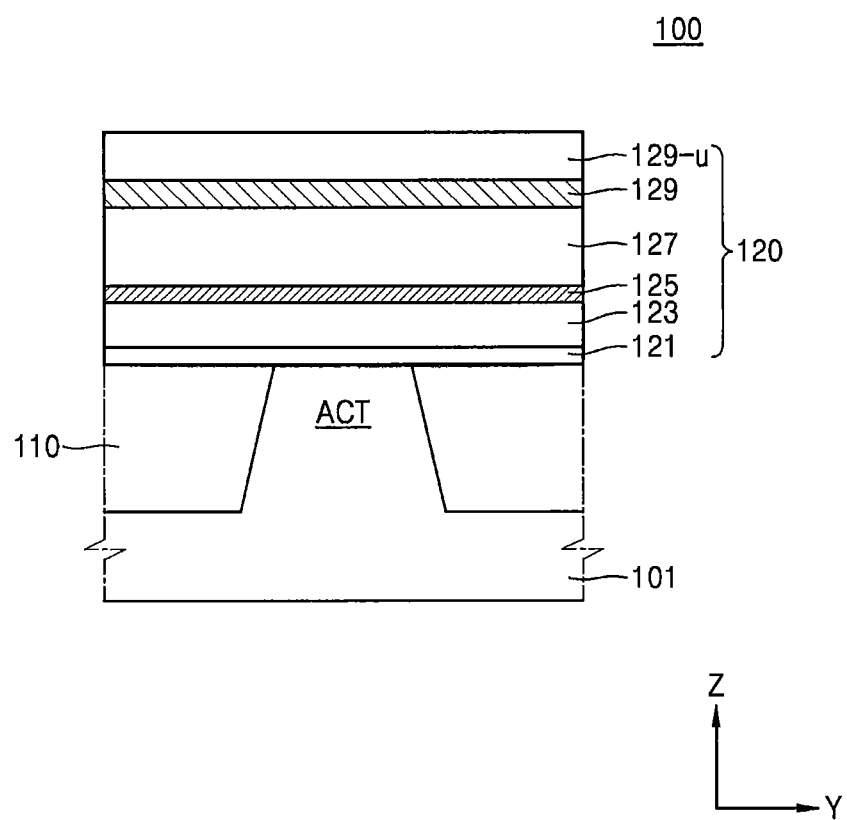

FIG. 1 is a plan view for describing a semiconductor device 100 according to some example embodiments. FIGS. 2A and 2B are cross-sectional views taken along lines I-I' and II-II' of the semiconductor device 100 of FIG. 1, respectively.

Referring to FIGS. 1, 2A and 2B, the semiconductor device 100 may include a semiconductor substrate 101 and a gate structure 120.

An active area ACT extending in a first direction (a direction x) may be defined on an upper portion of the semiconductor substrate 101 by a device isolation layer 110. Also, the gate structure 120 extending in a second direction (a direction y) may be disposed on the semiconductor substrate 101 across the active area ACT.

In FIG. 1, the active area ACT is disposed to vertically cross (e.g., be overlapped by) the gate structure 120. However, the active area ACT and the gate structure 120 may cross each other at other angles than a vertical angle. In FIG. 1, one gate structure 120 crosses (e.g., overlaps) one active area ACT. However, a plurality of gate structures 120 may cross one active area ACT. Also, a plurality of active areas ACT may cross one gate structure 120.

The semiconductor substrate 101 may be based on a silicon bulk wafer or a silicon-on-insulator (SOI) wafer. However, materials of the semiconductor substrate 101 are not limited to silicon. For example, the semiconductor substrate 101 may include a group IV semiconductor, such as germanium (Ge), a group IV-IV compound semiconductor, such as silicion germanium (SiGe) or silicon carbide (SiC), or a group III-V compound semiconductor, such as gallium arsenide (GaAs), indium arsenide (InAs), or indium phosphide (InP). The semiconductor substrate 101 may also be based on a SiGe wafer, an epitaxial wafer, a polished wafer, an annealed wafer, etc.

The semiconductor substrate 101 may be a p-type or an n-type substrate. For example, the semiconductor substrate 101 may be a p-type substrate including p-type impurity ions, or an n-type substrate including n-type impurity ions. Meanwhile, as described above, the semiconductor substrate 101 may include on the upper portion thereof the active area ACT defined by the device isolation layer 110, such as a shallow trench isolation (STI) layer. The active area ACT may include an impurity area formed by injecting impurity ions, that is, a dopant, into the semiconductor substrate 101, at a high concentration. For example, the active area ACT may include a source/drain area 103 and a channel area 105, wherein the source/drain area 103 is formed by injecting the dopant onto portions of the semiconductor substrate 101 that are at both sides of the gate structure 120 at a concentration that is higher than 1E20/cm$^3$, and the channel area 105 is formed below the gate structure 120.

The device isolation layer 110 may define the active area ACT as described above, and may be formed as a structure surrounding the active area ACT. Also, the device isolation layer 110 may be disposed between the active areas ACTs to electrically separate the active areas ACTs. The device isolation layer 110 may include, for example, at least one of a silicon oxide layer, a silicon nitride layer, a silicon oxynitride layer, and a combination thereof.

The gate structure 120 may include an interface layer 121, a high-dielectric layer 123, a rare earth element (RE) supply layer 125, a first metal layer 127, a second metal layer 129, and a gap-fill metal layer 129-u.

The interface layer 121 may be formed on the semiconductor substrate 101 and may include an insulating material, such as an oxide layer, a nitride layer, or an oxynitride layer. For example, the interface layer 121 may include silicon oxide SiO$_2$ or silicon oxynitride SiON. The interface layer 121 and the high-dielectric layer 123 may form a gate oxide layer.

The high-dielectric layer 123 may also be referred to as a high-k layer, and may be formed of a dielectric material having a high dielectric constant k. The high-dielectric layer 123 may include a hafnium (Hf)-based or a zirconium (Zr)-based material. For example, the high-dielectric layer 123 may include hafnium oxide (HfO$_2$), hafnium silicon oxide (HfSiO), hafnium silicon oxynitride (HfSiON), hafnium oxynitride (HfON), hafnium aluminium oxide (HfAlO), hafnium lanthanum oxide (HfLaO), zirconium oxide (ZrO$_2$), zirconium silicon oxide (ZrSiO), etc.

Also, in addition to the Hf-based material or the Zr-based material, the high-dielectric layer 123 may include other materials, such as La$_2$O$_3$, LaAlO$_3$, Ta$_2$O$_5$, TiO$_2$, SrTiO$_3$, Y$_2$O$_3$, Al$_2$O$_3$, PbSc$_{0.5}$Ta$_{0.5}$O$_3$, PbZnNbO$_3$, etc.

The high-dielectric layer 123 may be formed by one or more deposition methods, such as atomic layer deposition (ALD), chemical vapor deposition (CVD), physical vapor deposition (PVD), etc. Meanwhile, in order to adjust an amount (e.g., a quantity of atoms) of rare earth elements diffused from the RE supply layer 125, a layer structure and a thickness of the high-dielectric layer 123 may be adjusted when the high-dielectric layer 123 is formed, and a heat process may be performed on the high-dielectric layer 123.

The RE supply layer 125 may include rare earth elements. For example, the RE supply layer 125 may include at least one of lanthanum (La), scandium (Sc), erbium (Er), strontium (Sr), and yttrium (Yt). However, the RE supply layer 125 is not limited thereto and may also include other rare earth elements. In the semiconductor device 100 according to some example embodiments, the RE supply layer 125 may include lanthanum oxide (LaOx).

The RE supply layer 125 may supply the rare earth elements to an interface between the interface layer 121 and the high-dielectric layer 123 via diffusion of the rare earth elements. The rare earth elements existing in/at the interface between the interface layer 121 and the high-dielectric layer 123 may form a dipole with a material of the interface layer 121, for example, SiO$_2$ or SiON, in order to change a threshold voltage Vth of a transistor including the gate structure 120 and the active area ACT.

For reference, the threshold voltage of the transistor may be calculated by the below equation.

$$Vth = \phi ms - (Qox + Qd)/Cox + 2\phi f \qquad \text{[Equation 1]}$$

Here, φms may denote a work function potential difference between a metal forming a gate and a semiconductor forming a channel, Qox may denote a fixed charge on a surface of a gate oxide layer, Qd may denote a positive charge on an ion layer, Cox may denote a capacitance per unit area of the gate, and φf may denote a potential difference between an intrinsic Fermi level (Ei) and a Fermi level (Ef) of the semiconductor.

Based on Equation 1, the following methods may be performed in order to adjust the threshold voltage. The first method is a method of adjusting φms. The second method is a method of adjusting Qox. The third method is a method of adjusting φf.

For example, the first method may be performed by doping the semiconductor with ions, or applying a metal having a corresponding work function. That is, the work function difference between the semiconductor and the metal may be increased or decreased by raising or lowering a work function of the semiconductor by doping ions. Also, the work function difference between the semiconductor and the metal may be increased or decreased by using the metal having a corresponding work function.

The second method may be performed by raising or lowering a value of Qox. That is, based on Equation 1, if the value of Qox is lowered, Vth may be decreased, and if the value of Qox is raised, the threshold voltage may be increased. Meanwhile, Qox=∈$_0$∈$_R$/tox, wherein ∈$_R$ is a dielectric constant of the gate oxide layer and tox is a thickness of the gate oxide layer. Thus, in order to decrease the value of Qox, the thickness of the gate oxide layer may be increased or a material having a low dielectric constant may be used. Meanwhile, the third method may also be performed by doping the semiconductor with ions. For example, when the semiconductor layer is formed of a p-type substrate, the semiconductor layer may be doped with arsenide (As), in order to increase φf.

However, with the high integration of the semiconductor device, scaling of the channel area is intensified. Thus, in the case of the method of doping ions, deterioration in a distribution of the threshold voltage may occur due to a non-uniform distribution of the dopant, and mobility deterioration may occur due to an increase in a dopant concentration in the channel area. Accordingly, deterioration in the reliability and performance of the semiconductor device may occur. Therefore, the method of adjusting the threshold voltage by doping ions has limits. Also, the method of using the metal having the corresponding work function may cause a difficulty of obtaining an etch selectively during patterning of the metal layer, and a damage to the gate oxide layer which is located below the metal layer during the patterning of the metal layer, when it is aimed to realize various transistors having different threshold voltages, for example, a plurality of a metal-oxide semiconductor field-effect-transistor (MOSFET) having different threshold voltages in a logic device.

Meanwhile, as described above, the threshold voltage may be adjusted by injecting the rare earth elements in/at the interface between the interface layer 121 and the high-dielectric layer 123. The method of injecting the rare earth elements into/at the interface between the interface layer 121 and the high-dielectric layer 123 may belong to the method of adjusting the dielectric constant of the gate oxide layer which is described above. However, in the case of the method of injecting the rare earth elements, if the injected rare earth elements exceed a predetermined concentration, it may cause an electrical defect of the interface layer 121, so that reliability deterioration, such as bias temperature instability (BTI), and mobility deterioration may occur. Therefore, a range of the change/adjustment of the threshold voltage may have a limit, if the method of injecting the rare earth elements is used.

The first metal layer 127 may be formed on the RE supply layer 125, and may include titanium (Ti) nitride, tantalum (Ta) nitride, Ti oxynitride, or Ta oxynitride. For example, the first metal layer 127 may include binary element metal nitride, such as TiN and TaN, ternary element metal nitride, such as TiAlN, TaAlN, and TiSiN, or metal oxynitride, which is oxidized binary or ternary element metal nitride.

The first metal layer 127 may be formed by one or more deposition methods, such as ALD, CVD, and PVD. Also, in order to adjust an amount of the rare earth elements diffused from the RE supply layer 125, a layer structure, a metal composition, a thickness, a process temperature, a process time period, etc. of the first metal layer 127 may be adjusted when the first metal layer 127 is formed. Also, a heat process may be performed on the first metal layer 127 after the first metal layer 127 is formed.

The first metal layer 127 and the second metal layer 129 on the first metal layer 127 may form a metal electrode of the gate structure 120, and the first metal layer 127 may adjust a work function of the metal electrode. Accordingly, the first metal layer 127 may be referred to as a work function adjusting layer. The work function adjustment via the metal electrode may correspond to a threshold voltage adjustment of the gate structure 120, and the method of adjusting the threshold voltage may belong to the method of using the metal having the corresponding work function, which is described above.

The second metal layer 129 may be formed on the first metal layer 127 and may be formed of an n-type metal. For reference, the n-type metal denotes a metal forming a gate electrode of an NMOS structure/device, and the p-type metal may denote a metal forming a gate electrode of a PMOS structure/device. When the second metal layer 129 is formed of the n-type metal, the second metal layer 129 may include an aluminum (Al) compound containing Ti or Ta. For example, the second metal layer 129 may include an Al compound, such as TiAlC, TiAlN, TiAlC—N, TiAl, TaAlC, TaAlN, TaAlC—N, and TaAl. However, the n-type metal materials of the second metal layer 129 are not limited thereto. Also, the second metal layer 129 including the n-type metal may be formed as a multi-layer including two or more layers, rather than a single layer.

Meanwhile, the second metal layer 129 is not limited to the n-type metal, and may also be formed of the p-type metal. When the second metal layer 129 is formed of the p-type metal, the second metal layer 129 may include at least one of Mo, Pd, Ru, Pt, TiN, WN, TaN, Ir, TaC, RuN, and MoN. However, the p-type metal materials of the second metal layer 129 are not limited thereto. Also, the second metal layer 129 including the p-type metal may be formed as a multi-layer including two or more layers, rather than a single layer.

In the semiconductor device 100 according to some example embodiments, the second metal layer 129 may be formed of the n-type metal, and may include Al. Since the Al of the second metal layer 129 is injected into the first metal layer 127 via diffusion, the work function of the metal electrode may be adjusted, in order to determine the threshold voltage. Also, the work function of the metal electrode may be adjusted since electrons move between the first metal layer 127 and the second metal layer 129. Here, the metal electrode may include the first metal layer 127 and the second metal layer 129 as described above.

Meanwhile, the first metal layer 127 may include the rare earth elements injected from the RE supply layer 125 via diffusion, for example, lanthanum (La). The La injected into the first metal layer 127 may affect a density of a charge amount in the first metal layer 127 in order to change the threshold voltage. In addition, the effect of the La on the density of the charge amount may vary according to an Al composition or an Al amount in the first metal layer 127. For example, as the Al amount is greater in the first metal layer 127, a difference of the threshold voltage according to whether the La exists or not may be increased. With respect to this aspect, descriptions will be made in detail by referring to a graph of FIG. 5.

Meanwhile, an amount of the La injected into/at the interface between the interface layer 121 and the high-dielectric layer 123 is not changed by the Al composition or the Al amount in the first metal layer 127, and thus, the La injected into/at the interface between the interface layer 121 and the high-dielectric layer 123 may change the threshold voltage without the reliability and performance deterioration of the semiconductor device. With respect to this aspect, descriptions will be made in detail by referring to a graph of FIG. 6.

To generally describe the threshold voltage adjustment, in the semiconductor device 100 according to some example embodiments, first, the second metal layer 129 including Al may determine the threshold voltage of the semiconductor device 100 via a thickness of the first metal layer 127 and an Al composition in the first metal layer 127. Next, the threshold voltage may be primarily changed by an amount of the rare earth elements injected into/at the interface between the interface layer 121 and the high-dielectric layer 123 via diffusion. Again, the threshold voltage may be secondarily changed by the rare earth elements injected into the first metal layer 127. Meanwhile, in the case of the secondary change of the threshold voltage, because the amount of the rare earth elements injected into/at the interface between the interface layer 121 and the high-dielectric layer 123 is not changed, the threshold voltage may be additionally changed without the reliability and performance deterioration of the semiconductor device 100.

The gap-fill metal layer 129-$u$ may be formed on the second metal layer 129 and may include tungsten (W). The gap-fill metal layer 129-$u$ may be a metal layer filing a gap which finally remains after other metal layers are formed, when a replacement metal gate (RMG) structure is formed. The gap-fill metal layer 129-$u$ may form an uppermost metal layer of the gate structure 120 having a planar structure as illustrated in FIGS. 2A and 2B. Materials of the gap-fill metal layer 129-$u$ are not limited to W. The gap-fill metal layer 129-$u$ may be formed of one or more metals suitable to fill the gap. For example, the gap-fill metal layer 129-$u$ may include a material selected from the group consisting of metal nitride, such as TiN or TaN, Al, metal carbide, metal silicide, metal aluminium carbide, metal aluminium nitride, metal silicon nitride, etc. In some embodiments, the gap-fill metal layer 129-$u$ may optionally be omitted.

In the semiconductor device 100 according to some example embodiments, the rare earth elements are included in/at the interface between the interface layer 121 and the high-dielectric layer 123, and the rare earth elements are also included in the first metal layer 127 on the interface layer 121, and thus, the threshold voltage is doubly changed so that the threshold voltage of the semiconductor device 100 is more precisely adjusted. Also, because the amount of the rare earth elements in/at the interface between the interface layer 121 and the high-dielectric layer 123 is not affected by (e.g., is independent of) the Al composition of the first metal layer 127, the semiconductor device 100 may not have reliability and performance deterioration due to the adjustment of the threshold voltage.

Figure 3:
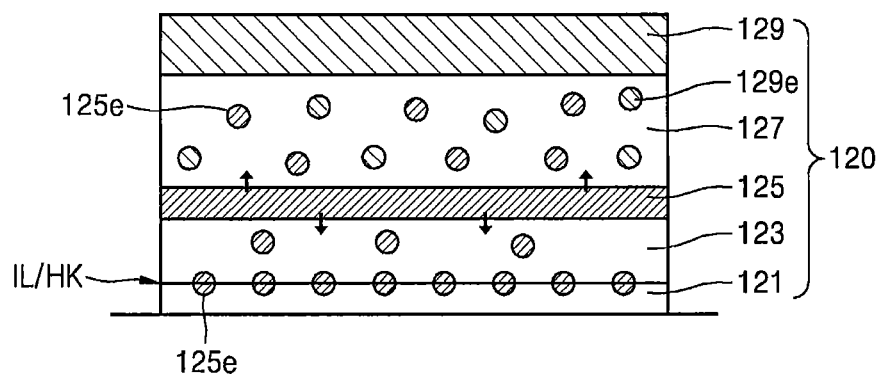
FIG. 3 is a conceptual view of a principle of adjusting a threshold voltage in the semiconductor device of FIG. 1.

FIG. 3 is a conceptual view of a principle of adjusting the threshold voltage Vth in the semiconductor device 100 of FIG. 1.

Referring to FIG. 3, the rare earth elements 125*e* may be injected into/at the interface IL/HK of the interface layer 121 and the high-dielectric layer 123 via diffusion. The RE supply layer 125 may include, for example, La, and thus, the rare earth elements 125*e* may be La. Meanwhile, the rare earth elements 125*e* may also be included in the high-dielectric layer 123, but the rare earth elements included in the high-dielectric layer 123 may not change the threshold voltage.

An amount of the rare earth elements 125*e* of the interface IL/HK may be adjusted by one or more methods. For example, the amount of the rare earth elements 125*e* may be adjusted by a layer structure and a thickness of the high-dielectric layer 123, or may be adjusted by a heat process temperature. The high-dielectric layer 123 may have one or more layer structures based on deposition methods and process conditions. Based on the layer structure of the high-dielectric layer 123, diffusion characteristics of the rare earth elements 125*e* are changed so that the amount of the rare earth elements 125*e* injected into/at the interface IL/HK may be changed. Also, the amount of the rare earth elements 125*e* injected into/at the interface IL/HK may be changed, based on the thickness of the high-dielectric layer 123. That is, as the high-dielectric layer 123 is thicker, the amount of the rare earth elements 125*e* injected into/at the interface IL/HK may be less. Also, a diffusion speed of the rare earth elements 125*e* varies according to a heat process temperature, and thus, the amount of the rare earth elements 125*e* injected into/at the interface IL/HK may vary based on the heat process temperature.

A range of the change of the threshold voltage may vary based on the amount of the rare earth elements 125*e* included in/at the interface IL/HK. However, excessive rare earth elements 125*e* may cause an electrical defect of the interface layer 121, so as to deteriorate the reliability and performance of the semiconductor device, as described above. Thus, the amount of the rare earth elements 125*e* injected into/at the interface IL/HK is limited to a range in which the amount does not cause an electric defect of the interface layer 121, and, based on this limit, the range of the change of the threshold voltage may also be limited.

Meanwhile, the rare earth elements 125*e* may also be injected into the first metal layer 127 via diffusion. Also, as illustrated in FIG. 3, the first metal layer 127 may also include aluminum (Al) 129*e* injected from the second metal layer 129 via diffusion. Because the rare earth elements 125*e* are injected into the first metal layer 127, the threshold voltage of the semiconductor device 100 may be additionally changed. The threshold voltage change by the rare earth elements 125*e* may not entirely depend on the amount of the rare earth elements 125*e* included in the first metal layer 127 but may depend on a composition of the Al 129*e* in the first metal layer 127. In other words, depending on the composition of the Al 129*e* in the first metal layer 127 or the amount of the Al 129*e* in the first metal layer 127, an effect of a charge amount according to whether the rare earth elements 125*e* exist or not in the first metal layer 127 varies, and thus, a range of the change of the threshold voltage may vary. Moreover, the thickness of each of the first metal layer 127 and the second metal layer 129 may range from several nanometers to tens of nanometers, and the thickness of each of the high-dielectric layer 123 and the interface layer 121 may be less than or equal to several nanometers.

The rare earth elements 125*e* may not be included in (e.g., may be absent from) the second metal layer 129. In other words, the second metal layer 129 may be free of the rare earth elements 125*e*. In some embodiments, a barrier metal layer may further be formed between the first metal layer 127 and the second metal layer 129 such that the rare earth elements 125*e* are not diffused into the second metal layer 129. Aspects with respect to the barrier metal layer will be described in detail by referring to FIG. 7.

Figure 4:
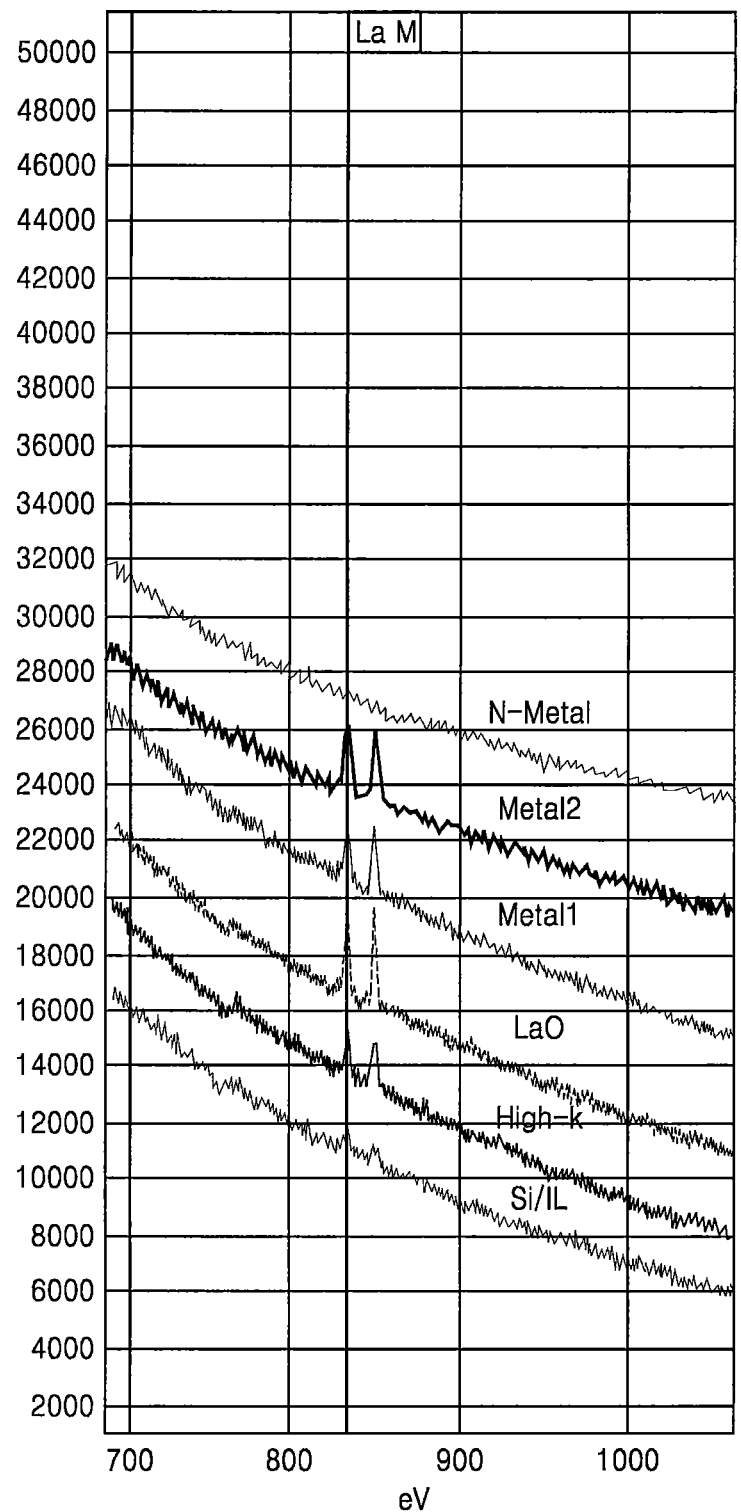
FIG. 4 is a graph showing a state in which lanthanum (La) is diffused to/into/at an interface between an interface layer and a high-dielectric layer, and into a metal layer, in the semiconductor device of FIG. 1.

FIG. 4 is a graph showing La diffused into/to/at the interface IL/HK and the metal layer, in the semiconductor device 100 of FIG. 1, wherein the graph is obtained by electron energy loss spectroscopy (EELS). Here, an x-axis (horizontal axis) denotes lost electron energy which has a unit of eV, and a y-axis (vertical axis) denotes intensity and indicates the relative number of vibrations.

Referring to FIG. 4, with respect to the semiconductor device 100 according to some example embodiments, the label "Si/IL" on the graph may correspond to the interface between a silicon layer of the semiconductor substrate 101 and the interface layer 121. Moreover, the label "High-k" on FIG. 4 may correspond to the high-dielectric layer 123, "LaO" may correspond to the RE supply layer 125, "Metal1" and "Metal2" may correspond to the first metal layer 127, and "N-Metal" may correspond to the second metal layer 129. Here, because the interface layer 121 is very thin, the Si/IL is used rather than the interface layer 121.

According to the EELS principle, if an element that is to be detected exists, a peak may occur in an electron energy loss portion corresponding to the element. For example, the electron energy loss corresponding to La is about 830 eV, and it is shown that the peak occurs in the Si/IL, High-k, Metal1, and Metal2 at a portion corresponding to 830 eV. Accordingly, it is identified that each of the Si/IL, High-k, Metal1, and Metal2 includes the La. Also, the La detected in each of the Si/IL, High-k, Metal1, and Metal2 may be La injected from an LaO layer via diffusion. Meanwhile, because a peak does not occur in the N-Metal, it may be understood that the N-Metal does not include the La. This aspect may be in line with the feature/aspect that the second metal layer 129 does not include the rare earth elements.

Figure 5:
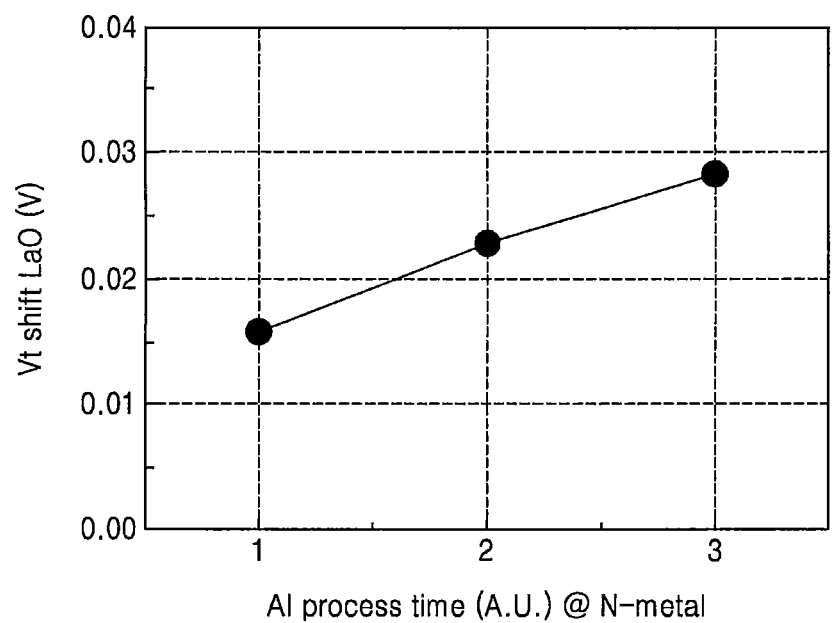
FIG. 5 is a graph showing a threshold voltage difference according to an inclusion of La, according to an aluminum (Al) process time, in the semiconductor device of FIG. 1.

FIG. 5 is a graph showing a threshold voltage difference in the semiconductor device 100 of FIG. 1 according to whether the La is included or not, according to an Al process time, wherein an x-axis (horizontal axis) denotes the Al process time and has an arbitrary unit (A.U.), and a y-axis (vertical axis) denotes a threshold voltage shift and has a unit of voltage V.

Referring to FIG. 5, the x-axis and the y-axis have the following meanings, in particular. The Al process time indicated by the x-axis may denote an Al pulse time which is a time period in which an Al source is supplied when the second metal layer 129 is formed by deposition. By adjusting the Al process time, a layer structure or a thickness of the second metal layer 129 may be adjusted. According to the layer structure or the thickness of the second metal layer 129, an Al composition or an Al amount injected into the first metal layer 127 may vary. For example, as the Al process time is increased, the Al composition (e.g., concentration of Al) included in the first metal layer 127 may be increased. Meanwhile, the Al composition injected into the first metal layer 127 may vary according to a process temperature or a heat process temperature.

The threshold voltage shift indicated by the y-axis denotes a threshold voltage difference between the case in which the La is included in the first metal layer 127 and the case in which the La is not included in the first metal layer 127, and the threshold voltage difference may denote a range of a change of the threshold voltage as the La is injected into the first metal layer 127.

As shown in the graph, as the Al process time is increased, the threshold voltage shift is increased. This denotes that as the Al composition (e.g., concentration of Al) included in the first metal layer 127 is increased, the threshold voltage change according to whether the La exists or not is increased. In other words, because a density change of a charge amount in the first metal layer 127 due to the La is affected by the Al composition change in the first metal layer 127, it may be understood that the threshold voltage change depends on whether the rare earth elements 125e exist or not in the first metal layer 127, and on the Al composition in the first metal layer 127, rather than depending only on the amount of the rare earth elements 125e included in the first metal layer 127. Accordingly, the threshold voltage of a transistor that includes the gate structure 120 may be partially controlled by the rare earth elements 125e in the first metal layer 127.

Meanwhile, it may be difficult to determine the threshold voltage change only by the amount of the rare earth elements 125e in the first metal layer 127, without considering the Al composition. This is because since the threshold voltage of the metal electrode is initially determined by the thickness of the first metal layer 127 and the Al composition of the first metal layer 127, the Al composition may be firstly considered, and then the threshold voltage change due to the La according to the Al composition may be considered.

In addition, when the amount (e.g., quantity/number of atoms) of the La included in the first metal layer 127 is fixed (e.g., constant), as the Al composition in the first metal layer 127 is increased, the threshold voltage change may be increased. To understand it from an opposite perspective, when the Al composition of the first metal layer 127 is fixed, as the amount of the La included in the first metal layer 127 is increased, the threshold voltage change may be decreased. Moreover, the phrases "composition of Al" and "Al composition" may refer to a ratio (e.g., a composition ratio) of (a) Al to (b) all elements other than Al in the first metal layer 127.

Figure 6:
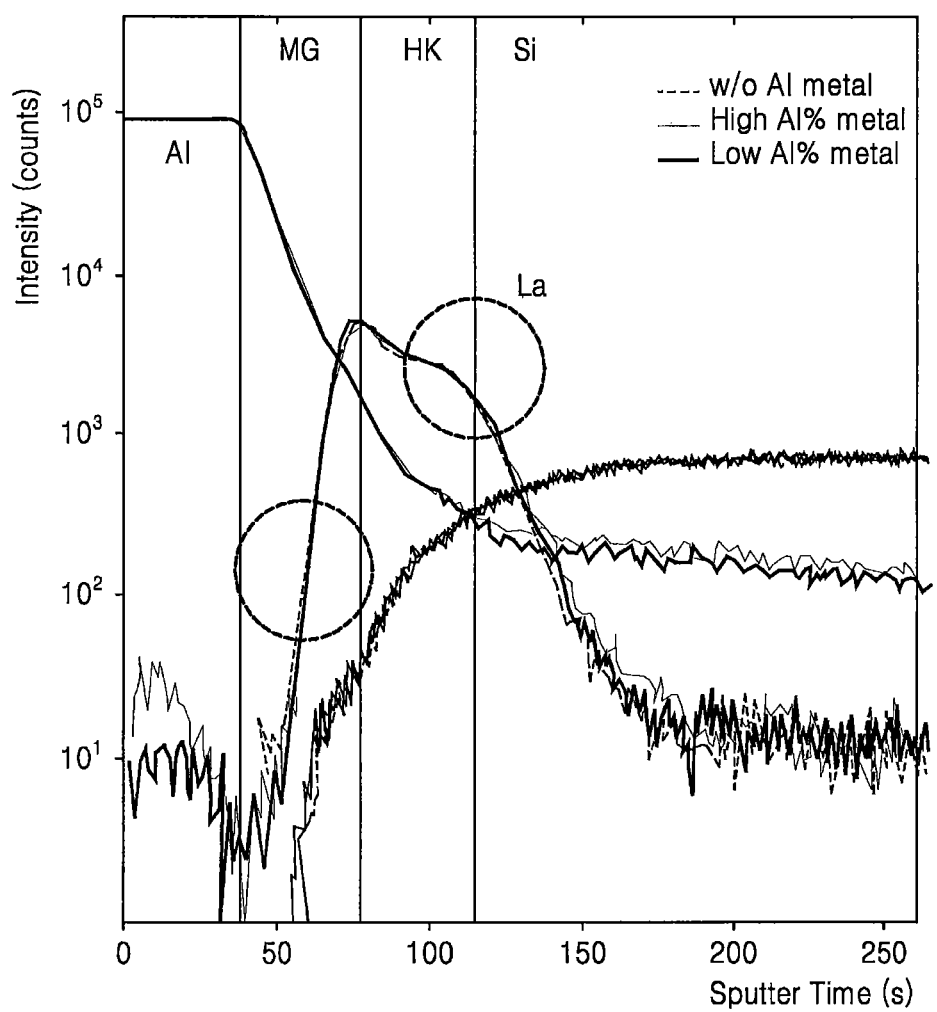
FIG. 6 is a graph showing a diffusion distribution of Al and La based on an Al composition difference of a second metal layer, in the semiconductor device of FIG. 1.

FIG. 6 is a graph showing a diffusion distribution of Al and La based on an Al composition of the second metal layer 129, in the semiconductor device 100 of FIG. 1, wherein the graph is obtained by time of flight secondary ion mass spectrometry (TOF-SIMS), an x-axis (horizontal axis) denotes a sputter time and has a unit of a second (s), and a y-axis (vertical axis) denotes an intensity (e.g., amount/concentration) and denotes the number (e.g., quantity) of corresponding elements.

Referring to FIG. 6, with respect to the semiconductor device 100, the label "Al" in the graph may correspond to the second metal layer 129, the label "MG" may correspond to the first metal layer 127, "HK" may correspond to the high-dielectric layer 123, and "Si" may correspond to a silicon layer of the semiconductor substrate 101. The interface layer 121 and the RE supply layer 125 are not labelled in FIG. 6. Meanwhile, the label "w/o Al" metal indicates a case where the second metal layer 129 does not exist (i.e., as the graph of FIG. 6 is based on experimental data, the Al 129e may not exist in FIG. 3), "High Al % metal" indicates a case where the second metal layer 129 has a high composition of Al, and "Low Al % metal" indicates a case where the second metal layer 129 has a low composition of Al. Here, the high and low composition of Al may be proportional to an Al pulse time when the second metal layer 129 is formed.

First, with respect to the label "Al," FIG. 6 shows that the intensity in the second metal layer 129 is constant, and the intensity decreases at layers lower than the second metal layer 129. Also, it is shown that the intensity of the Al is irrelevant to the Al composition. For example, the Al composition is related to a method of forming metal layers and types of materials, whereas the intensity of the Al in the second metal layer 129 and the thickness of the second metal layer 129 may increase proportionally to the Al pulse time. That is, regardless of whether the Al composition is high or low, the Al intensity decreases by having substantially the same values. Meanwhile, with respect to the Al, because there may not be the case where the second metal layer 129 does not exist, only the intensity graph corresponding to the high and low Al composition is illustrated.

Next, with respect to the La, it is shown that the La has the greatest intensity at a boundary portion of the first metal layer 127 and the high-dielectric layer 123, and the intensity of the La gets decreased at an upper and a lower portion of the boundary portion. Here, the portion at which the La has the greatest intensity may correspond to the RE supply layer 125.

In more detail, it is shown that the La intensity radically decreases in order from the first metal layer 127 to the second metal layer 129. Also, it is shown that the La intensity is decreased by having substantially the same values, regardless of whether the Al exists or not or of the Al composition. Meanwhile, it is shown that the La intensity changes in the second metal layer 129 and a portion adjacent to the second metal layer 129, based on the Al composition, and also the La intensity is increased again. This phenomenon may be interpreted as a noise, considering that the La is not included in the second metal layer 129.

As indicated by dotted circles, regardless of the Al composition, the La intensity is substantially the same in the first metal layer 127 and the high-dielectric layer 123. In particular, a dotted circle portion on the right hand side may correspond to the interface portion between the interface layer 121 and the high-dielectric layer 123, and it is shown that also in/at the interface portion between the interface layer 121 and the high-dielectric layer 123, the La intensity is the same (e.g., constant), regardless of the Al composition. Accordingly, it may be understood that because the amount (e.g., quantity of atoms) of the La is not changed in/at the interface between the interface layer 121 and the high-dielectric layer 123 according to the Al composition in the first metal layer 127, the semiconductor device 100 may not have reliability and performance deterioration even if the threshold voltage is additionally changed by injecting the La in the first metal layer 127.

Figure 7:
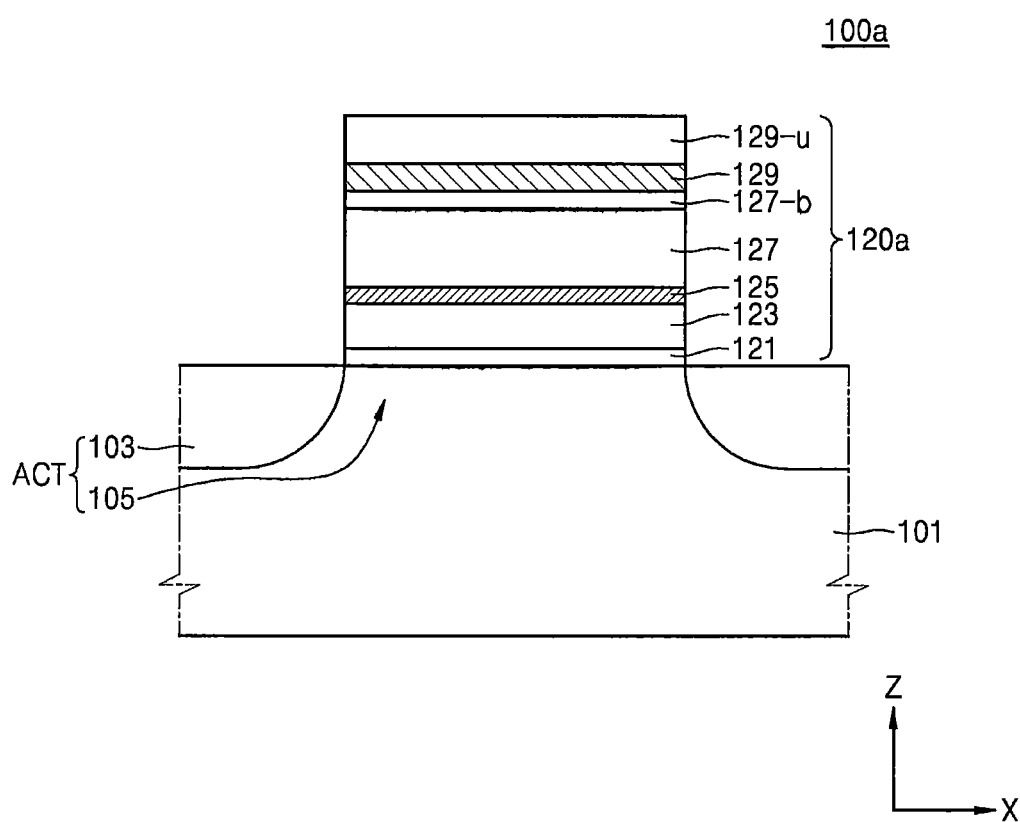
FIG. 7 is a cross-sectional view of a semiconductor device according to some example embodiments, and corresponding to the cross-sectional view of FIG. 2A.

FIG. 7 is a cross-sectional view of a semiconductor device 100a according to some example embodiments, and FIG. 7 corresponds to the cross-sectional view of FIG. 2A. For convenience of explanation, aspects that are described above in FIGS. 1 through 2B may be only briefly described or repeat descriptions may be omitted.

Referring to FIG. 7, the semiconductor device 100a according to some example embodiments may differ from the semiconductor device 100 of FIG. 2A in that a gate structure 120a of the semiconductor device 100a further includes a barrier metal layer 127-b between the first metal layer 127 and the second metal layer 129. The barrier metal layer 127-b may impede/prevent the rare earth elements 125e from being diffused into the second metal layer 129. Accordingly, the second metal layer 129 may not include the rare earth elements. The barrier metal layer 127-b may include metal nitride. The metal nitride may include, for example, Ti, Ta, W, Ru, Nb, Mo, Hf, La, or a combination thereof.

The barrier metal layer 127-b may additionally or alternatively be formed between the gap fill metal layer 129-u and the second metal layer 129. In some embodiments, the barrier metal layer 127-b may replace the gap-fill metal layer 129-u, and the gap-fill metal layer 129-u may thus be omitted.

Figure 8A:
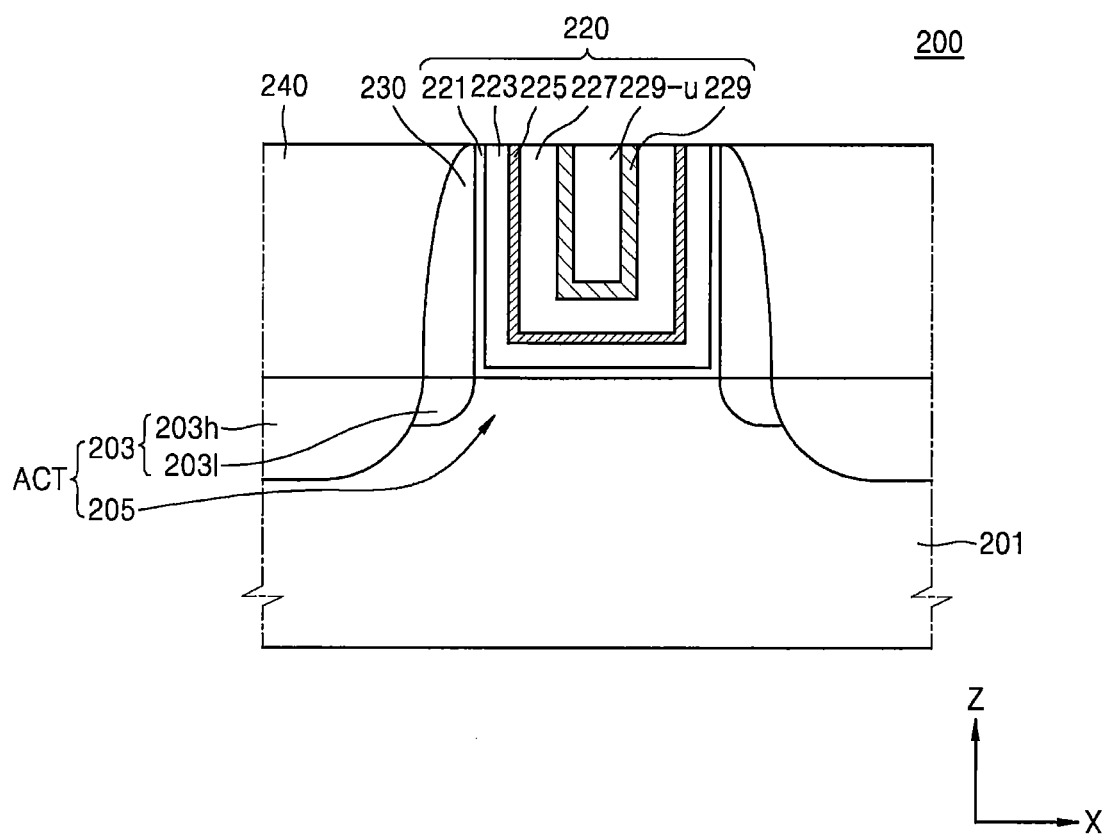
FIGS. 8A and 8B are cross-sectional views of a semiconductor device according to some example embodiments, and corresponding to the cross-sectional views of FIGS. 2A and 2B, respectively.
Figure 8B:
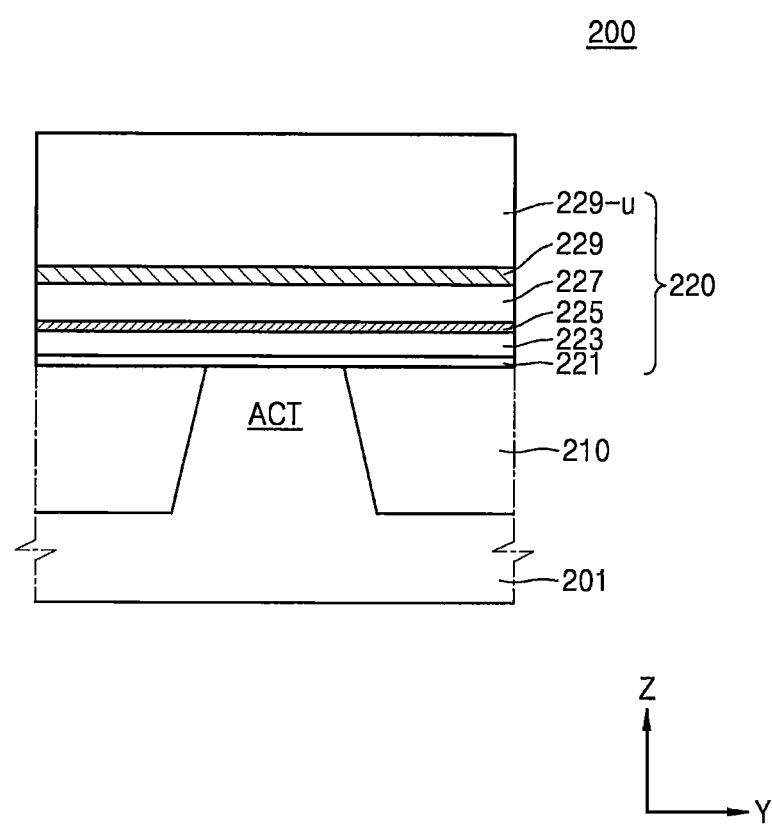

FIGS. 8A and 8B are cross-sectional views of a semiconductor device 200 according to some example embodiments, and FIGS. 8A and 8B correspond to the cross-sectional views of FIGS. 2A and 2B, respectively. For convenience of explanation, aspects described above in FIGS. 1 through 2B may be only briefly described or repeat descriptions may be omitted.

Referring to FIGS. 8A and 8B, the semiconductor device 200 may have an RMG structure unlike the semiconductor device 100 of FIG. 2A. The RMG structure is a structure in which a source/drain area is formed while using a dummy gate structure and a metal gate is formed where the dummy gate is removed. The RMG structure may also be referred to as a gate last structure.

In more detail, the semiconductor device 200 may include a semiconductor substrate 201 and a gate structure 220. An active area ACT defined by a device isolation layer 210 may be formed on an upper portion of the semiconductor substrate 201. The active area ACT may include a source/drain area 203 and a channel area 205. The source/drain area 203 may include a high concentration doped area 203h and a low concentration doped area 203l.

The gate structure 220 may include an interface layer 221, a high-dielectric layer 223, an RE supply layer 225, a first metal layer 227, a second metal layer 229, and a gap-fill metal layer 229-u. Spacers 230 may be formed on both side surfaces of the gate structure 220. Also, the spacers 230 may be surrounded by an interlayer insulating layer 240. The interlayer insulating layer 240 may be formed on a portion of the semiconductor substrate 201, in which the gate structure 220 and the spacers 230 are not formed. Accordingly, the interlayer insulating layer 240 may have a structure surrounding side surfaces of the spacers 230.

A structure of layers of the gate structure 220 may be substantially the same as the structure of layers of the gate structure 120 of the semiconductor device 100 of FIG. 2A. However, each of the layers forming the gate structure 220 may be formed as a structure surrounding an upper surface of the semiconductor substrate 201 and the side surfaces of the spacer 230. That is, the interface layer 221 may be formed on the upper surface of the semiconductor substrate 201 and the side surfaces of the spacers 230, and the high-dielectric layer 223 may be formed on an upper surface and both side surfaces of a bottom layer of the interface layer 221. Also, the RE supply layer 225, the first metal layer 227, the second metal layer 229, and the gap-fill metal layer 229-u may also be sequentially formed on an upper surface and both side surfaces of respective bottom layers below. A function of each layer forming the gate structure 220 is the same as the description with reference to FIGS. 1 through 2B.

The spacers 230 may be formed on both side surfaces of the gate structure 220, and may be formed of an insulating material, such as a nitride layer or an oxynitride layer. For example, the spacers 230 may include a silicon nitride layer or a silicon oxynitride layer. The spacers 230 may be formed to have an "L" shape, unlike the shape illustrated in FIGS. 8A and 8B. Also, the spacers 230 may be formed as a single layer, but are not limited thereto, and may be formed as multiple layers.

Meanwhile, the gap-fill metal layer 229-u may be formed as a structure filling a trench or a gap remaining after the second metal layer 229 is formed.

In the semiconductor device 200 according to some example embodiments, rare earth elements are included in/at an interface between the interface layer 221 and the high-dielectric layer 223, and also in the first metal layer 227, and a threshold voltage may thus be doubly changed so that the semiconductor device 200 may have a precisely adjusted threshold voltage. Also, because an amount of the rare earth elements in/at the interface between the interface layer 221 and the high-dielectric layer 223 is not affected by an Al composition in the first metal layer 227, the semiconductor device 200 may not experience reliability and performance deterioration due to the threshold voltage adjustment.

FIGS. 9 through 12 are cross-sectional views of semiconductor devices 200a, 200b, 200c, and 200d, according to some example embodiments, and FIGS. 9 through 12 correspond to the cross-sectional view of FIG. 8A. For convenience of explanation, aspects described above with reference to FIGS. 8A and 8B may be only briefly described or repeat descriptions may be omitted.

Figure 9:
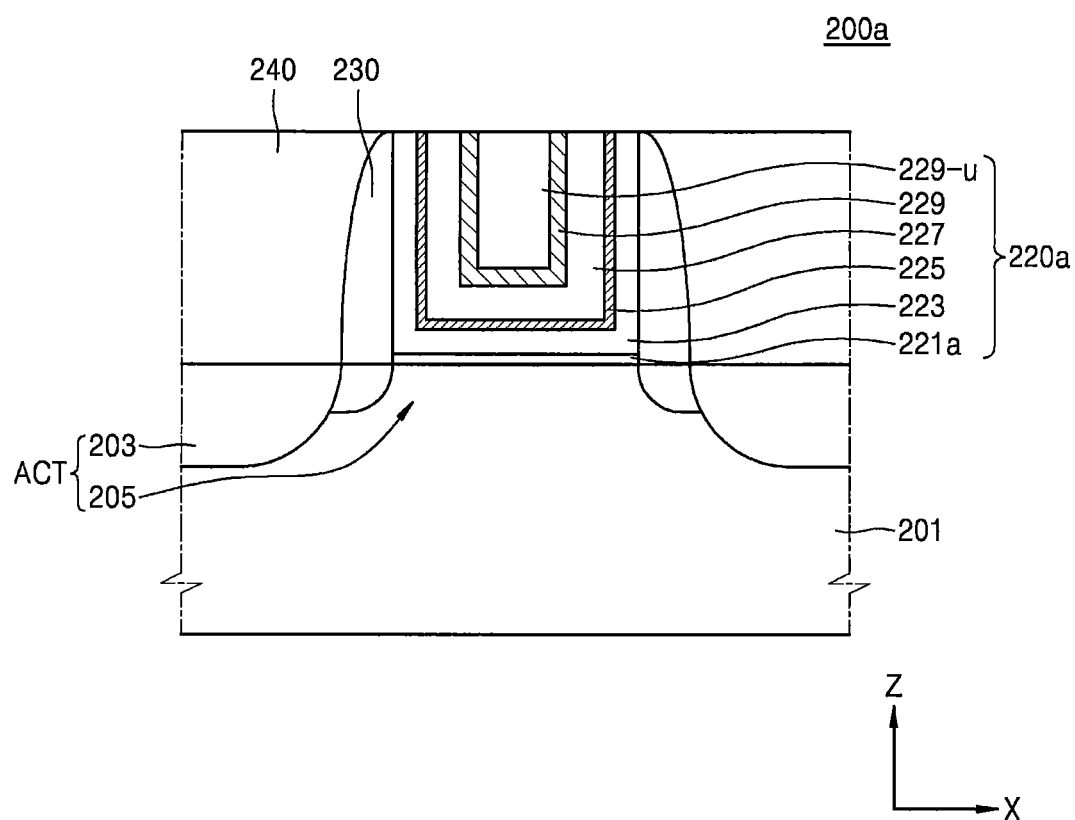
FIGS. 9 through 12 are cross-sectional views of semiconductor devices according to some example embodiments, and corresponding to the cross-sectional view of FIG. 8A.

Referring to FIG. 9, the semiconductor device 200a may differ from the semiconductor device 200 of FIG. 8A in terms of a structure of an interface layer 221a. In the semiconductor device 200a according to some example embodiments, the interface layer 221a may be formed only on an upper surface of the semiconductor substrate 201, and may not be formed on side surfaces of the spacers 230. The interface layer 221a may be realized by using a dummy insulating layer of a dummy gate structure as an interface layer, instead of removing the dummy insulating layer. Because the interface layer 221a is formed only on the upper portion of the semiconductor substrate 201, a gap between side surfaces of layers forming the gate structure 220a becomes greater, and thus, a width of the gap-fill metal layer 229-u may be increased.

Figure 10:
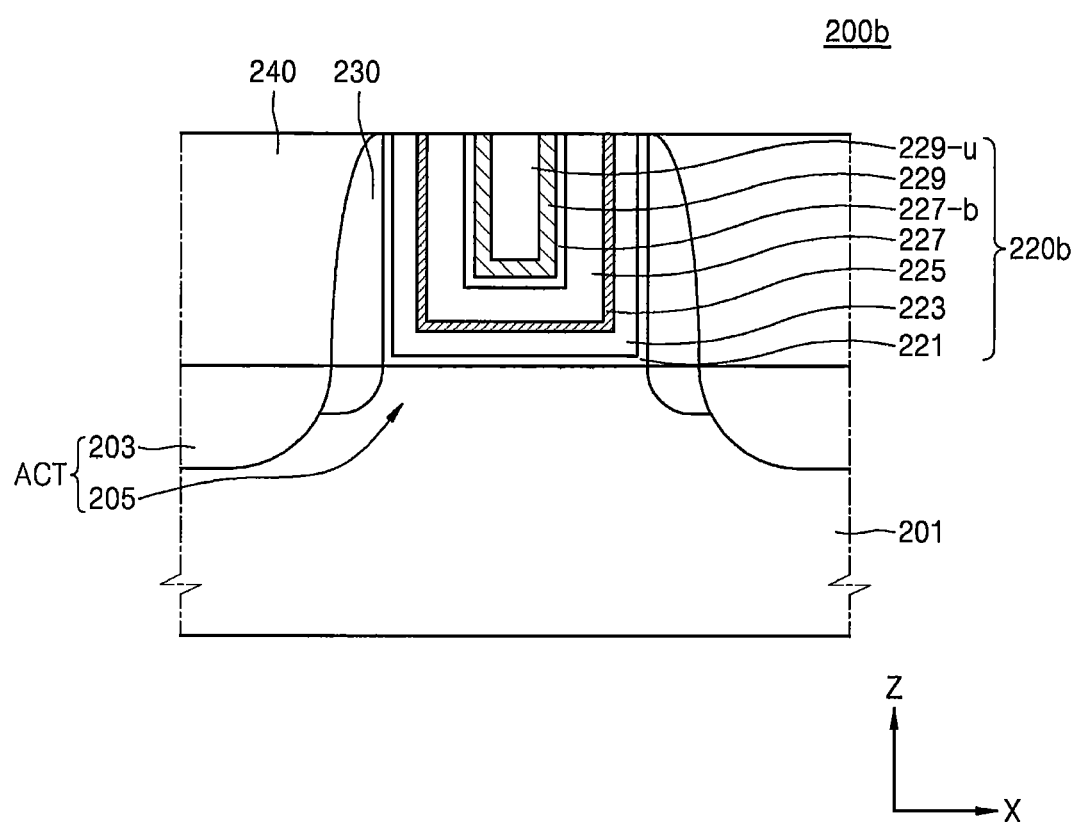

Referring to FIG. 10, the semiconductor device 200b may differ from the semiconductor device 200 of FIG. 8A in that a gate structure 220b of the semiconductor device 200b further includes a barrier metal layer 227-b between the first metal layer 227 and the second metal layer 229. The barrier metal layer 227-b may impede/prevent rare earth elements from being diffused into the second metal layer 229. Accordingly, the second metal layer 229 may not include the rare earth elements. The barrier metal layer 227-b may include metal nitride. The metal nitride may include, for example, Ti, Ta, W, Ru, Nb, Mo, Hf, La, or a combination thereof.

A barrier metal layer may additionally or alternatively be formed between the gap-fill metal layer 229-u and the second metal layer 229. In some embodiments, the barrier metal layer may replace the gap-fill metal layer 229-u, and the gap-fill metal layer 229-u may thus be omitted.

Figure 11:
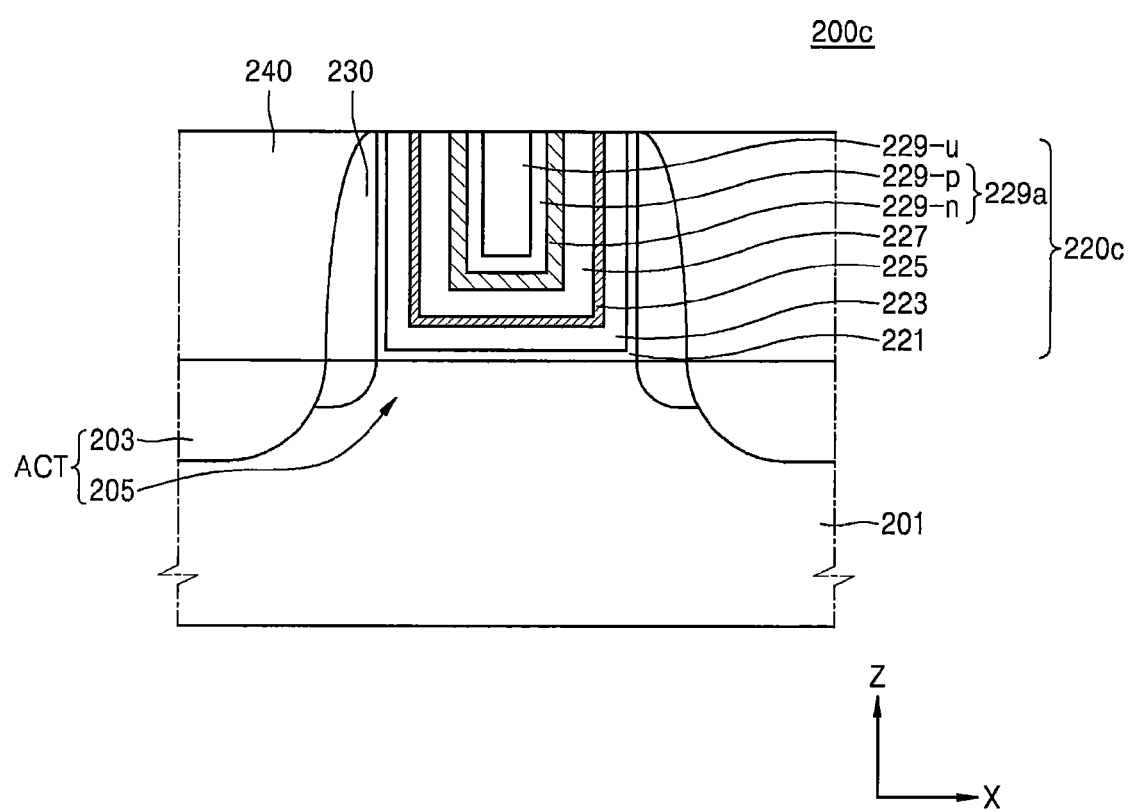

Referring to FIG. 11, the semiconductor device 200c according to some example embodiments may differ from the semiconductor device 200 of FIG. 8A in that a second metal layer 229a of a gate structure 220c includes two metal layers. In more detail, the second metal layer 229a may include an n-type metal layer 229-n at a bottom portion thereof and a p-type metal layer 229-p at an upper portion thereof.

The n-type metal layer 229-*n* may include an Al compound containing Ti or Ta as the second metal layer 229 of the semiconductor device 200 of FIG. 8A. Also, the p-type metal layer 229-*p* may include at least one of Mo, Pd, Ru, Pt, TiN, WN, TaN, Ir, TaC, RuN, and MoN. When the second metal layer 229 is formed as a double layer including the n-type metal layer 229-*n* and the p-type metal layer 229-*p*, a function of the p-type metal layer 229-*p* may be blocked by the n-type metal layer 229-*n*. Accordingly, the second metal layer 229*a* may function as an n-type metal electrode by the n-type metal layer 229-*n*. For reference, in the case of the second metal layer 229*a* formed as the double layer, when forming an NMOS structure/device and a PMOS structure/device together, a process simplification may be achieved by retaining the double layer at a portion corresponding to the NMOS structure/device, and retaining only the p-type metal layer 229-*p* at a portion corresponding to the PMOS structure/device.

In the semiconductor device 200*c*, the n-type metal layer 229-*n* of the second metal layer 229*a* may include Al, and because the Al of the n-type metal layer 229-*n* is injected into the first metal layer 227 via diffusion, a work function of a metal electrode may be adjusted in order to determine a threshold voltage.

Meanwhile, in contrast with the structure illustrated in FIG. 11, the second metal layer 229*a* may include a structure in which the p-type metal layer 229-*p* is disposed below and the n-type metal layer 229-*n* is disposed above. In such a case of this structure, the second metal layer 229*a* may function as a p-type metal electrode. Also, when forming the NMOS structure/device and the PMOS structure/device together based on such a double layer structure, the double layer may be retained at a portion corresponding to the PMOS structure/device, and only the n-type metal layer may be retained at a portion corresponding to the NMOS structure/device.

Figure 12:
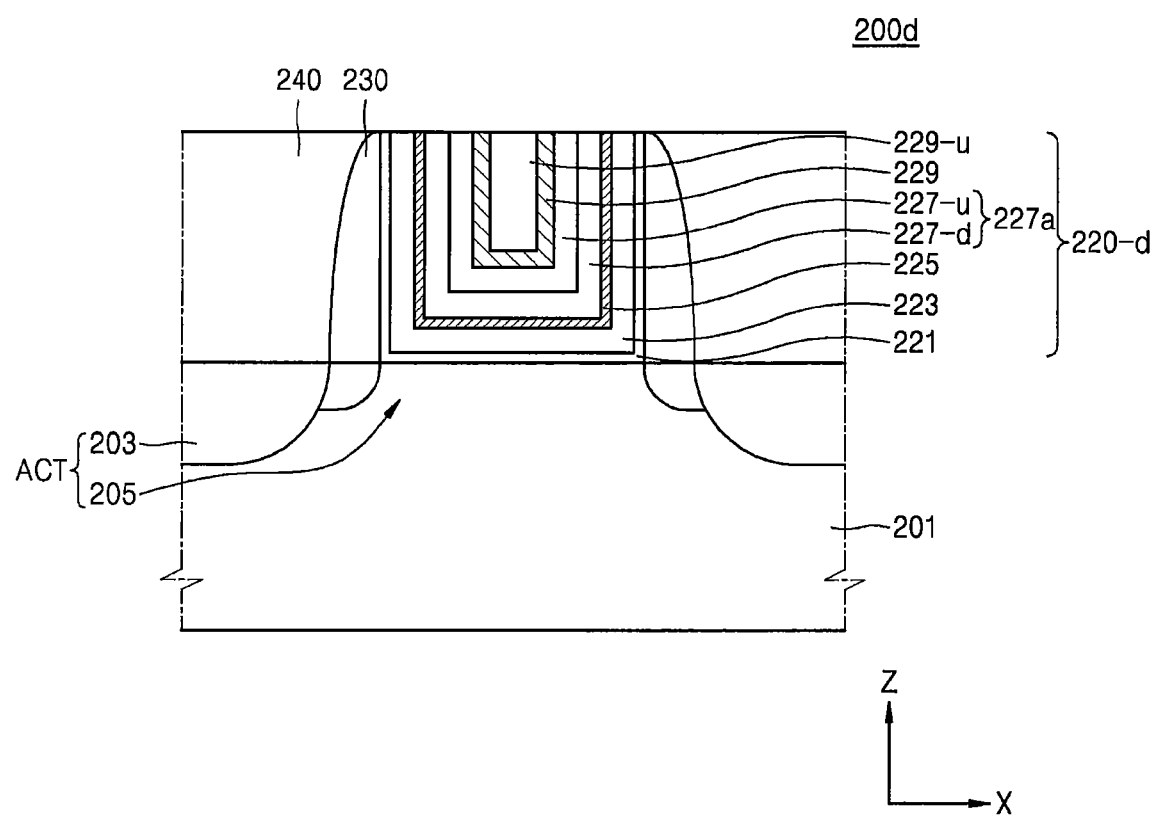

Referring to FIG. 12, the semiconductor device 200*d* may differ from the semiconductor device 200 of FIG. 8A in that a first metal layer 227*a* of a gate structure 220-*d* of the semiconductor device 200*d* includes two metal layers. In more detail, the first metal layer 227*a* may include a first lower metal layer 227-*d* at a lower portion thereof and a first upper metal layer 227-*u* at an upper portion thereof.

Both of the first lower metal layer 227-*d* and the first upper metal layer 227-*u* may include Al. For example, each of the first lower metal layer 227-*d* and the first upper metal layer 227-*u* may include binary element metal nitride, such as TiN and TaN, ternary element metal nitride, such as TiAlN, TaAlN, and TiSiN, and the metal oxynitride. Also, each of the first lower metal layer 227-*d* and the first upper metal layer 227-*u* may include Al injected from the second metal layer 229 on the first metal layer 227*a* via diffusion. Alternatively, in some embodiments, only the first upper metal layer 227-*u* may include the Al injected from the second metal layer 229, and the first lower metal layer 227-*d* may include Al which is injected when the first lower metal layer 227-*d* is formed, instead of the Al injected from the second metal layer 229.

Meanwhile, both of the first lower metal layer 227-*d* and the first upper metal layer 227-*u* may include rare earth elements. The rare earth elements may be injected into the first lower metal layer 227-*d* and the first upper metal layer 227-*u* from the RE supply layer 225 via diffusion. According to some embodiments, the first upper metal layer 227-*u* may include the rare earth elements of a very low concentration or may not include the rare earth elements at all. For example, the first upper metal layer 227-*u* may impede/prevent the rare earth elements from being diffused into the second metal layer 229. Accordingly, the second metal layer 229 may not include the rare earth elements.

In the semiconductor device 200*d*, the first metal layer 227*a* includes two metal layers. However, the structure of the semiconductor device 200*d* according to some example embodiments is not limited thereto. For example, the first metal layer 227*a* may include three or more metal layers.

Figure 13:
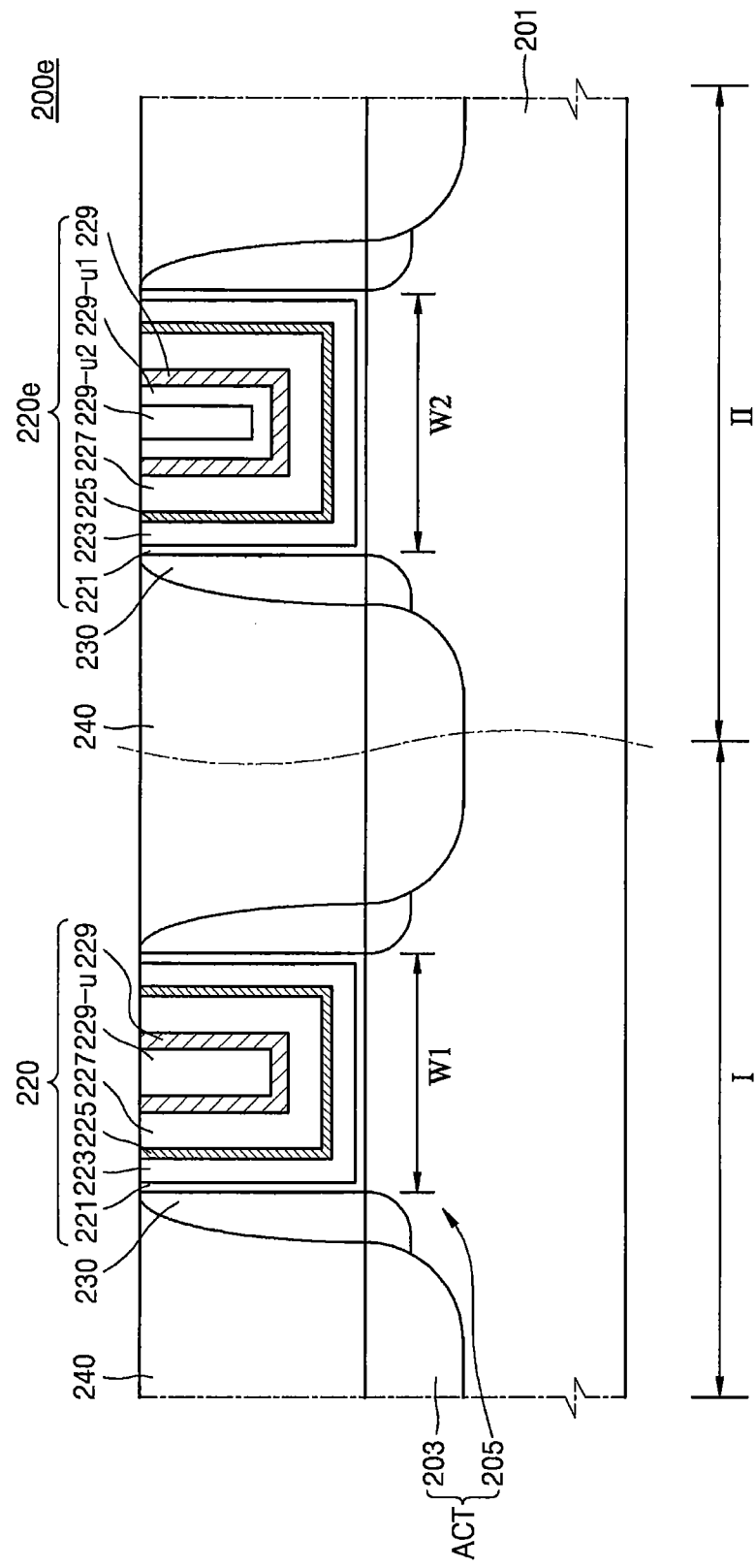
FIGS. 13 and 14 are cross-sectional views of a semiconductor device according to some example embodiments.
Figure 14:
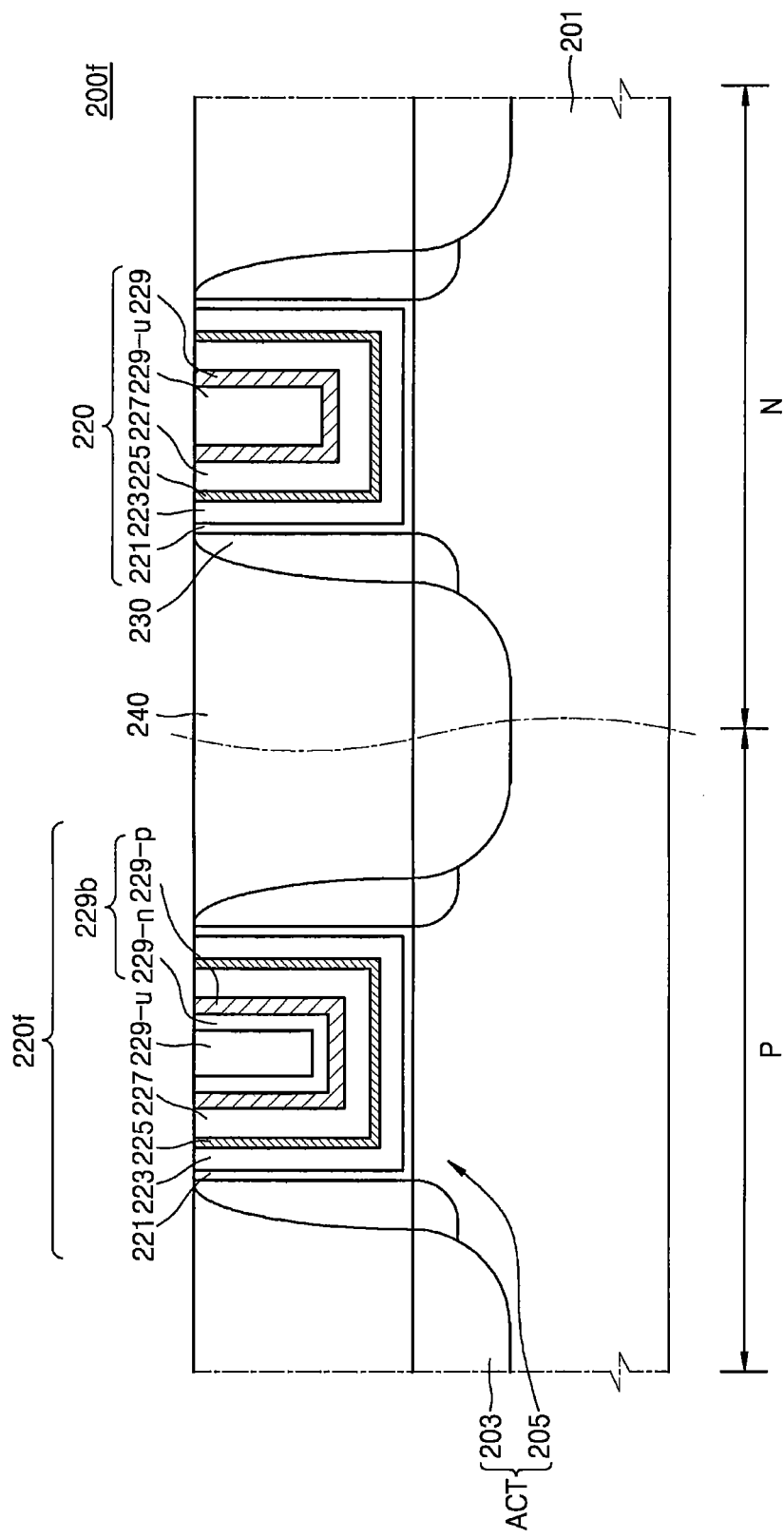

FIGS. 13 and 14 are cross-sectional views of a semiconductor device 200*e* according to some example embodiments. For convenience of explanation, aspects described above with reference to FIGS. 8A and 8B may be only briefly described or repeat descriptions may be omitted.

Referring to FIG. 13, the semiconductor device 200*e* may include two gate structures 220 and 220*e* on the semiconductor substrate 201. In detail, a first area I and a second area II may be defined on the semiconductor substrate 201. The first area I and the second area II may be distanced (i.e., spaced) apart from each other, or connected with each other. The first area I may be an area in which a transistor having a low threshold voltage and a high switching speed is formed, and the second area II may be an area in which a transistor having a high threshold voltage, a relatively low switching speed, and a high reliability is formed.

For example, the first area I may be a cell array region in which a cell array in which a unit memory cell is gathered in a matrix shape is formed, and the second area II may be a core/peripheral region in which a peripheral circuit for transmitting external data to the cell array or transmitting data of the cell array to the outside (e.g., outside of the semiconductor device 200*e*) is formed. Also, the first area I may be an SRAM region, and the second area II may be a logic region. Alternatively, the second area II may be the logic region, and the first area I may be a region in which memory, such as DRAM, MRAM, RRAM, PRAM, etc. is formed. However, the first area I and the second area II are not limited thereto.

The gate structures 220 and 220*e* may include the first gate structure 220 disposed on the first area I and the second gate structure 220*e* disposed on the second area II. The first gate structure 220 may have a gate width that is a first width W1, and the second gate structure 220*e* may have a gate width that is a second width W2. Here, the gate width may correspond to a distance between both (e.g., opposing) spacers 230, and may be substantially the same as a channel length. Meanwhile, based on a layout of the semiconductor device 200*e*, directions of the gate widths of the first gate structure 220 and the second gate structures 220*e* may be the same or different. Meanwhile, the first width W1 of the first gate structure 220 and the second width W2 of the second gate structure 220*e* may be different from each other. For example, the first width W1 of the first gate structure 220 may be less (e.g., narrower) than the second width W2 of the second gate structure 220*e*.

The first gate structure 220 may include the interface layer 221, the high-dielectric layer 223, the RE supply layer 225, the first metal layer 227, the second metal layer 229, and the gap-fill metal layer 229-*u*, as described with reference to FIG. 2A. Functions and structures of the interface layer 221, the high-dielectric layer 223, the RE supply layer 225, the first metal layer 227, the second metal layer 229, and the gap-fill metal layer 229-*u* are described with reference to FIGS. 1 through 2B, and FIGS. 8A and 8B. Meanwhile, although the gap-fill metal layer 229-*u* may be formed of tungsten (W), the gap-fill metal layer 229-*u* may additionally or alternatively be formed of other materials, as described with reference to FIGS. 1 through 2B. Also, the gap-fill metal layer 229-*u* may also be formed of a material included in the barrier metal layer 127-*b* described in FIG. 7. Accordingly, the gap-fill metal layer 229-*u* may include metal nitride. The metal nitride may include, for example, Ti, Ta, W, Ru, Nb, Mo, Hf, La, or a combination thereof.

The second gate structure 220*e* may include the interface layer 221, the high-dielectric layer 223, the RE supply layer 225, the first metal layer 227, the second metal layer 229, a first gap-fill metal layer 229-*u*1, and a second gap-fill metal layer 229-*u*2. The interface layer 221, the high-dielectric layer 223, the RE supply layer 225, the first metal layer 227, and the second metal layer 229 are the same as described with reference to FIGS. 1 through 2B, and FIGS. 8A and 8B. The first gap-fill metal layer 229-*u*1 and the second gap-fill metal layer 229-*u*2 may be formed of the same metal, for example W. When the first gap-fill metal layer 229-*u*1 and the second gap-fill metal layer 229-*u*2 are formed of the same metal, the first gap-fill metal layer 229-*u*1 and the second gap-fill metal layer 229-*u*2 may not be separated from each other but rather may be integrally formed as a single layer. Alternatively, the first gap-fill metal layer 229-*u*1 and the second gap-fill metal layer 229-*u*2 may be formed of different metals. When the first gap-fill metal layer 229-*u*1 and the second gap-fill metal layer 229-*u*2 are formed of different metals, the first gap-fill metal layer 229-*u*1 may be formed as a barrier metal layer and the second gap-fill metal layer 229-*u*2 may be formed of W.

Meanwhile, the first gate structure 220 and the second gate structure 220*e* may be simultaneously formed by the same process. Accordingly, the interface layer 221, the high-dielectric layer 223, the RE supply layer 225, the first metal layer 227, and the second metal layer 229 may be sequentially stacked on a portion on which the first gate structure 220 is to be formed and a portion on which the second gate structure 220*e* is to be formed, so that the first gate structure 220 and the second gate structure 220*e* may be simultaneously formed. Also, the gap-fill metal layer 229-*u* and the first gap-fill metal layer 229-*u*1 are formed on the second metal layer 229, and the gap-fill metal layer 229-*u* and the first gap-fill metal layer 229-*u*1 may be formed of the same material by the same process at the same time.

Meanwhile, because the gate width W1 of the first gate structure 220 is small, the gap-fill metal layer 229-*u* may entirely fill a trench or a gap remaining after the second metal layer 229 is formed. Accordingly, in the case of the first gate structure 220, another metal layer may not exist on the gap-fill metal layer 229-*u*. In contrast, because the gate width W2 of the second gate structure 220*e* is relatively wide, the trench or the gap remaining after the second metal layer 229 is formed may not be entirely filled by the first gap-fill metal layer 229-*u*1. Accordingly, the second gap-fill metal layer 229-*u*2 may fill the gap remaining after the first gap-fill metal layer 229-*u*1 is formed, and the second gate structure 220*e* may further include the second gap-fill metal layer 229-*u*2.

Meanwhile, the first gate structure 220 and the second gate structure 220*e* may form an NMOS structure/device or a PMOS structure/device. Whether the first gate structure 220 and the second gate structure 220*e* operate as the NMOS structure/device or the PMOS structure/device may be determined by a material of the metal electrode including the first metal layer 227 and the second metal layer 229. For example, when the first gate structure 220 and the second gate structure 220*e* form the NMOS structure/device, the second metal layer 229 may be formed of the n-type metal. Also, when the first gate structure 220 and the second gate structure 220*e* form the PMOS structure/device, the second metal layer 229 may be formed of the p-type metal. The n-type metal may include, for example, a material selected from the group consisting of TiAl, TiAlN, TaC, TiC, and HfSi. Also, the p-type metal may include, for example, a material selected from the group consisting of Mo, Pd, Ru, Pt, TiN, WN, TaN, Ir, TaC, RuN, and MoN.

The first gate structure 220 and the second gate structure 220*e* may be formed of different types of devices, rather than the same type of devices. For example, the first gate structure 220 may form the NMOS structure/device and the second gate structure 220*e* may form the PMOS structure/device. However, the opposite may also be possible. In addition, between the NMOS and PMOS structures, a shift direction of the threshold voltage may be the opposite, because the rare elements are injected into the first metal layer 227. For example, when the rare elements are injected into the first metal layer 227, the threshold voltage of the NMOS structure/device may be decreased and the threshold voltage of the PMOS structure/device may be increased. However, the shift of the threshold voltage is not limited thereto. For example, the shift of the threshold voltage may vary according to types of electrode metals or types of rare elements.

Meanwhile, although the semiconductor device 200*e* includes the two gate structures 220 and 220*e* on the semiconductor substrate 201, this is only one example. The semiconductor device 200*e* may include three or more gate structures on the semiconductor substrate 201.

According to some example embodiments, the semiconductor device 200*e* includes at least two gate structures 200 and 200*e* on the semiconductor substrate 201, and a threshold voltage of each of the at least two gate structures 200 and 200*e* is precisely adjusted by the injection of the rare elements into the first metal layer 227. Accordingly, the semiconductor device 200*e* including at least two transistors having different threshold voltages and excellent reliability and performance may be realized.

Referring to FIG. 14, the semiconductor device 200*f* is substantially the same as the semiconductor device 200*e* of FIG. 13 in that the semiconductor device 200*f* includes two gate structures 200 and 200*f* on the semiconductor substrate 201. However, the semiconductor device 200*f* may differ from the semiconductor device 200*e* in terms of the structure of a second metal layer 229*b*. In detail, the semiconductor substrate 201 may be divided into a PMOS region P and an NMOS region N, and a PMOS structure/device may be disposed in the PMOS region P, and an NMOS structure/device may be disposed in the NMOS region N.

The gate structure 220*f* forming the PMOS structure/device may include the interface layer 221, the high-dielectric layer 223, the RE supply layer 225, the first metal layer 227, the second metal layer 229*b*, and the gap-fill metal layer 229-*u*. The second metal layer 229*b* may include the p-type metal layer 229-*p* at a bottom portion thereof and the n-type metal layer 229-*n* at an upper portion thereof. As described with reference to FIG. 11, the function of the n-type metal layer 229-*n* is blocked by the p-type metal layer 229-*p*, and thus, the second metal layer 229*b* may function as a p-type metal electrode because of the p-type metal layer 229-*p*.

The gate structure 220 forming the NMOS structure/device may include the interface layer 221, the high-dielectric layer 223, the RE supply layer 225, the first metal layer 227, the second metal layer 229, and the gap-fill metal layer 229-*u*. The second metal layer 229 may be formed of an n-type metal layer, and the second metal layer 229 may thus function as an n-type metal electrode. As illustrated in FIG. 14, the gate structure 220 forming the NMOS structure/ device does not include the p-type metal layer 229-p. Thus, a width of a gap remaining after the second metal layer 229 is formed is relatively wide (wider by a thickness of the p-type metal layer 229-p that is omitted), and a width of the gap-fill metal layer 229-u may thus be relatively wide, or a barrier metal layer may further be formed between the gap-fill metal layer 229-u and the second metal layer 229.

Figure 15:
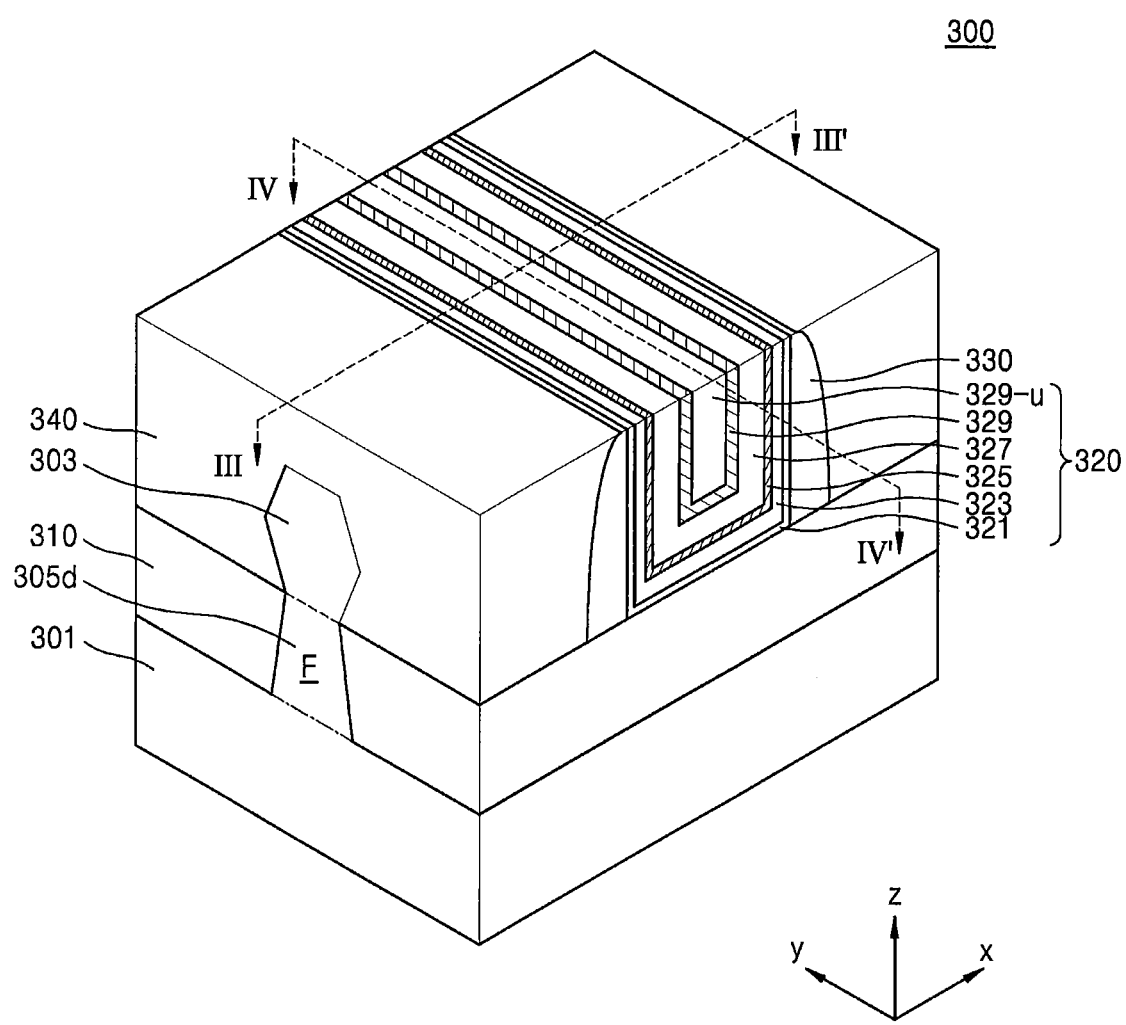
FIG. 15 is a perspective view of a semiconductor device according to some example embodiments.
Figure 16A:
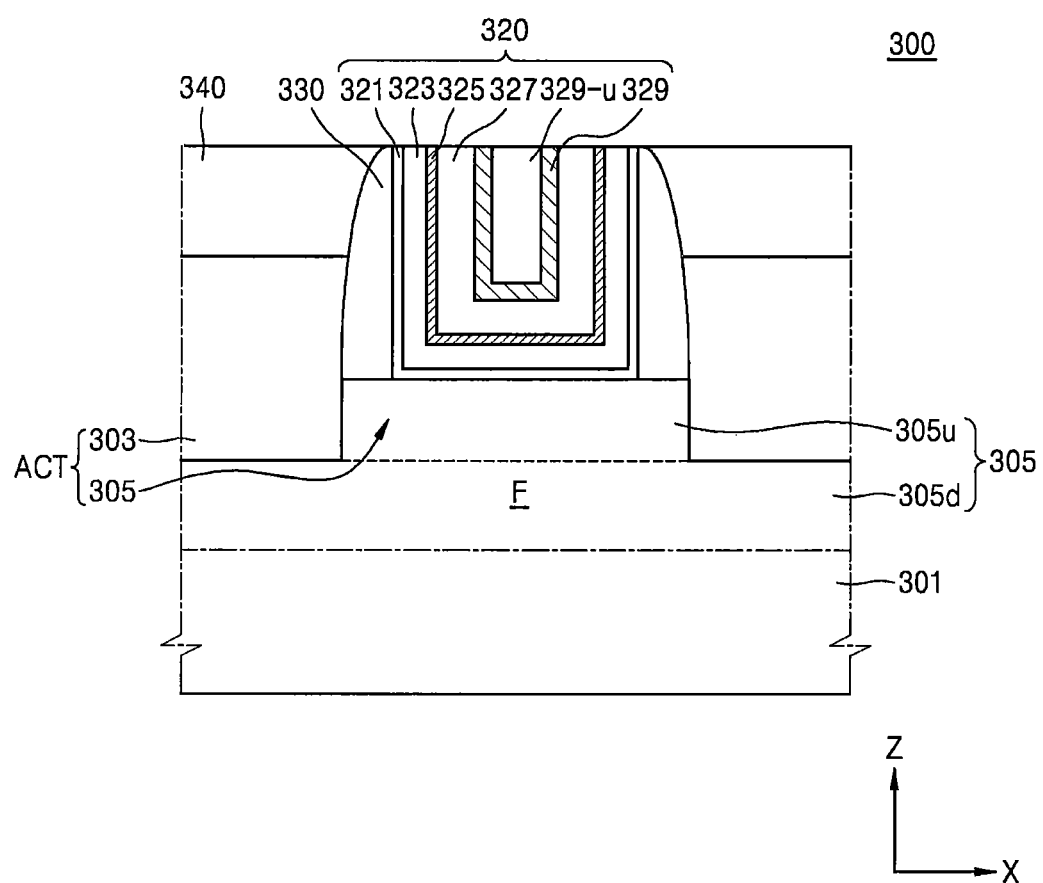
FIGS. 16A and 16B are cross-sectional views taken along lines and IV-IV' of the semiconductor device of FIG. 15, respectively.
Figure 16B:
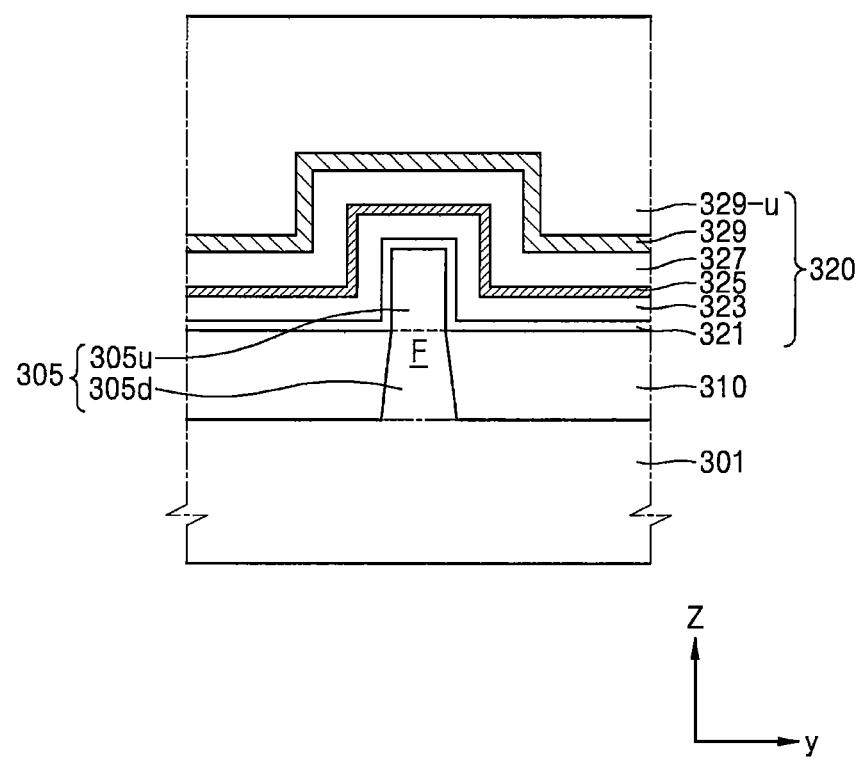

FIG. 15 is a perspective view of a semiconductor device 300 according to some example embodiments, and FIGS. 16A and 16B are cross-sectional views taken along lines III-III' and IV-IV' of the semiconductor device 300 of FIG. 15, respectively. For convenience of explanation, aspects described with reference to FIGS. 1 through 2B, FIG. 8A, and FIG. 10B may be only briefly described or repeat descriptions may be omitted.

Referring to FIGS. 15, 16A, and 16B, the semiconductor device 300 may include a semiconductor substrate 301, a fin-structured/shaped active area (ACT, hereinafter, referred to as "a fin active area"), and a gate structure 320. In detail, the semiconductor device 300 may include the semiconductor substrate 301, the fin active area ACT, a device isolation layer 310, a gate structure 320, and an interlayer insulating layer 340.

The semiconductor substrate 301 may correspond to the semiconductor substrate 101 of the semiconductor device 100 of FIGS. 1 through 2B. Thus, a detailed description of the semiconductor substrate 301 may be omitted.

The fin active area ACT may be formed to protrude from the semiconductor substrate 301 and to extend in a first direction (a direction x). A plurality of fin active areas ACTs may be formed on the semiconductor substrate 301 and spaced apart from each other in a second direction (a direction y). The plurality of fin active areas ACTs may be electrically insulated from one another by the device isolation layer 310, etc.

The fin active area ACT may include a fin 305 and a source/drain area 303. The fin 305 may include a bottom fin portion 305d, both side surfaces of which are surrounded by the device isolation layer 310, and an upper fin portion 305u protruding from an upper surface of the device isolation layer 310. The upper fin portion 305u may be disposed below the gate structure 320, and may form a channel area. The source/drain area 303 may be formed on the bottom fin portion 305d at both (e.g., opposing) side surfaces of the gate structure 320.

The fin 305 may be a protruding portion of the semiconductor substrate 301, and the source/drain area 303 may be formed of an epitaxial layer grown in/on the bottom fin portion 305d. In some embodiments, the upper fin portion 305u may be disposed at both (e.g., opposing) side surfaces of the gate structure 320, and the upper fin portion 305u disposed at the both side surfaces of the gate structure 320 may form the source/drain area 303. For example, the source/drain area 303 may not be formed by additionally growing the epitaxial layer, and may be formed of the upper fin portion 305u of the fin 305 as the channel area.

When the fin 305 is based on the semiconductor substrate 301, and the source/drain area 303 is formed of the epitaxial layer grown in/on the bottom fin portion 305d or of the fin 305, as shown above, the fin 305 may include silicon or germanium, which is a semiconductor element. Also, the fin 305 may include a compound semiconductor, such as a group IV-IV compound semiconductor or a group III-V compound semiconductor. For example, the fin 305 may include, as the group IV-IV compound semiconductor, a binary compound and a ternary compound including at least two of C, Si, Ge, and Sn, or a compound in which the binary compound or the ternary compound is doped with a group IV element. Also, the fin 305 may include, as the group III-V compound semiconductor, any one of a binary compound, a ternary compound, and a tetrad compound, wherein the binary compound, the ternary compound, or the tetrad compound is formed by combining, for example, at least one of Al, Ga, and In, which are group III elements, with any one of P, As, and Sb, which are group V elements. A structure and a forming method of the fin 305 will be described in more detail with reference to FIGS. 32A through 39C.

In some embodiments, the source/drain area 303 may be formed on the bottom fin portion 305d at both sides of the gate structure 320, and may include a compressive stress material or a tensile stress material, according to types of the channel of the transistor that are desired/required. For example, when a PMOS structure/device is formed, the source/drain area 303 at the both side surfaces of the gate structure 320 may include the compressive stress material. In detail, when the bottom fin portion 305d is formed of silicon, the source/drain area 303 may be formed of the compressive stress material which has a larger lattice constant than silicon, for example, SiGe. Also, when a NMOS structure/device is formed, the source/drain area 303 at the both side surfaces of the gate structure 320 may include the tensile stress material. In detail, when the bottom fin portion 305d is formed of silicon, the source/drain area 303 may be formed of the tensile stress material, such as silicon, or a tensile stress material having a smaller lattice constant than silicon, for example, SiC.

In addition, in the semiconductor device 300 according to some example embodiments, the source/drain area 303 may have one or more shapes. For example, in a cross-sectional plane (e.g., the y-z plane) perpendicular to the first direction (the direction x), the source/drain area 303 may have one or more shapes, such as a diamond, a circle, an oval, a polygon, etc. For example, FIG. 15 illustrates a hexagonal diamond shape.

The device isolation layer 310 may be formed on the semiconductor substrate 301 to surround both side surfaces of the bottom fin portion 305d of the fin 305. The device isolation layer 310 may correspond to the device isolation layer 110 of the semiconductor device 100 of FIGS. 1 through 2B, and may electrically insulate the fins F arranged in the second direction (the direction y). The device isolation layer 310 may include, for example, at least one of a silicon oxide layer, a silicon nitride layer, a silicon oxynitride layer, and a combination thereof.

Meanwhile, the upper fin portion 305u of the fin 305 may not be surrounded by the device isolation layer 310 and may have a protruding structure. Also, as illustrated in FIGS. 16A and 16B, the upper fin portion 305u of the fin 305 may be disposed only at a bottom portion of the gate structure 320 and may form a channel area.

The gate structure 320 may extend on the device isolation layer 310 across the fin 305 in the second direction (the direction y). A plurality of gate structures 320 may be arranged with respect to one fin 305. The plurality of gate structures 320 may be disposed to be apart (e.g., may be spaced apart) from one another in the first direction (the direction x). The gate structures 320 may be formed to surround an upper surface and side surfaces of the upper fin portion 305u of the fin 305.

The gate structure 320 may correspond to the gate structure 220 of the semiconductor device 200 of FIGS. 8A and 8B. Accordingly, the gate structure 320 may include an interface layer 321, a high-dielectric layer 323, an RE supply layer 325, a first metal layer 327, a second metal layer 329, and a gap-fill metal layer 329-*u*. Materials or functions of each of the layers forming the gate structure 320 are the same as described with respect to the semiconductor device 100 of FIGS. 1 through 2B, and the semiconductor device 200 of FIGS. 8A and 8B. However, in the semiconductor device 300 according to some example embodiments, because the gate structure 320 is formed to cover the fin 305, a structure of a cross-sectional plane of FIG. 16B may be different from the structure of the cross-sectional plane of FIG. 8B. Also, because the source/drain area 303 is formed on the bottom fin portion 305*d* as illustrated in FIG. 16A, a structure of the source/drain area 303 at both side surfaces of the gate structure 320 may be different from the structure of the source/drain area 203 of FIG. 8A.

An interlayer insulating layer 340 may be formed on the device isolation layer 310 to cover the source/drain area 303. For example, the interlayer insulating layer 340 may surround an upper surface and side surfaces of the source/drain area 303. The interlayer insulating layer 340 may correspond to the interlayer insulating layer 240 of the semiconductor device 200 of FIGS. 8A and 8B. Thus, materials or structures of the interlayer insulating layer 340 may be the same as described with respect to the semiconductor device 200 of FIGS. 8A and 8B.

A spacer 330 may be formed between the interlayer insulating layer 340 and the gate structure 320. The spacer 330 may extend in the second direction (the direction y) while surrounding the both side surfaces of the gate structure 320. Also, the spacer 330 may extend across the fin 305 to surround the upper surface and the side surfaces of the upper fin portion 305*u*, similarly to the gate structure 320. The spacer 330 may correspond to the spacer 230 of the semiconductor device 200 of FIGS. 8A and 8B. Accordingly, materials, etc. of the spacer 230 are the same as described with respect to the semiconductor device 200 of FIGS. 8A and 8B.

In the semiconductor device 300 according to some example embodiments, an interface between the interface layer 321 and the high-dielectric layer 323 includes rare earth elements, and the first metal layer 327 on the RE supply layer 325 also includes the rare earth elements, and thus, threshold voltages are doubly changed so that the semiconductor device 300 may have a more precisely adjusted threshold voltage. Also, an amount of the rare earth elements in/at the interface between the interface layer 321 and the high-dielectric layer 323 is not affected by an Al composition of the first metal layer, and the semiconductor device 300 thus may not experience reliability and performance deterioration due to the threshold voltage adjustment.

FIGS. 17 through 20 are cross-sectional views of semiconductor devices 300*a*, 300*b*, 300*c*, and 300*d* according to some example embodiments, and correspond to the cross-sectional view of FIG. 16A. For convenience of explanation, aspects described with reference to FIGS. 15 through 16B may be only briefly described or repeat descriptions may be omitted.

Figure 17:
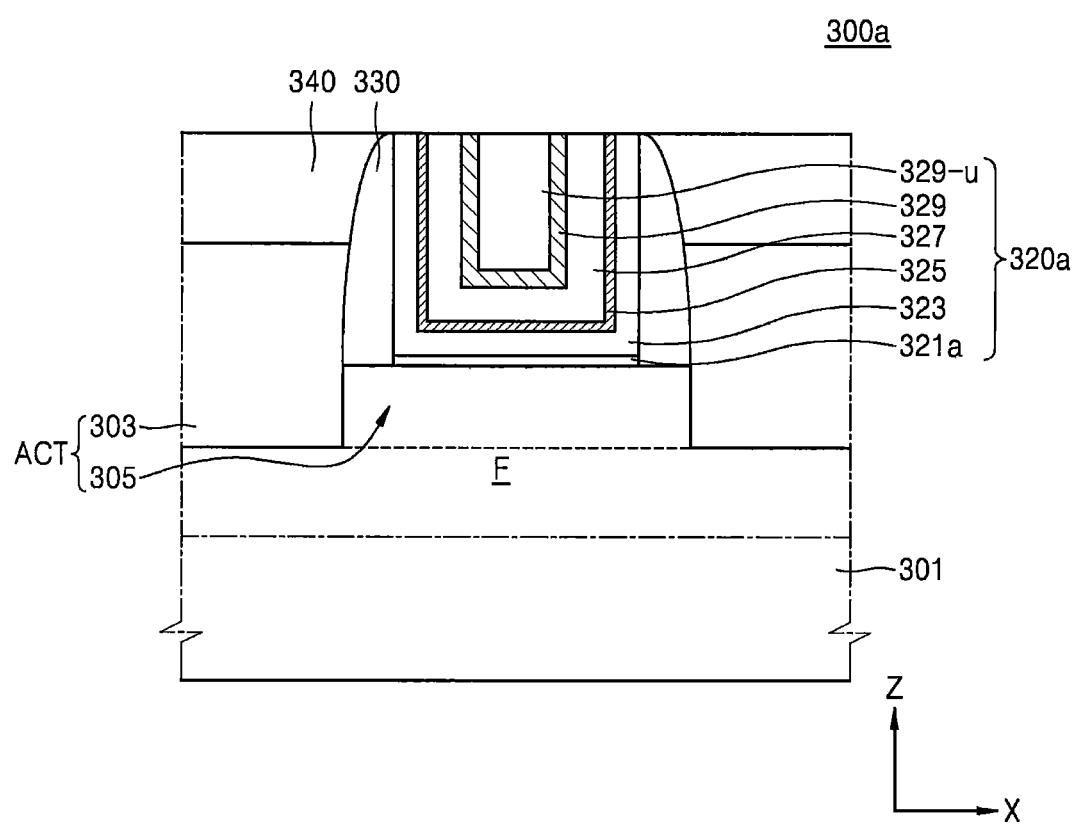
FIGS. 17 through 20 are cross-sectional views of semiconductor devices according to some example embodiments, and corresponding to the cross-sectional view of FIG. 16A.

Referring to FIG. 17, the semiconductor device 300*a* may differ from the semiconductor device 300 of FIG. 16A in terms of a structure of an interface layer 321*a*. In the semiconductor device 300*a*, the interface layer 321*a* may be formed only on an upper surface of the fin 305, and may not be formed on a side surface of the spacer 330. The interface layer 321*a* may be realized by using a dummy insulating layer of a dummy gate structure, as the interface layer, rather than removing the dummy insulating layer. Because the interface layer 321*a* is formed only on the upper surface of the fin 305, a gap/distance between side surfaces of layers forming the gate structure 320*a* may become wider, and a width of a gap-fill metal layer 329-*u* may thus increase.

Figure 18:
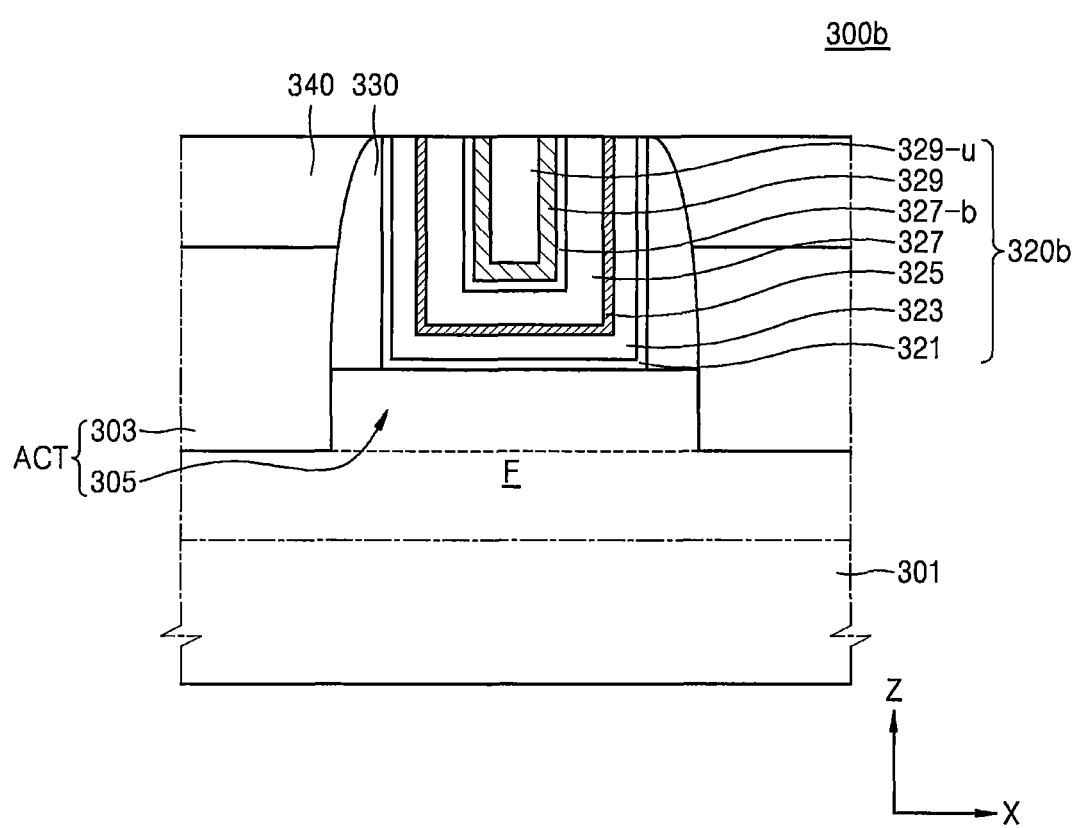

Referring to FIG. 18, the semiconductor device 300*b* may differ from the semiconductor device 300 of FIG. 16A in that the semiconductor device 300*b* further includes a barrier metal layer 327-*b* between the first metal layer 327 and the second metal layer 329. The barrier metal layer 327-*b* may impede/prevent rare earth elements from being diffused into the second metal layer 329. Accordingly, the second metal layer 329 may not include the rare earth elements. The barrier metal layer 327-*b* may include metal nitride.

The barrier metal layer 327-*b* may additionally or alternatively be formed between the gap-fill metal layer 329-*u* and the second metal layer 329. In some embodiments, the barrier metal layer 327-*b* may replace the gap-fill metal layer 329-*u*, and the additional gap-fill metal layer may thus be omitted.

Figure 19:
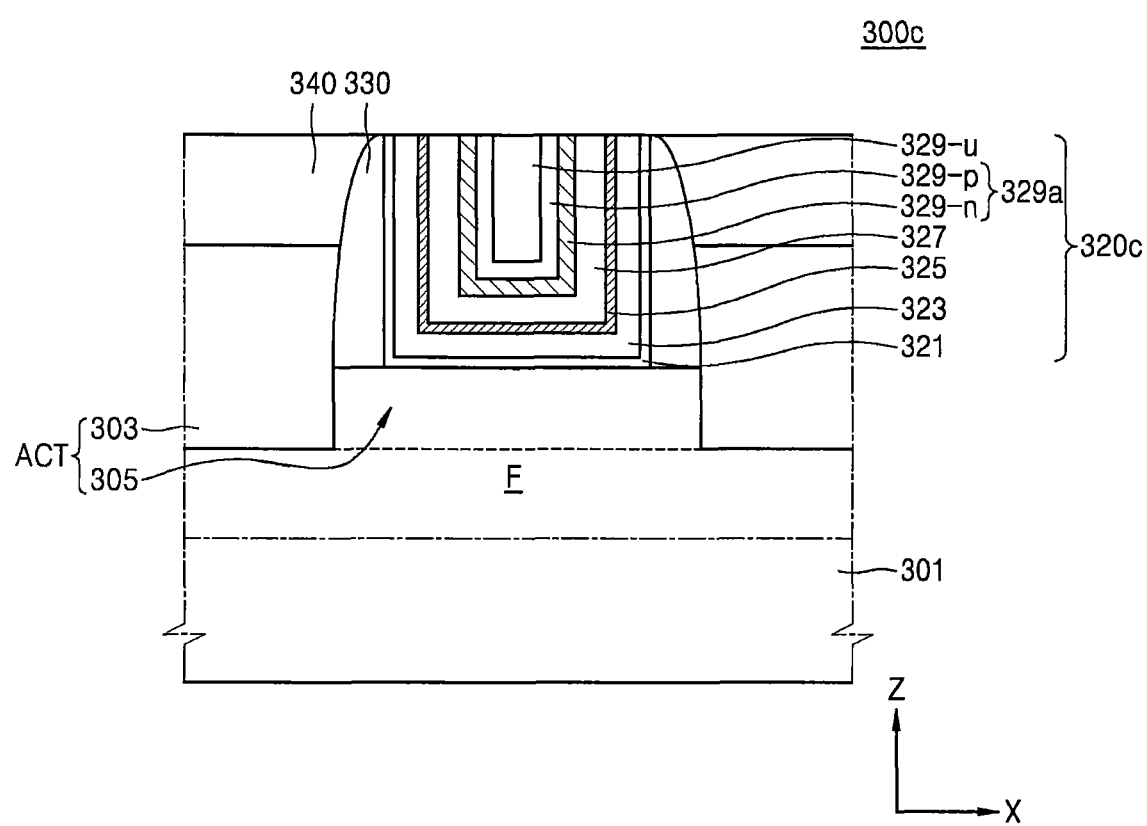

Referring to FIG. 19, the semiconductor device 300*c* may differ from the semiconductor device 300 of FIG. 16A in that a second metal layer 329*a* of the semiconductor device 300*c* includes two metal layers. In more detail, the second metal layer 329*a* may include an n-type metal layer 329-*n* in a bottom portion thereof and a p-type metal layer 329-*p* in an upper portion thereof. Materials of the n-type metal layer 329-*n* and the p-type metal layer 329-*p* are the same as described with respect to those of the second metal layer 229*a* of FIG. 11.

Meanwhile, when the second metal layer 329*a* is formed as a double layer including the n-type metal layer 329-*n* and the p-type metal layer 329-*p*, a function of the p-type metal layer 329-*p* may be blocked by the n-type metal layer 329-*n*. Accordingly, the second metal layer 329*a* may function as an n-type metal electrode because of the n-type metal layer 329-*n*. Also, in the case of the second metal layer 329*a* formed as the double layer, when forming an NMOS structure/device and a PMOS structure/device together, a process simplification may be achieved by retaining the double layer at a portion corresponding to the NMOS structure/device, and retaining only the p-type metal layer 329-*p* at a portion corresponding to the PMOS structure/device. Moreover, in contrast to the structure illustrated in FIG. 19, the second metal layer 329*a* may be formed as a structure including the p-type metal layer 329-*p* in the bottom portion thereof and the n-type metal layer 329-*n* in the upper portion thereof. When forming the NMOS structure/device and the PMOS structure/device together based on this double layer structure, the double layer may be retained at a portion corresponding to the PMOS structure/device and only the n-type metal layer may be retained at a portion corresponding to the NMOS structure/device.

Figure 20:
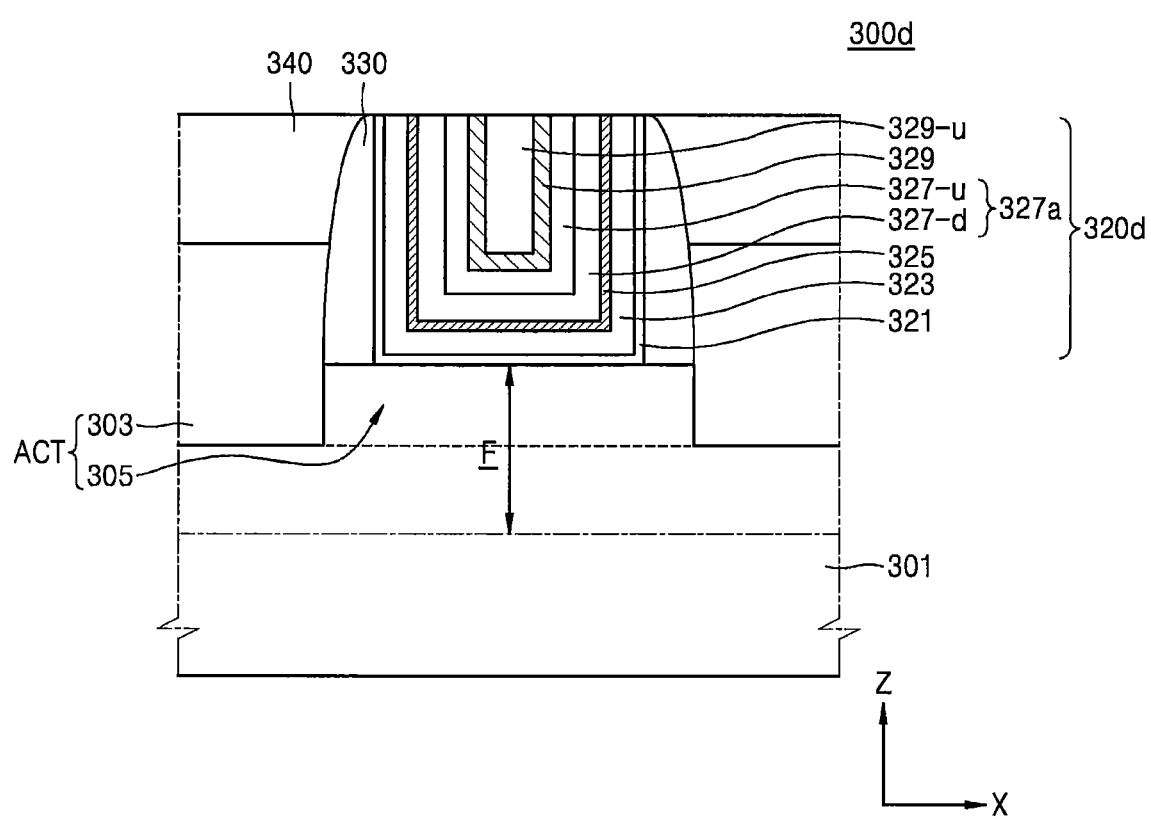

Referring to FIG. 20, the semiconductor device 300*d* may differ from the semiconductor device 300 of FIG. 16A in that a first metal layer 327*a* of the semiconductor device 300*d* includes two metal layers. In more detail, the first metal layer 327*a* may include a first bottom metal layer 327-*d* at a bottom portion thereof and a first upper metal layer 327-*u* at an upper portion thereof. Materials, etc. of the first bottom metal layer 327-*d* and the first upper metal layer 327-*u* are the same as described with respect to the first metal layer 227*a* of FIG. 12.

For example, both of the first bottom metal layer 327-*d* and the first upper metal layer 327-*u* may include Al. Each of the first bottom metal layer 327-*d* and the first upper metal layer 327-*u* may include Al injected from the second metal layer 329 disposed above the first bottom metal layer 327-*d* and the first upper metal layer 327-*u*, via diffusion. Alternatively, in some embodiments, only the first upper metal layer 327-*u* may include the Al injected from the second metal layer 329, and the first bottom metal layer 327-*d* may include Al included when the first bottom metal layer 327-*d* is formed, instead of the injected Al.

Meanwhile, both of the first bottom metal layer 327-*d* and the first upper metal layer 327-*u* may include rare earth elements. The rare earth elements may be injected into the first bottom metal layer 327-*d* and the first upper metal layer 327-*u* from the RE supply layer 325 via diffusion. In some embodiments, the first upper metal layer 327-*u* may include the rare earth elements at/of a very low concentration or may not include the rare earth elements. For example, the first upper metal layer 327-*u* may impede/prevent the rare earth elements from being diffused into the second metal layer 329. Accordingly, the second metal layer 329 may not include the rare earth elements.

In the semiconductor device 300*d* according to some example embodiments, the first metal layer 327*a* includes two metal layers. However, the structure of the semiconductor device 300*d* is not limited thereto. For example, the first metal layer 327*a* may include three or more metal layers.

Figure 21:
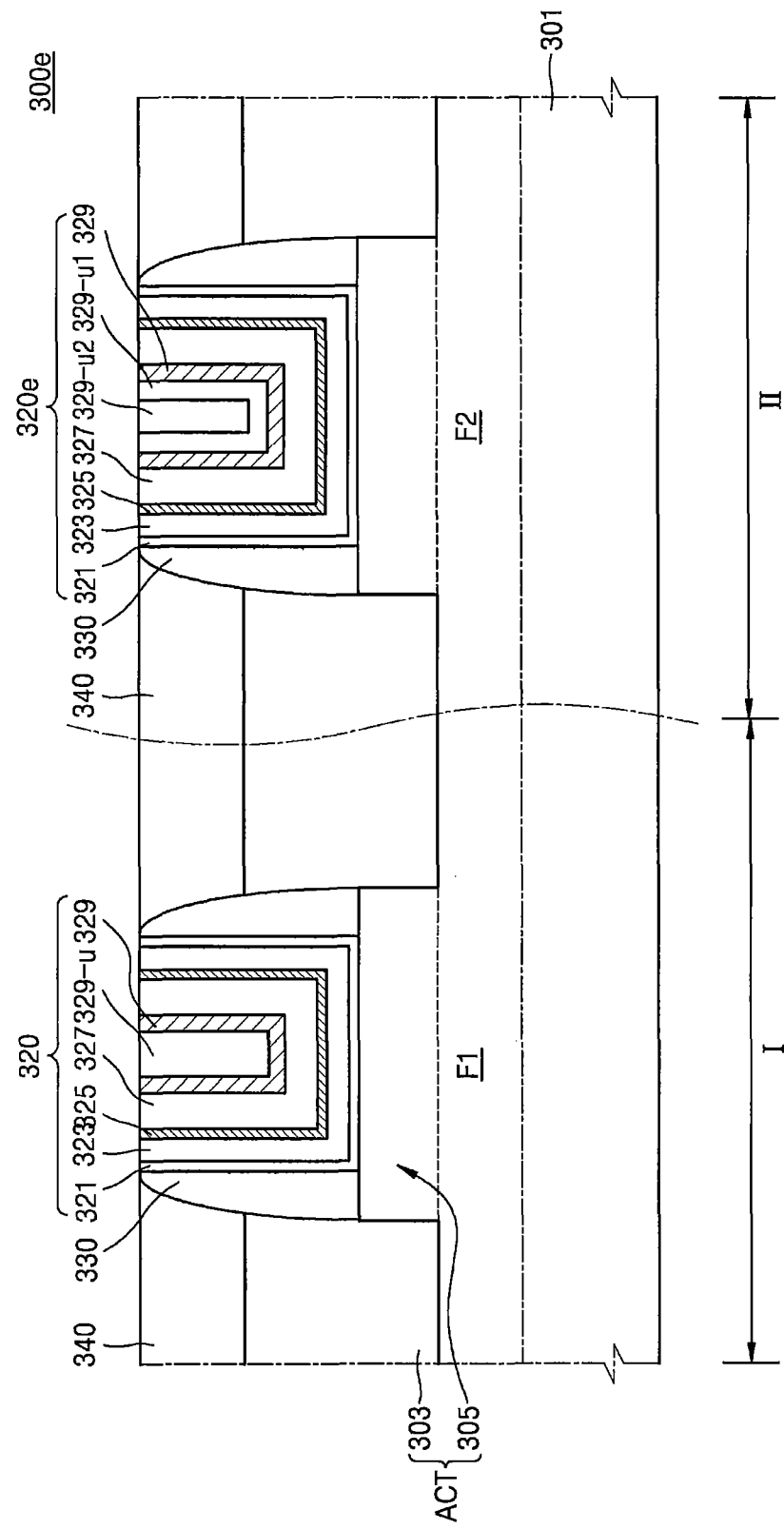
FIGS. 21 and 22 are cross-sectional views of a semiconductor device according to some example embodiments.
Figure 22:
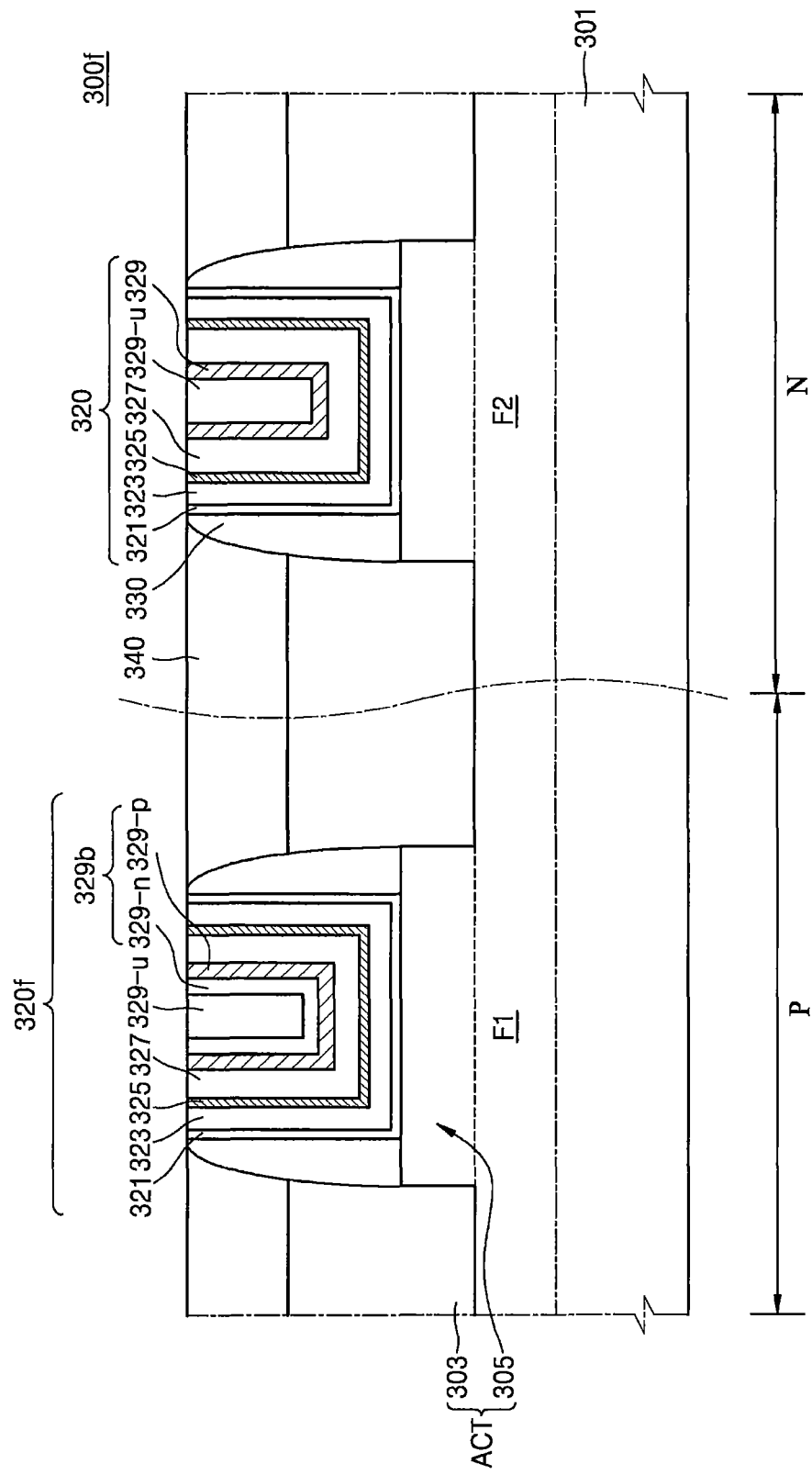

FIGS. 21 and 22 are cross-sectional views of semiconductor devices 300*e* and 300*f* according to some example embodiments. For convenience of explanation, aspects described above with reference to FIGS. 15 through 16B may be only briefly described or repeat descriptions may be omitted altogether.

Referring to FIG. 21, the semiconductor device 300*e* may include two gate structures 320 and 320*e* on the semiconductor substrate 301. In detail, a first area I and a second area II may be defined on the semiconductor substrate 301. The first area I and the second area II may be distanced/spaced apart from each other or may be connected to each other. Characteristics of transistors disposed in the first area I and the second area II and structures of the gate structures 320 and 320*e* disposed in the first area I and the second area II may be largely the same as those described with respect to analogous transistors/structures of FIG. 13. However, in the semiconductor device 300*e*, because the gate structures 320 and 320*e* extend to cover the fin 305, a structure of a cross-sectional plane may be different from that of the semiconductor device 200*e* of FIG. 13.

Meanwhile, although the semiconductor device 300*e* includes the two gate structures 320 and 320*e* on the semiconductor substrate 301, it is only one example. The semiconductor device 300*e* may include three or more gate structures on the semiconductor substrate 301.

The semiconductor device 300*e* includes at least two gate structures 320 and 320*e* on the semiconductor substrate 301, and each of the threshold voltages of the at least two gate structures is precisely adjusted by the injection of rare earth elements into the first metal layer 327. Accordingly, the semiconductor device including at least two transistors having different threshold voltages and high reliability and performance may be realized.

Referring to FIG. 22, the semiconductor device 300*f* may be similar to the semiconductor device 300*e* of FIG. 21, as the semiconductor device 300*f* includes two gate structures 320 and 320*f* on the semiconductor substrate 301. However, the semiconductor device 300*f* may differ from the semiconductor device 300*e* of FIG. 21 in terms of a structure of a second metal layer 329*b*. In detail, the semiconductor substrate 301 may be divided into a PMOS area P and an NMOS area N. A PMOS structure/device may be arranged in the PMOS area P and an NMOS structure/device may be arranged in the NMOS area N.

Structures and functions of the gate structure 320*f* forming the PMOS structure/device and structures and functions of the gate structure 320 forming the NMOS structure/device may be largely the same as those described with respect to the gate structures 220*f* and 220 of FIG. 14. However, because the gate structures 320 and 320*f* of the semiconductor device 300*f* extend to cover the fin 305 (e.g., fins F1 and F2), a vertical cross-sectional plane of the semiconductor device 300*f* may be different from that of the semiconductor device 200*f* of FIG. 14.

Figure 23:
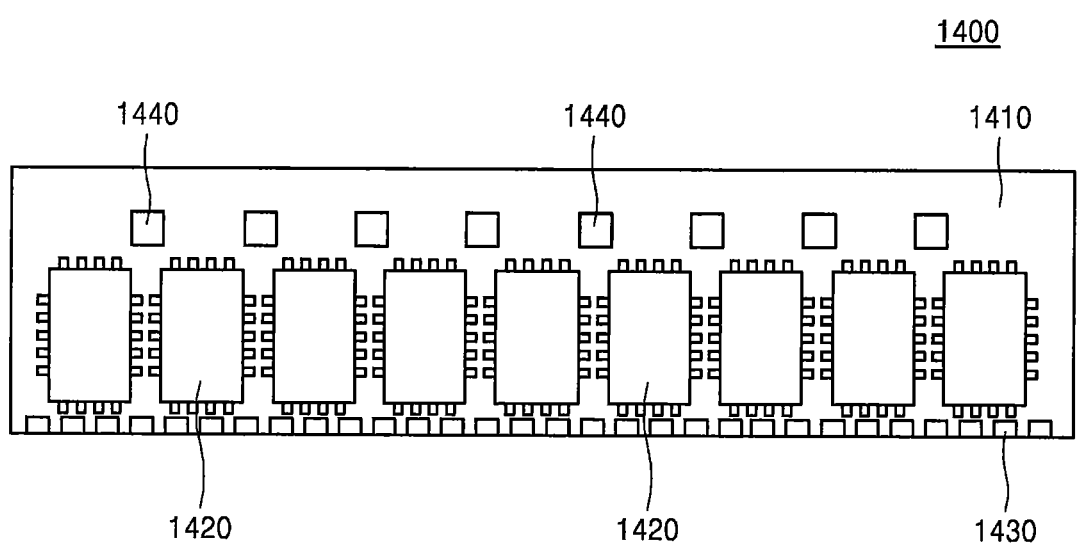
FIG. 23 is a plan view of a memory module according to present inventive concepts.

FIG. 23 is a plan view of a memory module 1400 according to present inventive concepts.

Referring to FIG. 23, the memory module 1400 may include a module substrate 1410, and a plurality of semiconductor chips 1420 coupled to the module substrate 1410.

A semiconductor chip 1420 may include at least one of the semiconductor devices according to some example embodiments of present inventive concepts. For example, the semiconductor chip 1420 may include at least one of the semiconductor devices 100, 100*a*, 200 through 200*f*, and 300 through 300*f* according to some example embodiments of present inventive concepts, which are described with reference to FIGS. 1 through 22, and/or semiconductor devices modified or changed from the semiconductor devices 100, 100*a*, 200 through 200*f*, and 300 through 300*f*.

A connecting unit 1430, which may be inserted into a socket of a mother board, may be disposed on a side of the module substrate 1410. A ceramic decoupling capacitor 1440 may be disposed on the module substrate 1410. The memory module 1400 is not limited to the structure illustrated in FIG. 23, and may have various shapes.

Figure 24:
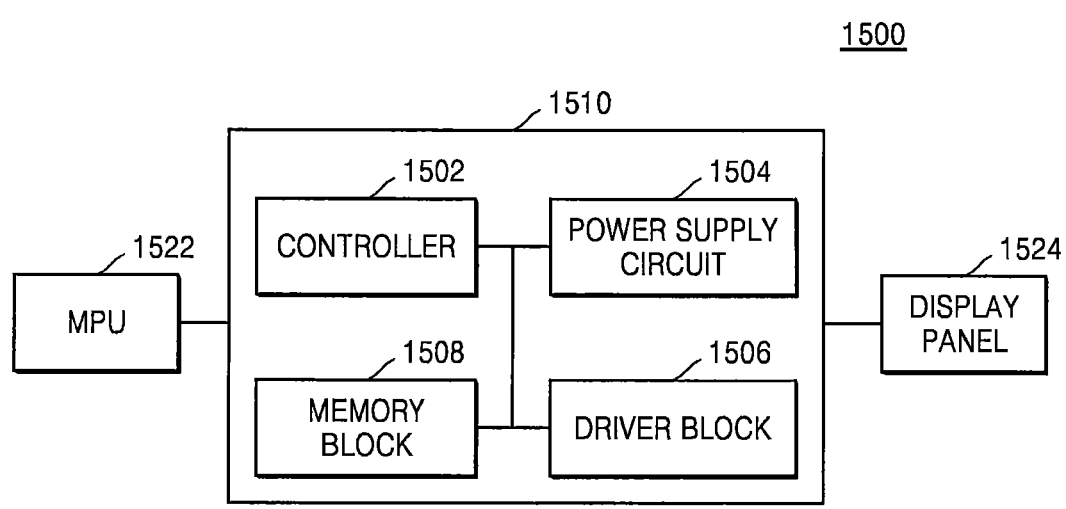
FIG. 24 is a schematic block diagram of a display driver integrated circuit (DDI) and a display apparatus including the DDI, according to some example embodiments.

FIG. 24 is a schematic block diagram of a display driver IC (DDI) 1510 and a display apparatus 1500 including the DDI 1510, according to some example embodiments.

Referring to FIG. 24, the DDI 1510 may include a controller 1502, a power supply circuit 1504, a driver block 1506, and a memory block 1508. The controller 1502 may receive commands applied from a main processing unit (MPU) 1522, may decode the commands, and may control each of blocks of the DDI 1510 to realize operations based on the commands. The power supply circuit 1504 may generate a driving voltage in response to the control of the controller 1502. The driver block 1506 may drive a display panel 1524 by using the driving voltage generated by the power supply circuit 1504 in response to the control of the controller 1502. The display panel 1524 may be a liquid crystal display panel or a plasma display panel. The memory block 1508 may be a block that temporarily stores commands that are input into the controller 1502 or control signals that are output from the controller 1502, or that stores necessary data. The memory block 1508 may include memory, such as RAM and ROM. At least one of the power supply circuit 1504 and the driver block 1506 may include at least one of the semiconductor devices 100, 100*a*, 200 through 200*f*, and 300 through 300*f* according to the some example embodiments of present inventive concepts, which are described with reference to FIGS. 1 through 22, and/or semiconductor devices modified or changed from the semiconductor devices 100, 100*a*, 200 through 200*f*, and 300 through 300*f*.

Figure 25:
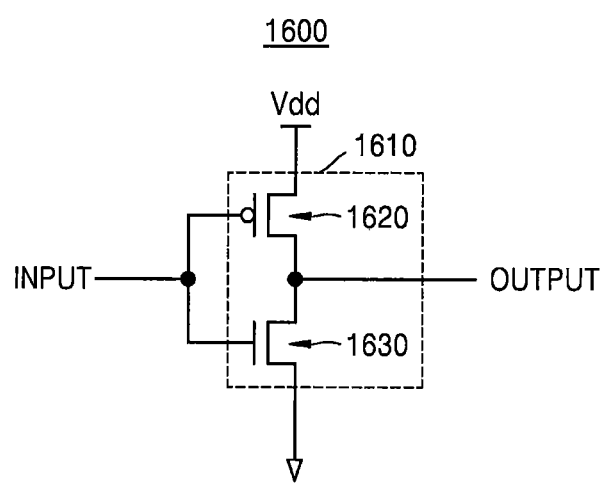
FIG. 25 is a circuit diagram of a complementary metal-oxide semiconductor (CMOS) inverter according to some example embodiments.

FIG. 25 is a circuit diagram of a complementary metal oxide semiconductor (CMOS) inverter 1600 according to some example embodiments.

Referring to FIG. 25, the CMOS inverter 1600 may include a CMOS transistor 1610. The CMOS transistor 1610 may include a PMOS transistor 1620 and an NMOS transistor 1630 connected between a power terminal Vdd and a ground terminal. The CMOS transistor 1610 may include at least one of the semiconductor devices 100, 100a, 200 through 200f, and 300 through 300f according to some example embodiments of present inventive concepts, which are described with reference to FIGS. 1 through 22, and/or semiconductor devices modified or changed from the semiconductor devices 100, 100a, 200 through 200f, and 300 through 300f.

Figure 26:
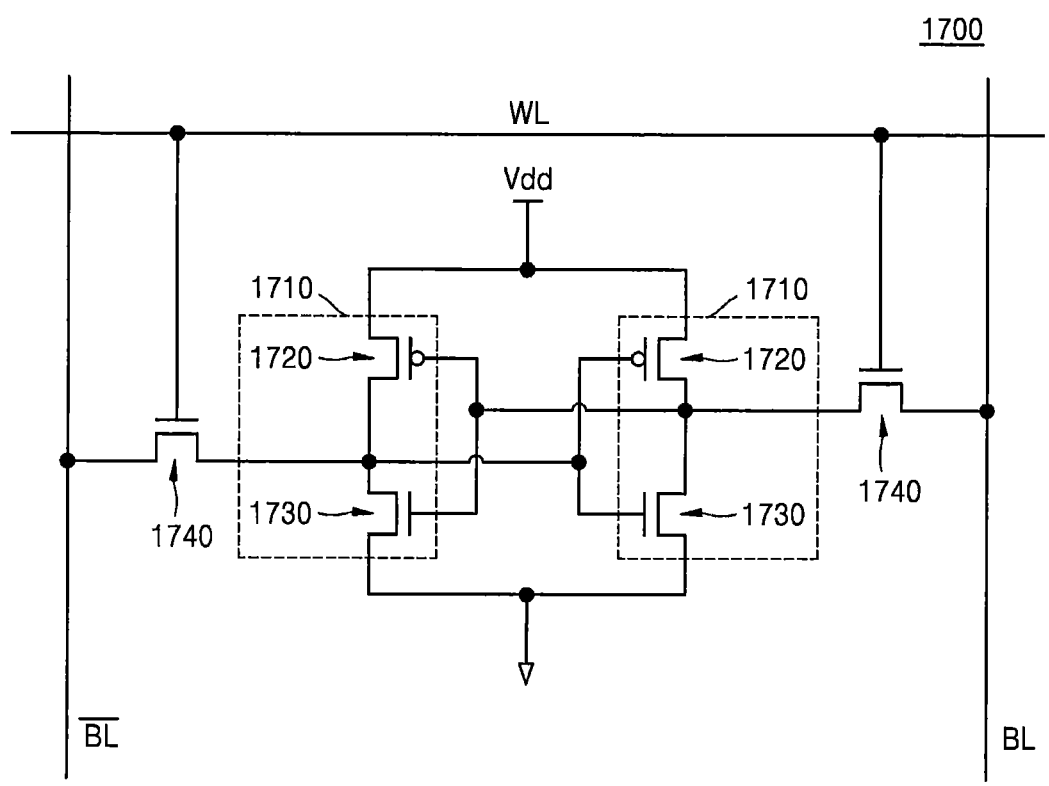
FIG. 26 is a circuit diagram of a complementary metal oxide semiconductor (CMOS) static random access memory (SRAM) device according to some example embodiments.

FIG. 26 is a circuit diagram of a CMOS SRAM device 1700 according to some example embodiments.

Referring to FIG. 26, the CMOS SRAM device 1700 may include a pair of driving transistors 1710. Each of the pair of driving transistors 1710 may include a PMOS transistor 1720 and an NMOS transistor 1730 connected between a power terminal Vdd and a ground terminal. The CMOS SRAM device 1700 may further include a pair of transmission transistors 1740. A source of the transmission transistor 1740 may be cross-connected to a common node of the PMOS transistor 1720 and the NMOS transistor 1730 forming the driving transistor 1710. The power terminal Vdd may be connected to a source of the PMOS transistor 1720 and the ground terminal may be connected to a source of the NMOS transistor 1730. A word line WL may be connected to a gate of the pair of transmission transistors 1740, and a bit line BL and a reversed bit line $\overline{B}$ L may be connected to drains of the pair of transmission transistors 1740, respectively.

At least one of the driving transistor 1710 and the transmission transistor 1740 of the CMOS SRAM device 1700 may include at least one of the semiconductor devices 100, 100a, 200 through 200f, and 300 through 300f according to some example embodiments of present inventive concepts, which are described with reference to FIGS. 1 through 22, and/or semiconductor devices modified or changed from the semiconductor devices 100, 100a, 200 through 200f, and 300 through 300f.

Figure 27:
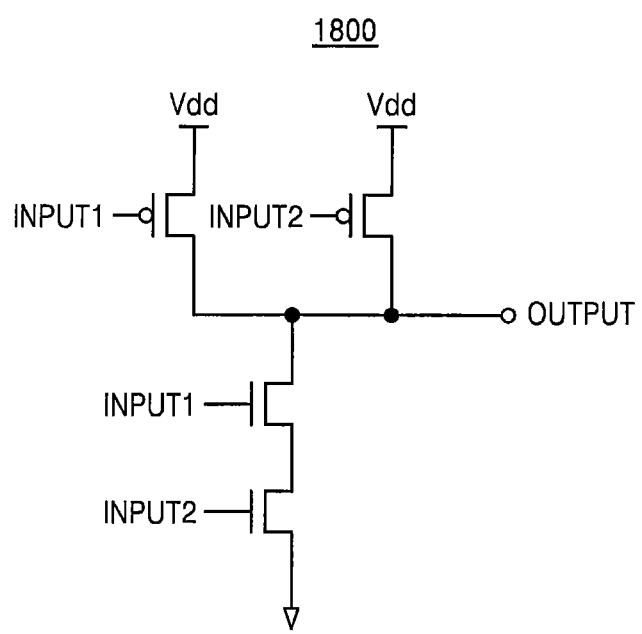
FIG. 27 is a circuit diagram of a CMOS NAND circuit according to some example embodiments.

FIG. 27 is a circuit diagram of a CMOS NAND circuit 1800 according to some example embodiments.

Referring to FIG. 27, the CMOS NAND circuit 1800 may include a pair of CMOS transistors to which different input signals are transmitted. The transistors may each have an INPUT 1 or an INPUT 2, and the CMOS NAND circuit 1800 may have an output OUTPUT. The CMOS NAND circuit 1800 may include at least one of the semiconductor devices 100, 100a, 200 through 200f, and 300 through 300f according to some example embodiments of present inventive concepts, which are described with reference to FIGS. 1 through 22, and/or semiconductor devices modified or changed from the semiconductor devices 100, 100a, 200 through 200f, and 300 through 300f.

Figure 28:
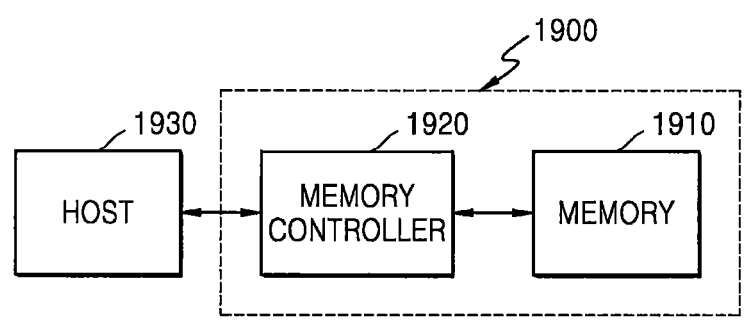
FIG. 28 is a block diagram of an electronic system according to some example embodiments.

FIG. 28 is a block diagram of an electronic system 1900 according to some example embodiments.

Referring to FIG. 28, the electronic system 1900 may include a memory 1910 and a memory controller 1920. The memory controller 1920 may control the memory 1910 such that data is read from the memory 1910 and/or written in the memory 1910 in response to a request of a host 1930. At least one of the memory 1910 and the memory controller 1920 may include at least one of the semiconductor devices 100, 100a, 200 through 200f, and 300 through 300f according to some example embodiments of present inventive concepts, which are described with reference to FIGS. 1 through 22, and/or semiconductor devices modified or changed from the semiconductor devices 100, 100a, 200 through 200f, and 300 through 300f.

Figure 29:
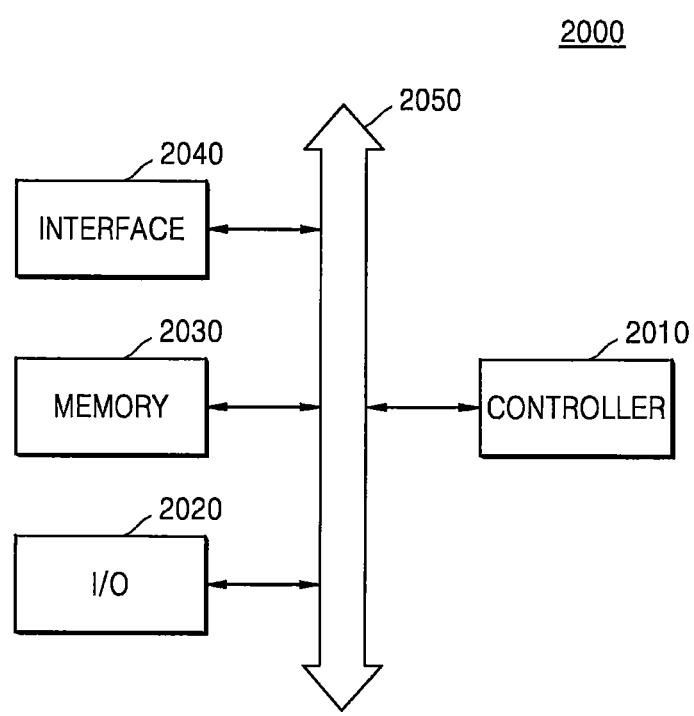
FIG. 29 is a block diagram of an electronic system according to some example embodiments.

FIG. 29 is a block diagram of an electronic system 2000 according to some example embodiments.

Referring to FIG. 29, the electronic system 2000 may include a controller 2010, an input/output device (I/O) 2020, a memory 2030, and an interface 2040, which may be connected to one another via a bus 2050.

The controller 2010 may include at least one of a microprocessor, a digital signal processor, and similar processing devices. The I/O device 2020 may include at least one of a keypad, a keyboard, and a display. The memory 2030 may be used to store commands executed by the controller 2010. For example, the memory 2030 may be used to store user data.

The electronic system 2000 may form a device which may transmit and/or receive information via a wireless communication device and/or in a wireless environment. In the electronic system 2000, the interface 2040 may be formed as a wireless interface to transmit/receive data via a wireless communication network. The interface 2040 may include an antenna and/or a wireless transceiver. In some embodiments, the electronic system 2000 may used in a third generation communication system using a communication interface protocol, such as code division multiple access (CDMA), global system for mobile communication (GSM), north American digital cellular (NADC), extended-time division multiple access (E-TDMA), and wide band code division multiple access (WCDMA). The electronic system 2000 may include at least one of the semiconductor devices 100, 100a, 200 through 200f, and 300 through 300f according to some example embodiments of present inventive concepts, which are described with reference to FIGS. 1 through 22, and/or semiconductor devices modified or changed from the semiconductor devices 100, 100a, 200 through 200f, and 300 through 300f.

FIGS. 30A through 30F are cross-sectional views for describing a method of manufacturing the semiconductor device 100 of FIG. 2A.

Figure 30A:
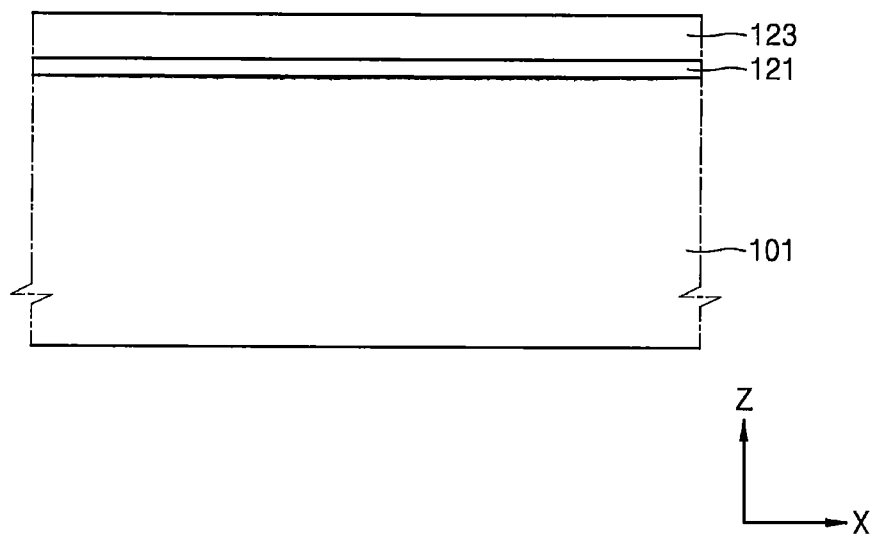
FIGS. 30A through 30F are cross-sectional views for describing a method of manufacturing the semiconductor device of FIG. 2A.

Referring to FIG. 30A, first, the interface layer 121 and the high-dielectric layer 123 are formed on the semiconductor substrate 101 on which the active area is defined by a device isolation layer (e.g., the device isolation layer 110 of FIG. 2B). Materials of the semiconductor substrate 101, the interface layer 121, and the high-dielectric layer 123 are described in FIGS. 1 through 2B. The interface layer 121 and the high-dielectric layer 123 may be formed by one or more deposition methods, such as ALD, CVD, and PVD.

Meanwhile, a layer structure and a thickness of the high-dielectric layer 123 may be adjusted by controlling a process condition when the high-dielectric layer 123 is formed, in order to appropriately adjust an amount of rare earth elements diffused from the RE supply layer 125. The layer structure and the thickness of the high-dielectric layer 123 may be adjusted by controlling a process temperature, a process time, a selection of appropriate source materials, etc. For example, by controlling the process condition, the layer structure of the high-dielectric layer 123 may be formed as a columnar grain boundary structure. In the case of the columnar grain boundary structure, the diffusion of the rare earth elements is relatively easy so that a relatively large amount of rare earth elements may be injected into an interface between the interface layer 121 and the high-dielectric layer 123.

Also, the diffusion of the rare earth elements may be controlled by a heat process on the RE supply layer 125 after the RE supply layer 125 is formed.

Figure 30B:
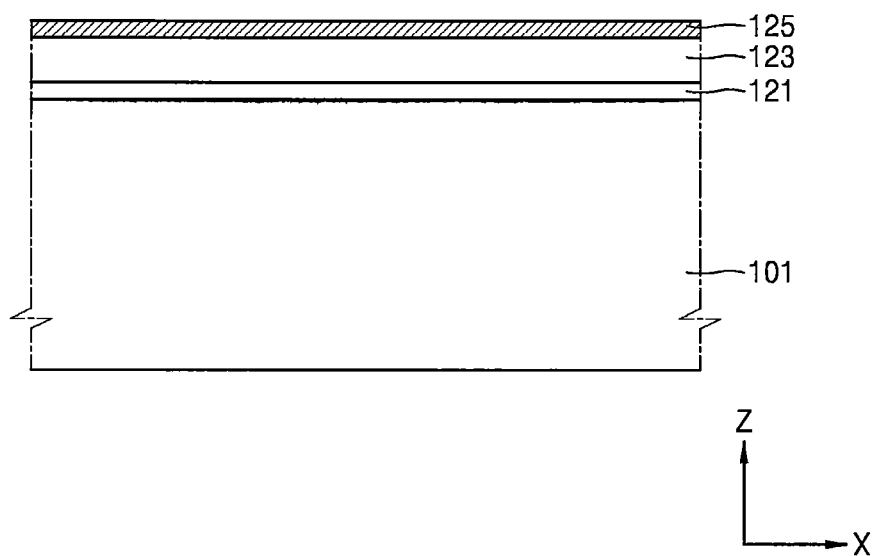

Referring to FIG. 30B, after the high-dielectric layer 123 is formed, the RE supply layer 125 is formed on the high-dielectric layer 123. The RE supply layer 125 may include various types of rare earth elements as described in FIGS. 1 through 2B. For example, according to the method of manufacturing the semiconductor device 100 according to some example embodiments, the RE supply layer 125 may include LaOx. The RE supply layer 125 functions as a source for injecting the rare earth elements into the interface between the interface layer 121 and the high-dielectric layer 123, and into a first metal layer (e.g., the first metal layer 127 of FIGS. 1-2B), and the injected rare earth elements adjust the threshold voltage of the semiconductor device 100 by changing a dielectric constant and/or a work function of the semiconductor device 100, as described above.

After the RE supply layer 125 is formed, a preliminary heat process may be performed. Via the heat process, the rare earth elements may be injected more in the interface between the interface layer 121 and the high-dielectric layer 123. In some embodiments, the preliminary heat process may optionally be omitted. In that case, the rare earth elements may be injected into the interface between the interface layer 121 and the high-dielectric layer 123 via diffusion, according to the layer structure and the thickness of the high-dielectric layer 123.

Figure 30C:
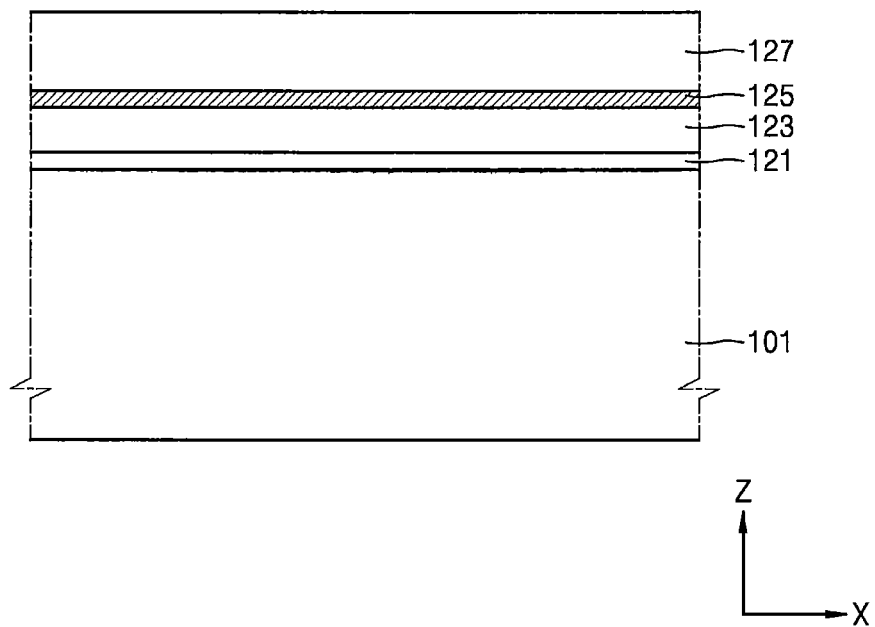

Referring to FIG. 30C, after the RE supply layer 125 is formed, the first metal layer 127 is formed on the RE supply layer 125. Materials of the first metal layer 127 are described with respect to FIGS. 1 through 2B. Meanwhile, in order to adjust an amount of the rare earth elements diffused into the first metal layer 127, for example, a layer structure, a metal composition, a thickness, a process temperature, and/or a process time of the first metal layer 127 may be adjusted, when the first metal layer 127 is formed. For example, by controlling the process condition, the layer structure of the first metal layer 127 may be formed as a columnar grain boundary structure. In the example of the columnar grain boundary structure, the diffusion of the rare earth elements is relatively easy so that a relatively large amount of rare earth elements may be injected into the first metal layer 127. Also, when the first metal layer 127 is formed, silicon may be included as a source material, so that the layer structure of the first metal layer 127 is similar to an amorphous structure. By forming the layer structure of the first metal layer 127 similar to (e.g., nearly) the amorphous structure, the amount of the rare earth elements injected into the first metal layer 127 may be reduced.

Figure 30D:
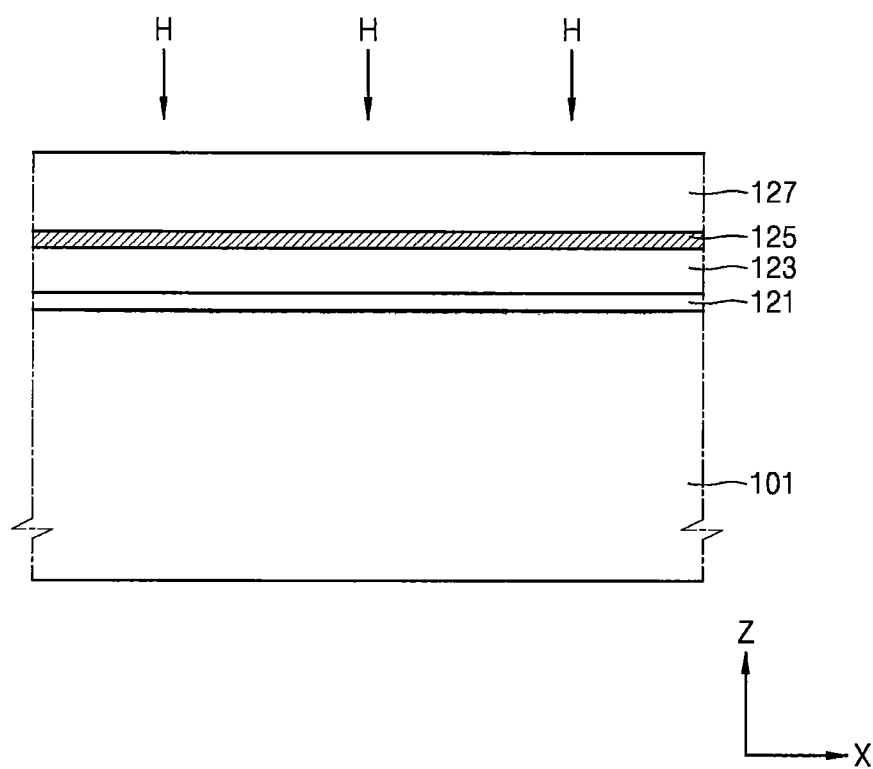

Referring to FIG. 30D, after the first metal layer 127 is formed, a heat process H may be performed on the first metal layer 127. By appropriately controlling a heat process temperature, the amount of the rare earth elements diffused into the first metal layer 127 may be adjusted. Meanwhile, when the layer structure of the first metal layer 127 is formed as a structure in which diffusion may easily occur, the heat process H may be omitted. When the heat process H is omitted, the rare earth elements may be injected into the first metal layer 127 via diffusion, while the first metal layer 127 is formed, and/or after the first metal layer 127 is formed, depending on the layer structure of the first metal layer 127.

Meanwhile, the heat process H may affect the diffusion of the rare earth elements into the high-dielectric layer 123. Accordingly, the heat process H may affect the amount of the rare earth elements in the interface between the interface layer 121 and the high-dielectric layer 123.

Figure 30E:
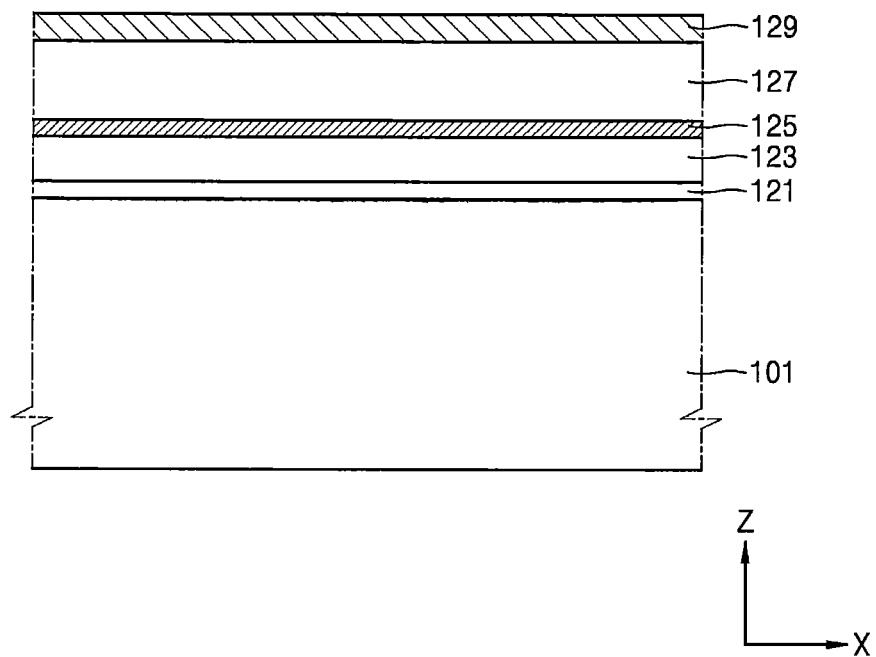

Referring to FIG. 30E, after the heat process H, or in the case where the heat process H is omitted, after the first metal layer 127 is formed, the second metal layer 129 is formed on the first metal layer 127. Materials of the second metal layer 129 are described with respect to FIGS. 1 through 2B. Meanwhile, it is also described above that the Al of the second metal layer 129 is injected into the first metal layer 127 to change the threshold voltage of the metal electrode, together with the injected rare earth elements.

Meanwhile, as described with reference to the graph of FIG. 5, the Al composition of the first metal layer 127 may be controlled by an Al process time when the second metal layer 129 is formed. For example, when the second metal layer 129 is formed by deposition, a time in which the Al source is supplied, that is, the Al pulse time, may be controlled to adjust the layer structure and the thickness of the second metal layer 129. The Al composition or the Al amount injected into the first metal layer 127 may be adjusted by the layer structure and the thickness of the second metal layer 129. Meanwhile, after the second metal layer 129 is formed, the Al composition injected into the first metal layer 127 may be adjusted by an additional heat process. However, the additional heat process may be omitted. In addition, according to the layer structure of the first metal layer 127, the Al diffusion amount may be changed.

However, as described above, the Al composition in the first metal layer 127 may not affect the rare earth element distribution in the interface between the interface layer 121 and the high-dielectric layer 123. Meanwhile, a barrier metal layer may be formed on the first metal layer 127 before the second metal layer 129 is formed, so that the rare earth elements are not diffused into the second metal layer 129.

Figure 30F:
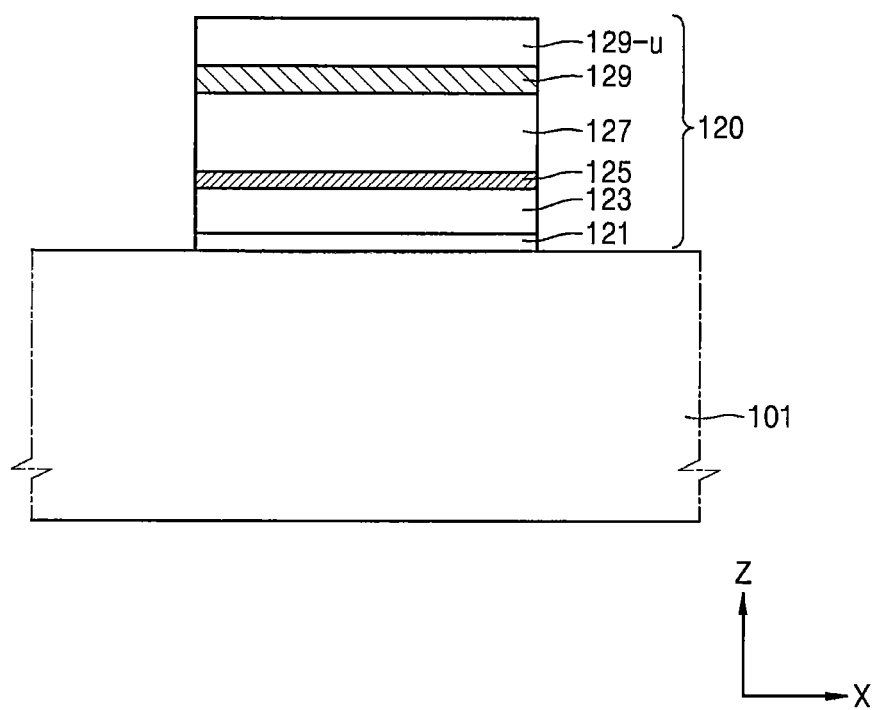

Referring to FIG. 30F, after the second metal layer 129 is formed, the gap-fill metal layer 129-u may be formed on the second metal layer 129. Materials of the gap-fill metal layer 129-u are described with respect to FIGS. 1 through 2B. After the second metal layer 129 is formed, a barrier metal layer may be formed before the gap-fill metal layer 129-u is formed. In some embodiments, only the barrier metal layer may be formed and the gap-fill metal layer 129-u may not be formed. After the gap-fill metal layer 129-u is formed, patterning may be performed. Via patterning, the gate structure 120 of the semiconductor device 100 of FIG. 2A may be formed.

After the gate structure 120 is formed, a sequential semiconductor process may be performed. The sequential semiconductor process may include various processes. For example, the sequential semiconductor process may include a deposition process, an etching process, an ion process, a washing process, etc. Here, the deposition process may include various processes for forming a material layer, such as CVD, sputtering, spin coating, etc. The etching process may be an etching process using a plasma and may be an etching process not using the plasma. The ion process may include ion injection, diffusion, annealing, etc. By performing the sequential semiconductor process, integrated circuits and wires for desired semiconductor devices may be formed.

Meanwhile, the sequential semiconductor process may include a packaging process mounting the semiconductor device on a printed circuit board (PCB) substrate and sealing the semiconductor device via a sealing member. Also, the sequential semiconductor process may include a test process in which the semiconductor device or the package is tested. The semiconductor device or the semiconductor package may be manufactured by performing these sequential semiconductor processes.

FIGS. 31A through 31F are cross-sectional views for describing a method of manufacturing the semiconductor device 200 of FIG. 8A.

Figure 31A:
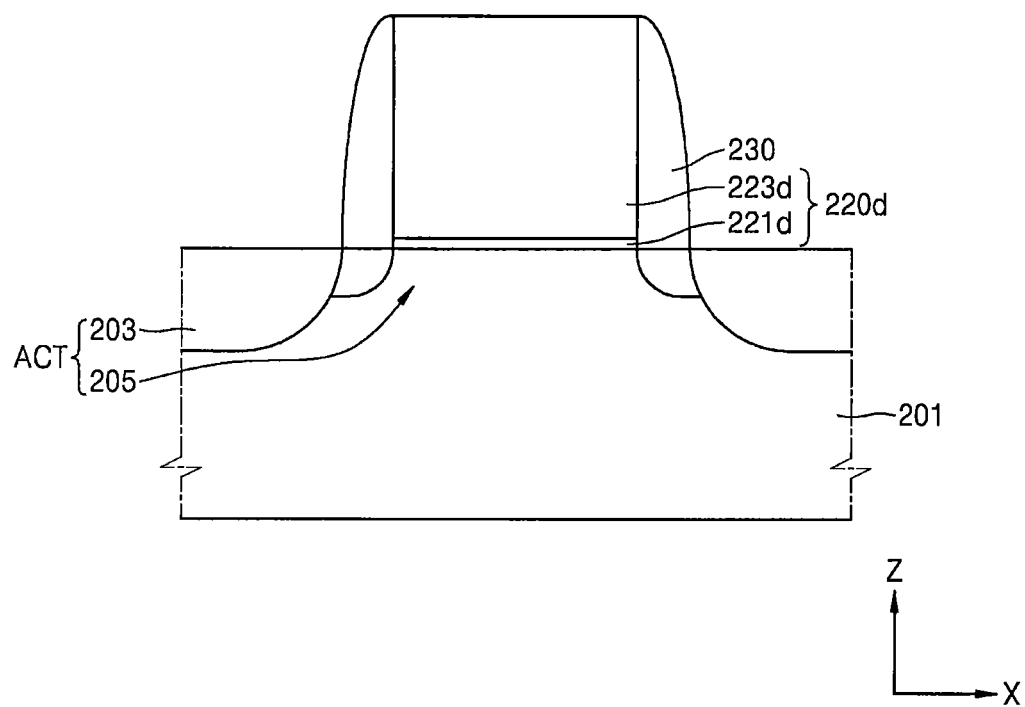
FIGS. 31A through 31F are cross-sectional views for describing a method of manufacturing the semiconductor device of FIG. 8A.

Referring to FIG. 31A, a dummy gate structure 220d and the spacer 230 are formed on the semiconductor substrate 201. In more detail, a sacrificial insulating layer and a sacrificial gate layer are formed on the semiconductor substrate 201, and the sacrificial insulating layer and the sacrificial gate layer are patterned by a photolithography process to form a dummy gate structure 220d. The sacrificial insulating layer may be formed of an amorphous carbon layer (ACL) or C—SOH containing a high carbon content, and the sacrificial gate layer may be formed of poly silicon. However, materials of the sacrificial insulating layer and the sacrificial gate layer are not limited thereto.

The dummy gate structure 220d may be formed to extend in a second direction (a direction outwards from or into the x-z plane). The dummy gate structure 220d may include a dummy gate insulating layer 221d and a dummy gate electrode 223d. The dummy gate insulating layer 221d may, for example, function as an etch stop layer when the dummy gate electrode 223d is removed.

After the dummy gate structure 220d is formed, the spacer 230 is formed at both side walls of the dummy gate structure 220d. The spacer 230 may be formed by forming an insulating layer uniformly covering a product on the semiconductor substrate 201, removing the insulating layer from an upper surface of the dummy gate electrode 223d and an upper surface of the semiconductor substrate 201 by dry etching and/or etchback, and by retaining the insulating layer at both side walls of the dummy gate electrode 223d. The spacer 230 may include an insulating material, such as a nitride layer or an oxynitride layer. For example, the spacer 230 may be formed of a silicon nitride layer or a silicon oxynitride layer.

After the spacer 230 is formed, an ion injection process may be performed by using the dummy gate structure 220d and the spacer 230 as masks, in order to form an impurity area on an upper portion of the semiconductor substrate 201, for example, the source/drain area 203. Also, before the spacer 230 is formed, an ion injection process may be performed to form an LDD area (e.g., the low concentration doped area 203l of FIG. 8A).

Figure 31B:
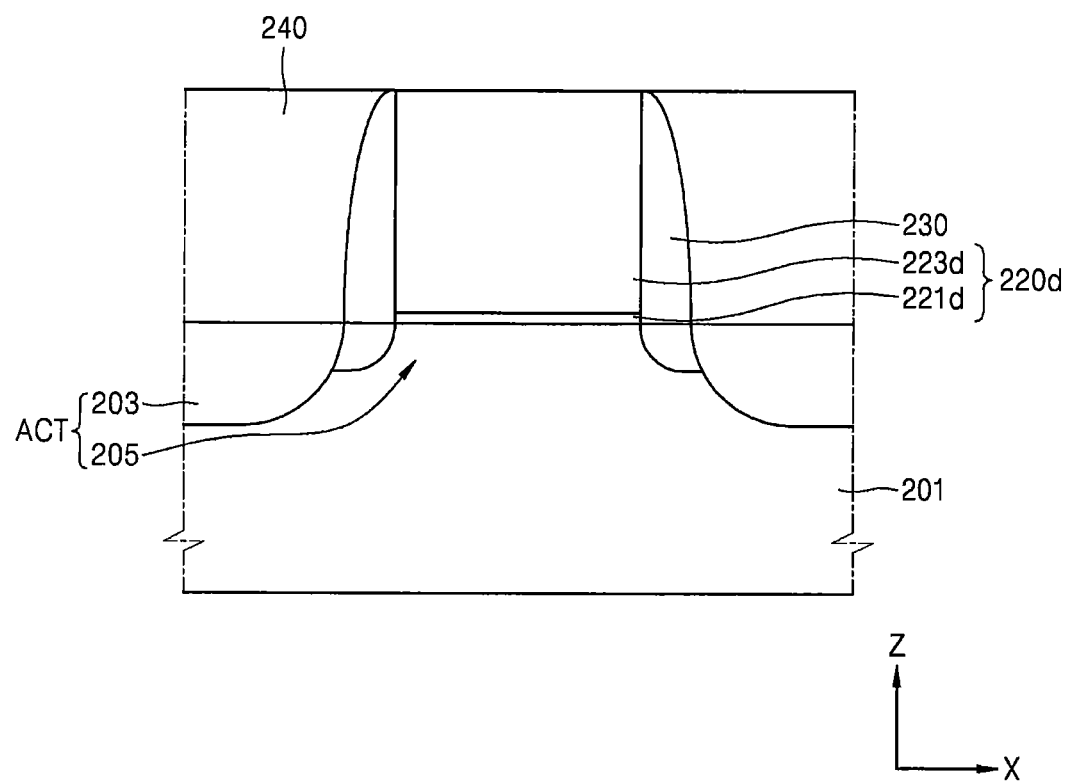

Referring to FIG. 31B, an insulating layer covering a product on the semiconductor substrate 201 is formed, and the insulating layer is planarized to form the interlayer insulating layer 240. The planarization of the insulating layer may be performed by a CMP process. In order to planarize the insulating layer, an upper surface of the dummy gate structure 220d may be exposed. The interlayer insulating layer 240 may include at least one of a silicon oxide layer, a silicon nitride layer, a silicon oxynitride layer, and a combination thereof, and may be formed of a material having a different etch selectivity from the spacer 230.

Figure 31C:
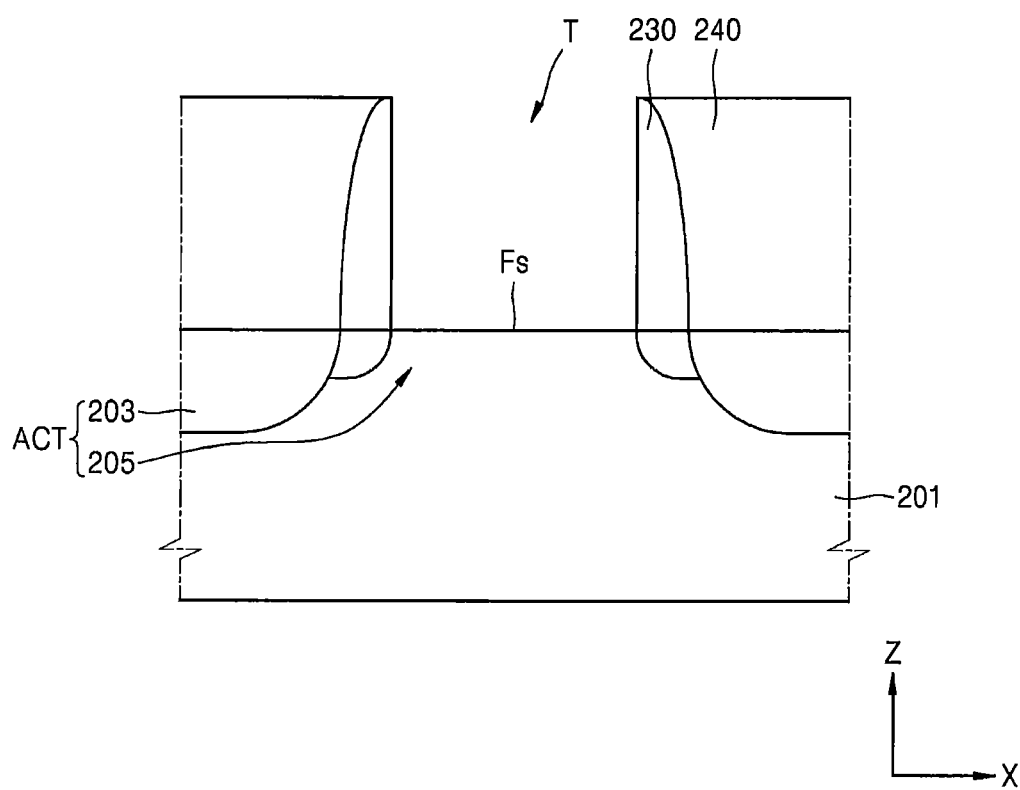

Referring to FIG. 31C, after the interlayer insulating layer 240 is formed, the dummy gate structure 220d is removed. The upper surface Fs of the semiconductor substrate 201 may be exposed via a trench T formed by the removal of the dummy gate structure 220d. The spacer 230 and the interlayer insulating layer 240 may have an etch selectivity with respect to the dummy gate structure 220d. Accordingly, the dummy gate structure 220d may be easily removed by, for example, wet etching. Also, the removal of the dummy gate structure 220d may be sequentially performed such that the dummy gate electrode 223d is removed and then the dummy gate insulating layer 221d is removed.

Figure 31D:
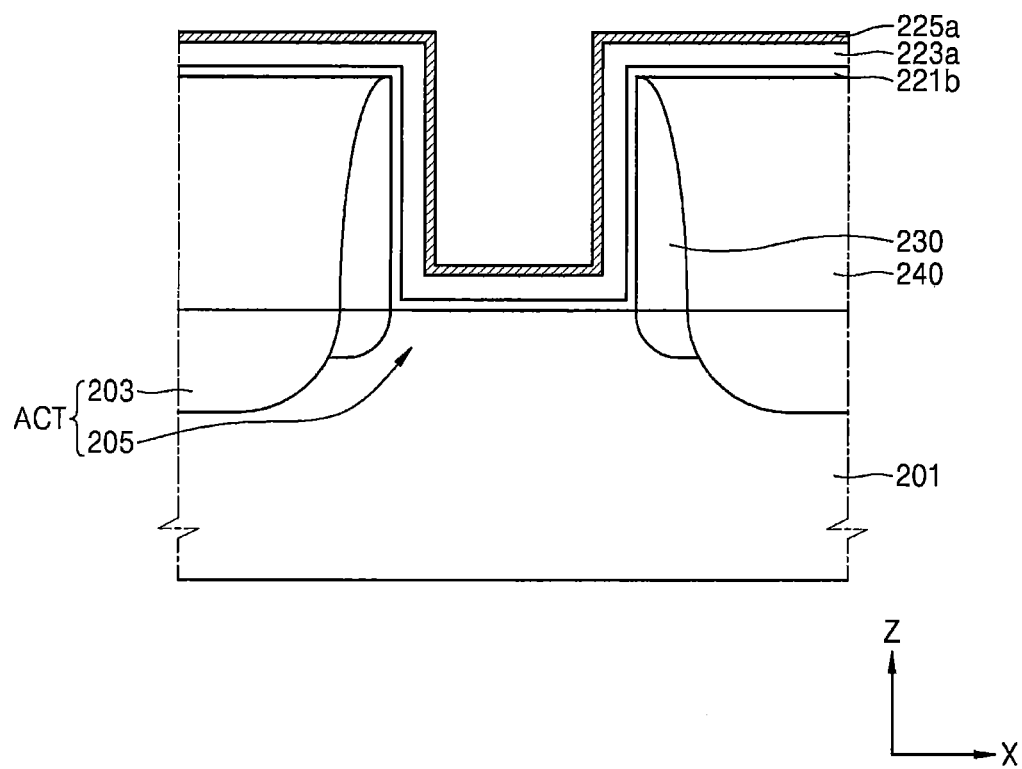

Referring to FIG. 31D, an interface layer 221b, a high-dielectric layer 223a, and an RE supply layer 225a are sequentially formed on a product/structure of the semiconductor substrate 201, conformally. Materials and formation methods of the interface layer 221b, the high-dielectric layer 223a, and the RE supply layer 225a are the same as described with reference to FIGS. 30A and 30B.

Figure 31E:
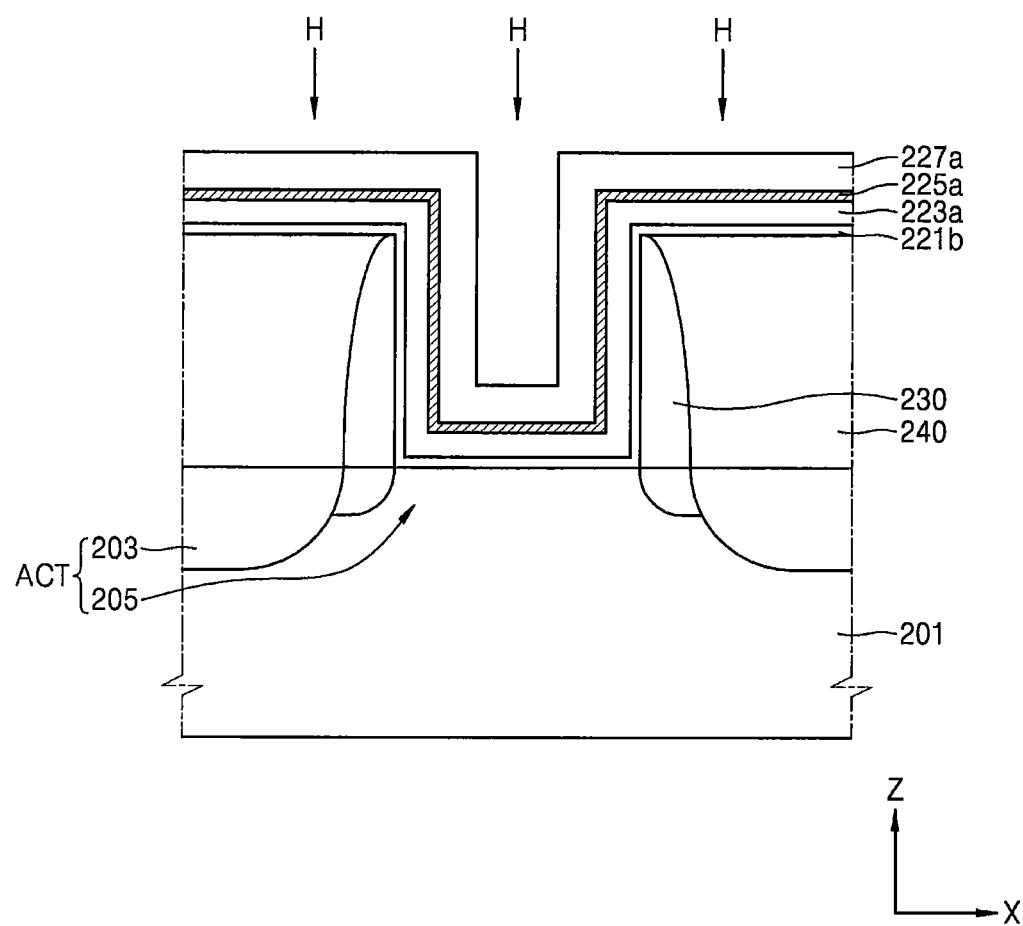

Referring to FIG. 31E, after the RE supply layer 225a is formed, the first metal layer 227a is formed, and a heat process H is performed on the first metal layer 227a. Materials and formation methods of the first metal layer 227a are the same as described with reference to the first metal layer 127 of FIG. 30C. Also, objectives of the heat process H are the same as described with reference to FIG. 30D. According to some example embodiments, the heat process H may be omitted.

Figure 31F:
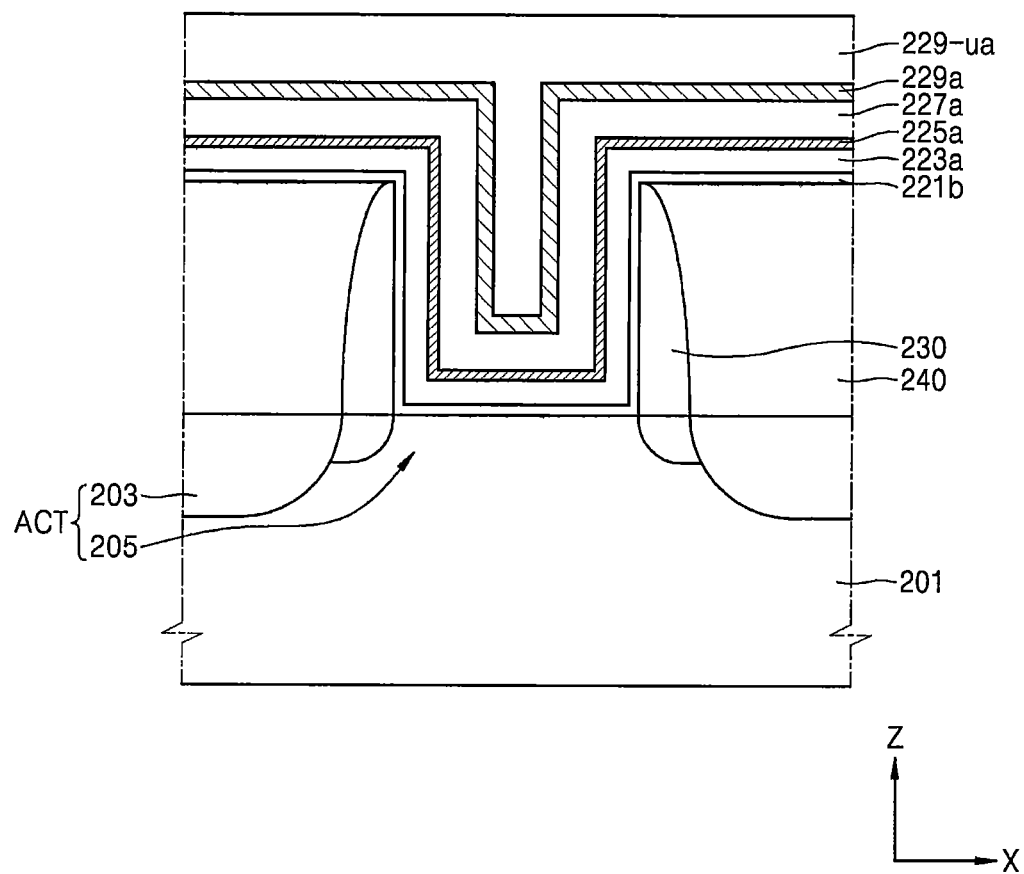

Referring to FIG. 31F, after the heat process H, or when the heat process H is omitted, after the first metal layer 227a is formed, the second metal layer 229a and the gap-fill metal layer 229-ua are sequentially formed. Materials and formation methods of the second metal layer 229a and the gap-fill metal layer 229-ua are the same as those described with reference to FIGS. 30E and 30F.

After the gap-fill metal layer 229-ua is formed, a planarization process is performed. The planarization process may be performed by, for example, a CMP process. The planarization process may be performed so as to expose an upper surface of the interlayer insulating layer 240. A gate structure (e.g., the gate structure 220 of FIG. 8A) may be manufactured by performing the planarization process.

After the gate structure 220 is formed, a sequential semiconductor process may be performed. The sequential semiconductor process is the same as described with reference to FIG. 30F.

FIGS. 32A through 39C are perspective views and cross-sectional views for describing a method of manufacturing the semiconductor device 300a of FIG. 17, wherein FIGS. 32A, 33A, 34A, 35A, 36A, 37A, 38A, and 39A are perspective views corresponding to FIG. 15, FIGS. 32B, 33B, 34B, 35B, 36B, 37B, 38B, and 39B are cross-sectional views corresponding to FIG. 16A, and FIGS. 32C, 33C, 34C, 35C, 36C, 37C, 38C, and 39C are cross-sectional views corresponding to FIG. 16B.

Figure 32A:
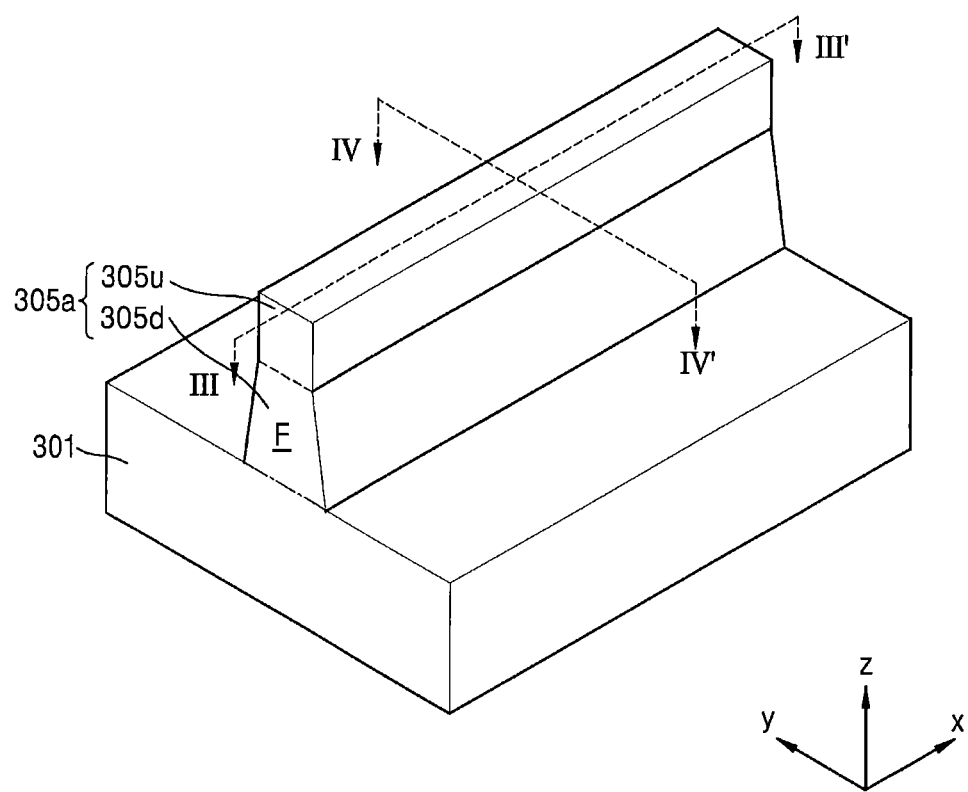
FIGS. 32A through 39C are perspective views and cross-sectional views for describing a method of manufacturing the semiconductor device of FIG. 15.
Figure 32B:
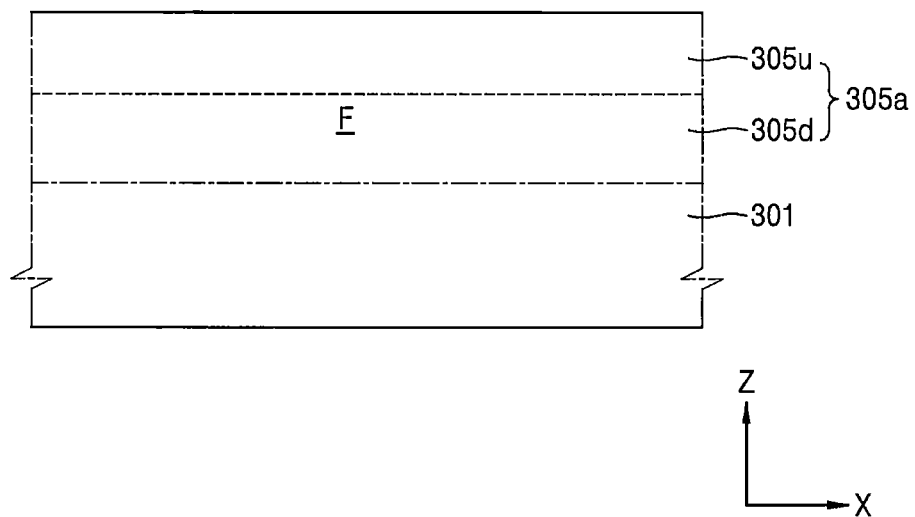
Figure 32C:
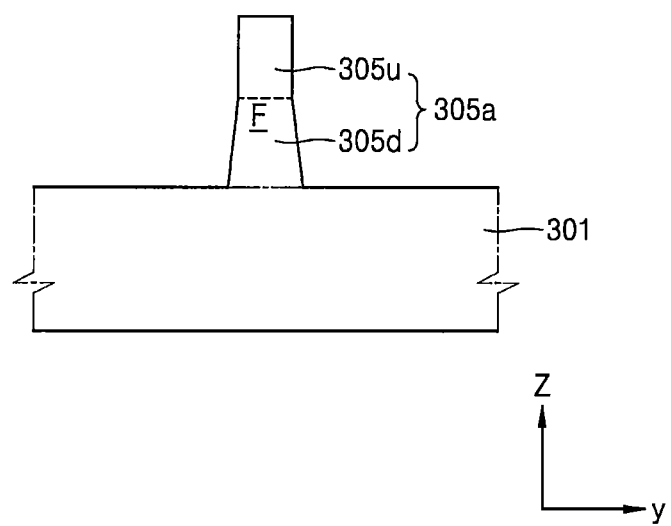

Referring to FIGS. 32A through 32C, a fin 305a protruding from the semiconductor substrate 301 is formed by etching an upper portion of the semiconductor substrate 301. The fin 305a may be formed on the semiconductor substrate 301 to extend in the first direction (the direction x). As illustrated in FIGS. 32A through 32C, the fin 305a may include a bottom fin portion 305d and an upper fin portion 305u.

Structures and materials of the semiconductor substrate 301 and the fin 305a are the same as those described with respect to the semiconductor device 300 of FIGS. 15 through 16B.

Figure 33A:
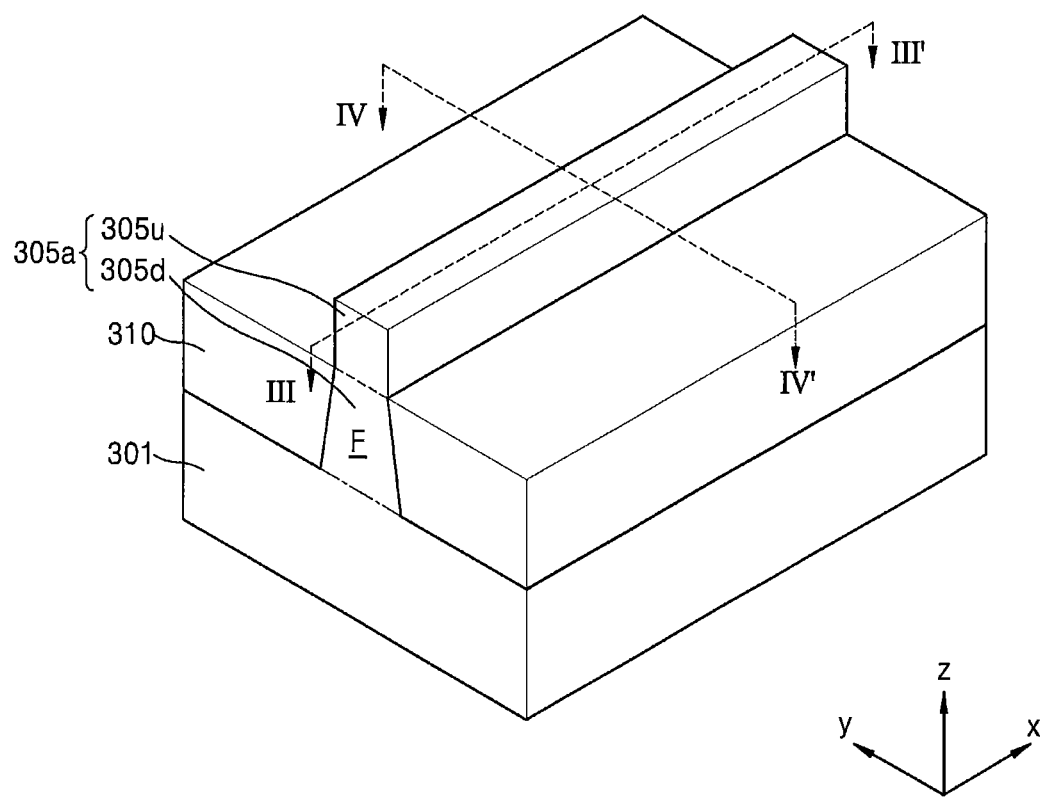
Figure 33B:
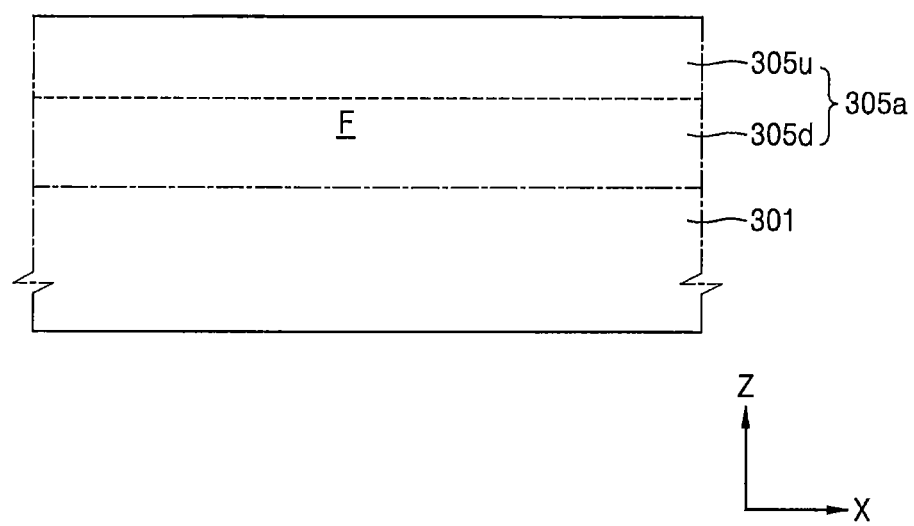
Figure 33C:
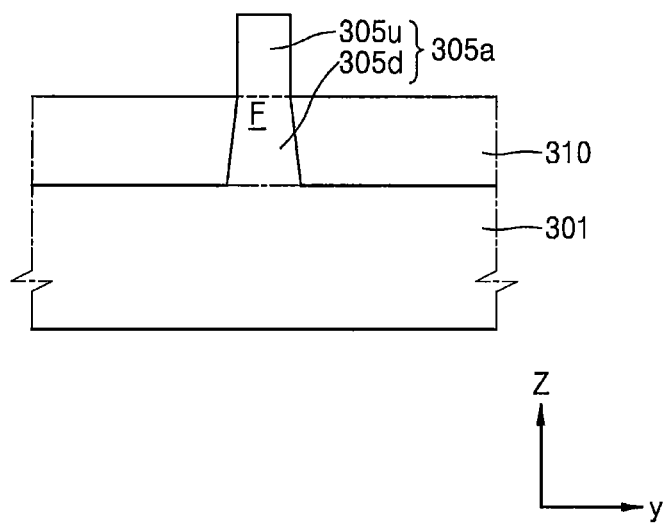

Referring to FIGS. 33A through 33C, after the fin 305a is formed, the device isolation layer 310 covering bottom portions of both side surfaces of the fin 305a is formed. After forming the device isolation layer 310, an upper portion of the fin 305a (i.e., the upper fin portion 305u) may protrude from the device isolation layer 310.

An insulating layer covering a product/structure of the semiconductor substrate 301 may be formed, and then planarized. Then, an upper portion of the device isolation layer 310 may be removed to expose the upper portion of the fin 305a. Materials, etc. of the device isolation layer 310 are the same as those described with respect to the semiconductor device 300 with reference to FIGS. 15 through 16B.

Figure 34A:
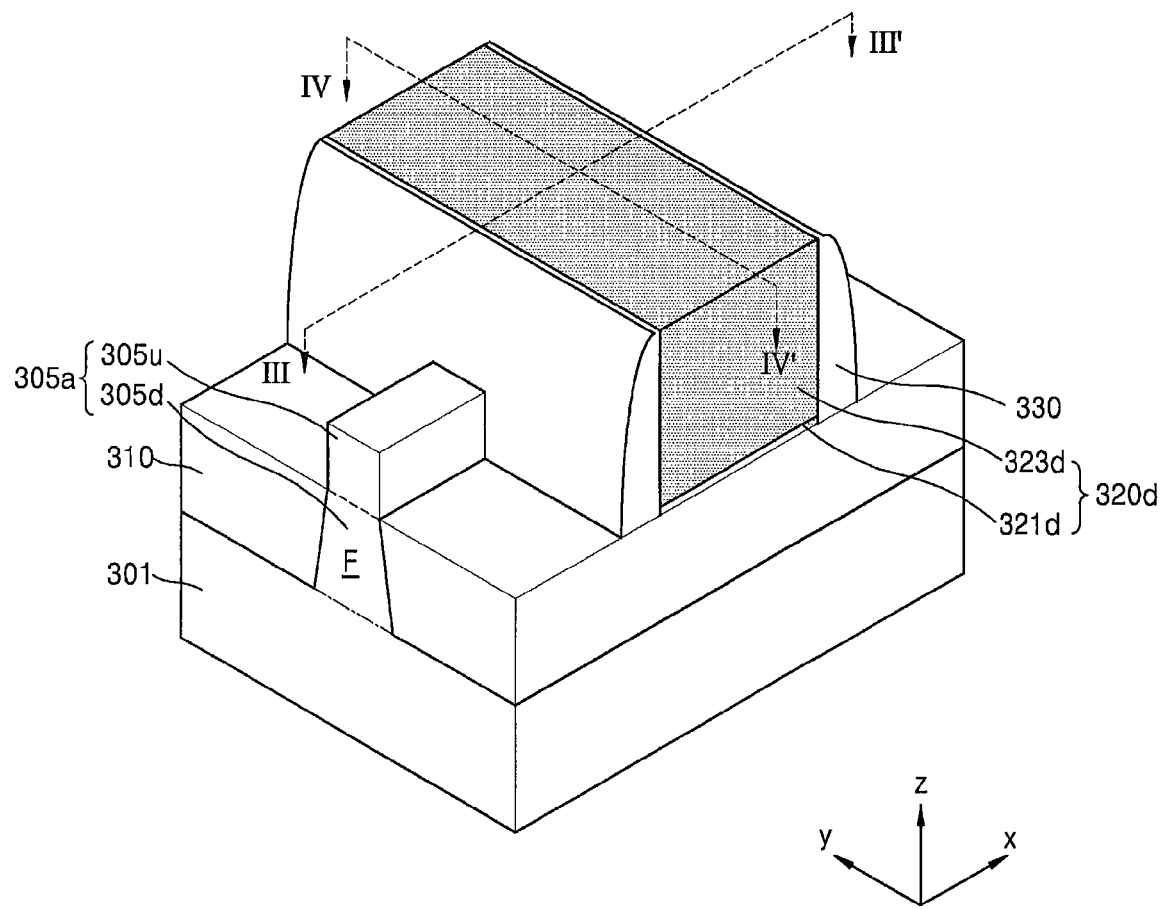
Figure 34B:
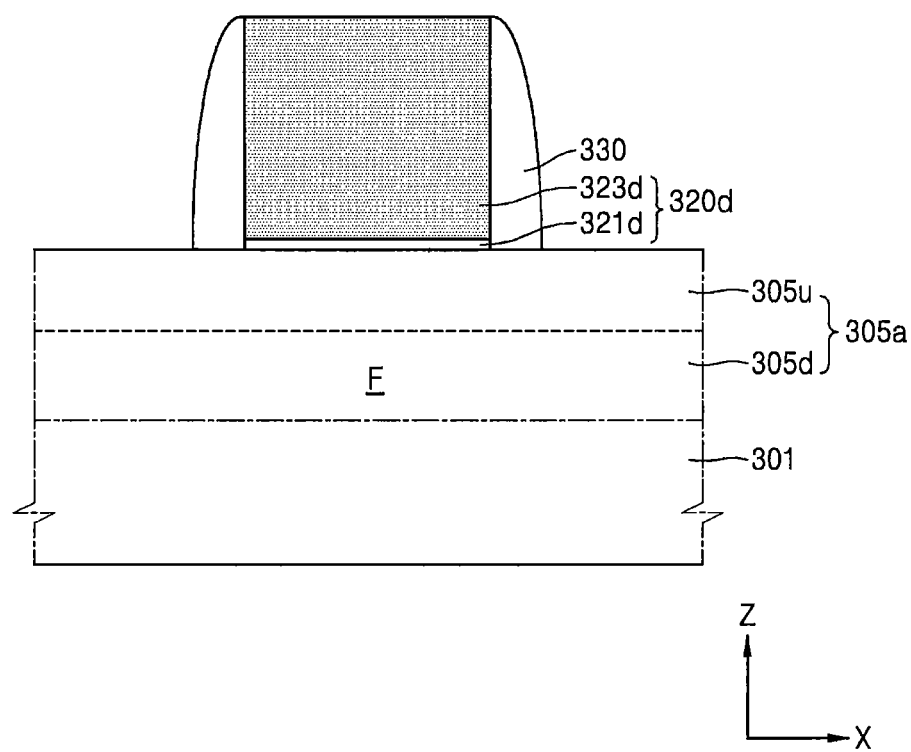
Figure 34C:
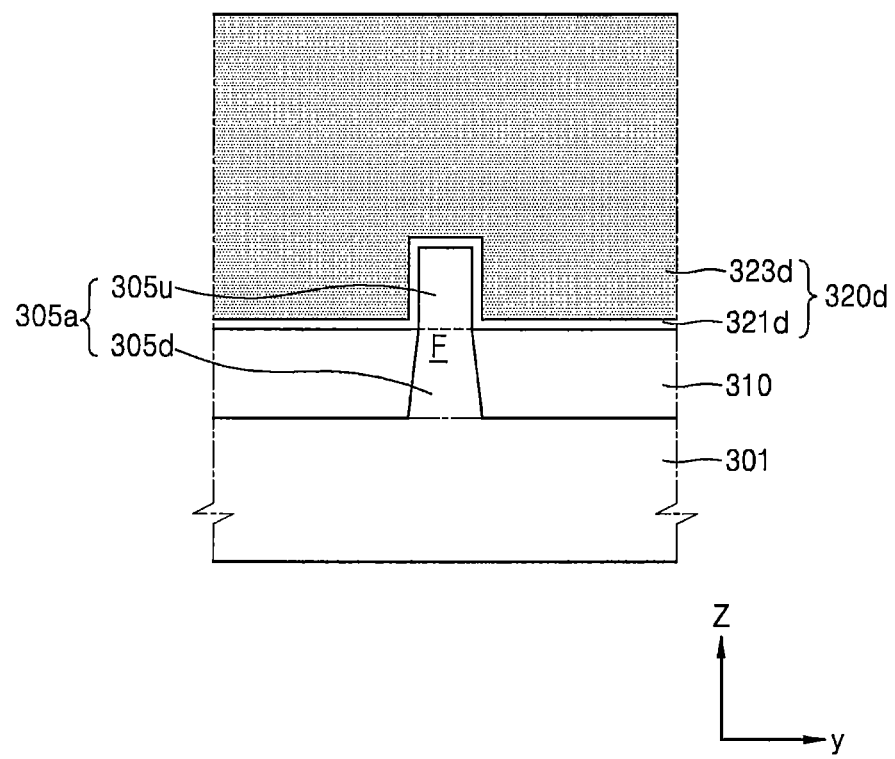

Referring to FIGS. 34A through 34C, after the device isolation layer 310 is formed, the dummy gate structure 320d including the dummy gate insulting layer 321d and the dummy gate electrode 323d is formed, and the spacer 330 is formed at both side surfaces of the dummy gate structure 320d. The dummy gate structure 320d may be formed to extend, for example, in the second direction (the direction y). Processes of forming the dummy gate structure 320d and the spacer 330 are the same as those described with reference to FIG. 31A. However, because the fin 305a is formed on the semiconductor substrate 301, and the device isolation layer 310 surrounding the lower portions of the both side surfaces of the bottom fin portion 305d of the fin 305a is formed, the dummy gate structure 320d and the spacer 330 may be formed on the device isolation layer 310 to surround an upper surface and side surfaces of the upper fin portion 305u of the fin 305a.

Figure 35A:
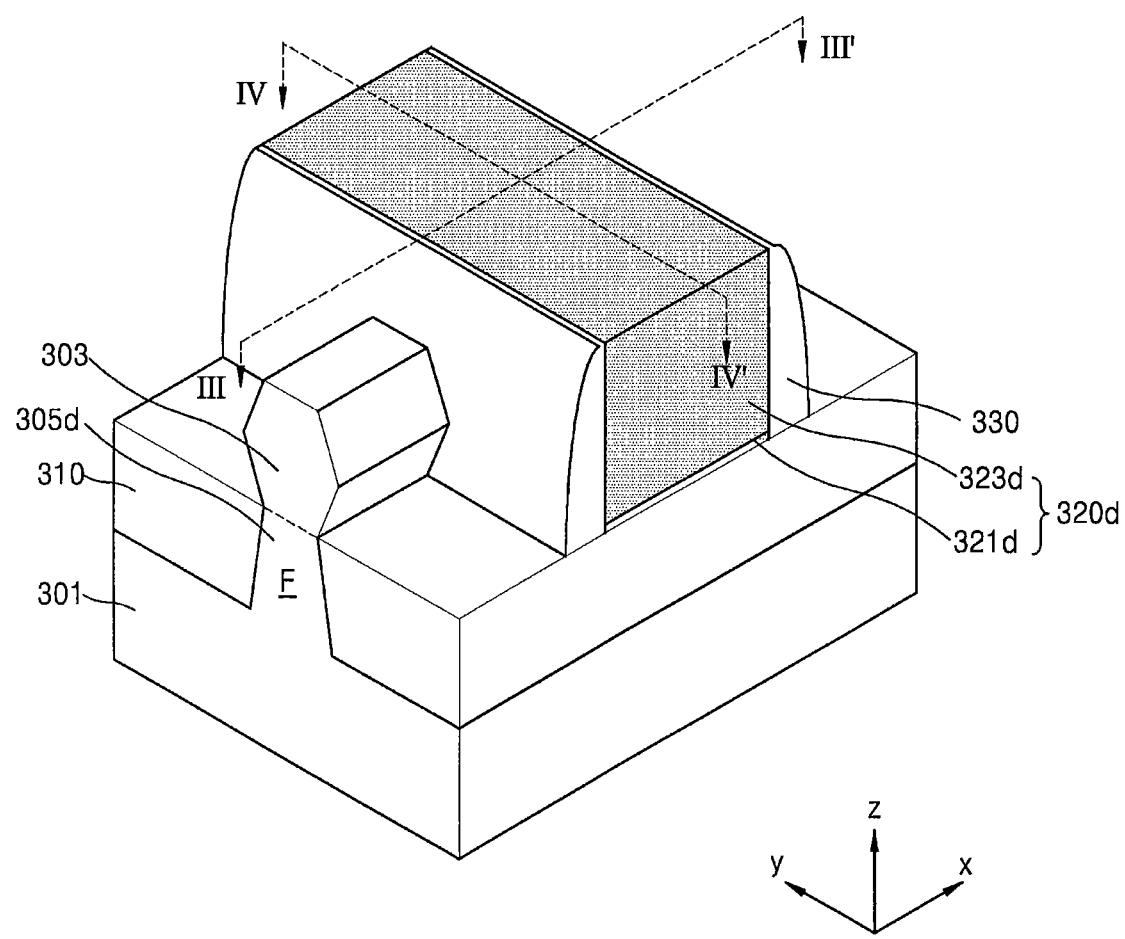
Figure 35B:
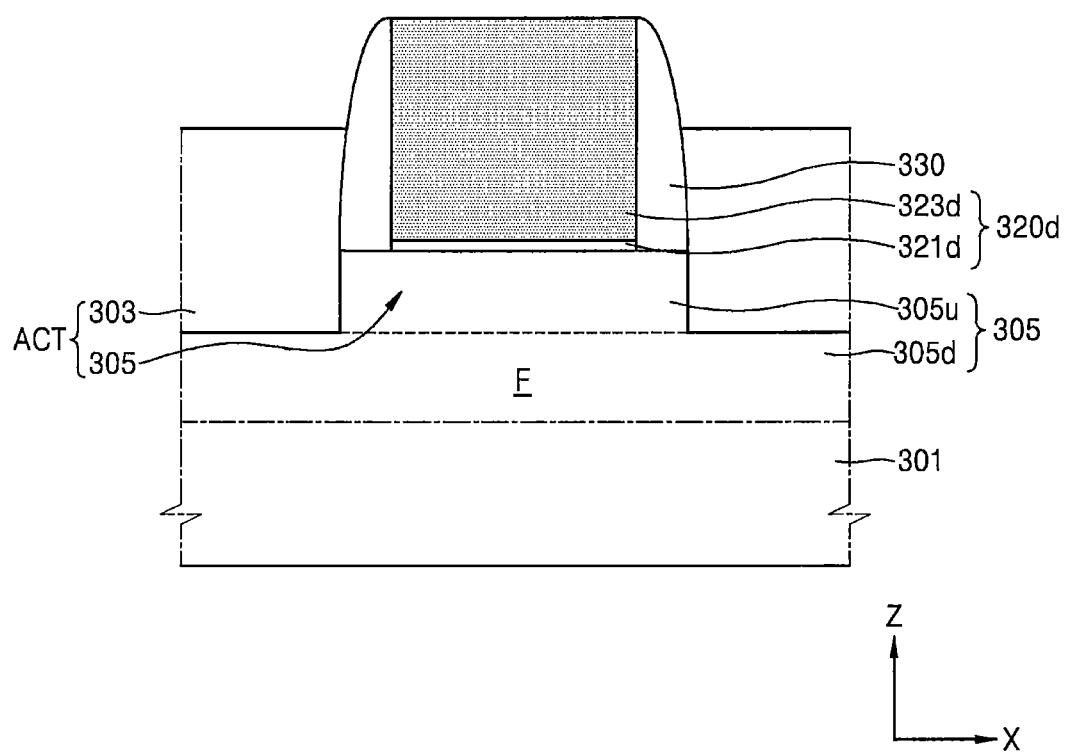
Figure 35C:
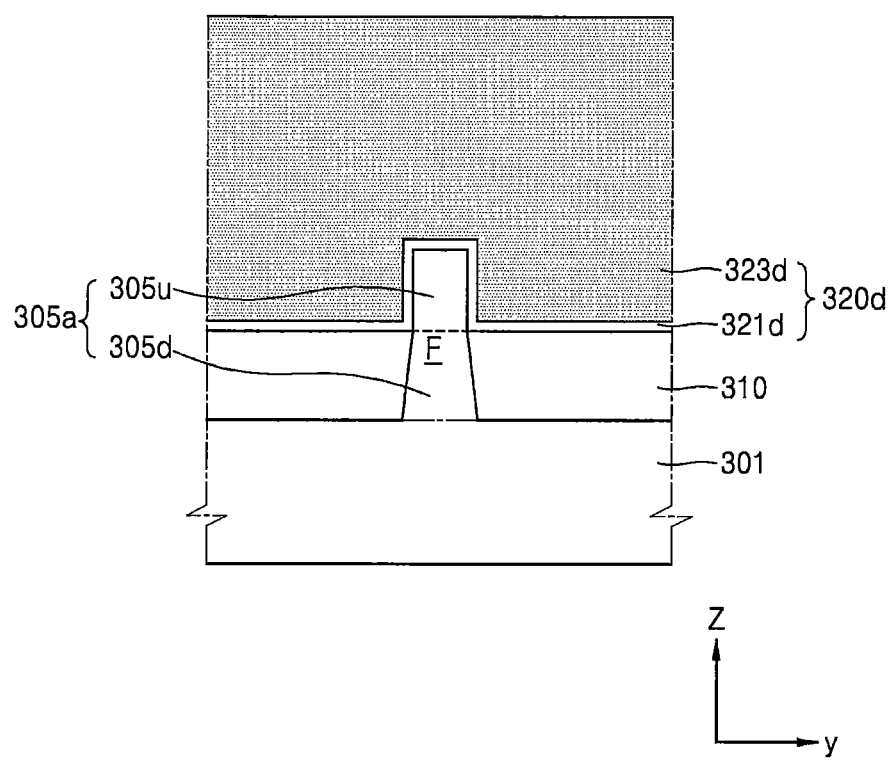

Referring to FIGS. 35A through 35C, the source/drain area 303 is formed by removing the upper fin portion 305u protruding from the device isolation layer 310 at the both side surfaces of the dummy gate structure 320d. In more detail, the source/drain area 303 may be formed by removing the upper fin portion 305u protruding from the device isolation layer 310 and growing an epitaxial layer on the bottom fin portion 305d. For example, the source/drain area 303 may include at least one of SiGe, Ge, Si, and SiC, which are epitaxially grown on the bottom fin portion 305d. Meanwhile, simultaneously with the epitaxial growing process, or after the epitaxial growing process, the source/drain area 303 may be doped with impurities.

As illustrated in FIG. 35B, an upper surface of the source/drain area 303 may be higher than the upper surface of the upper fin portion 305u which is below the dummy gate structure 320d. Also, the source/drain area 303 may cover a portion of a lower portion of the spacer 330.

Alternatively, in some embodiments, the upper fin portion 305u may not be removed, and the source/drain area 303 may be formed based on (e.g., on/in) the upper fin portion 305u. In this case, the source/drain area 303 may retain the initial shape of the upper fin portion 305u, or may have a different shape via the epitaxial growing process, from the initial shape of the upper fin portion 305u.

Figure 36A:
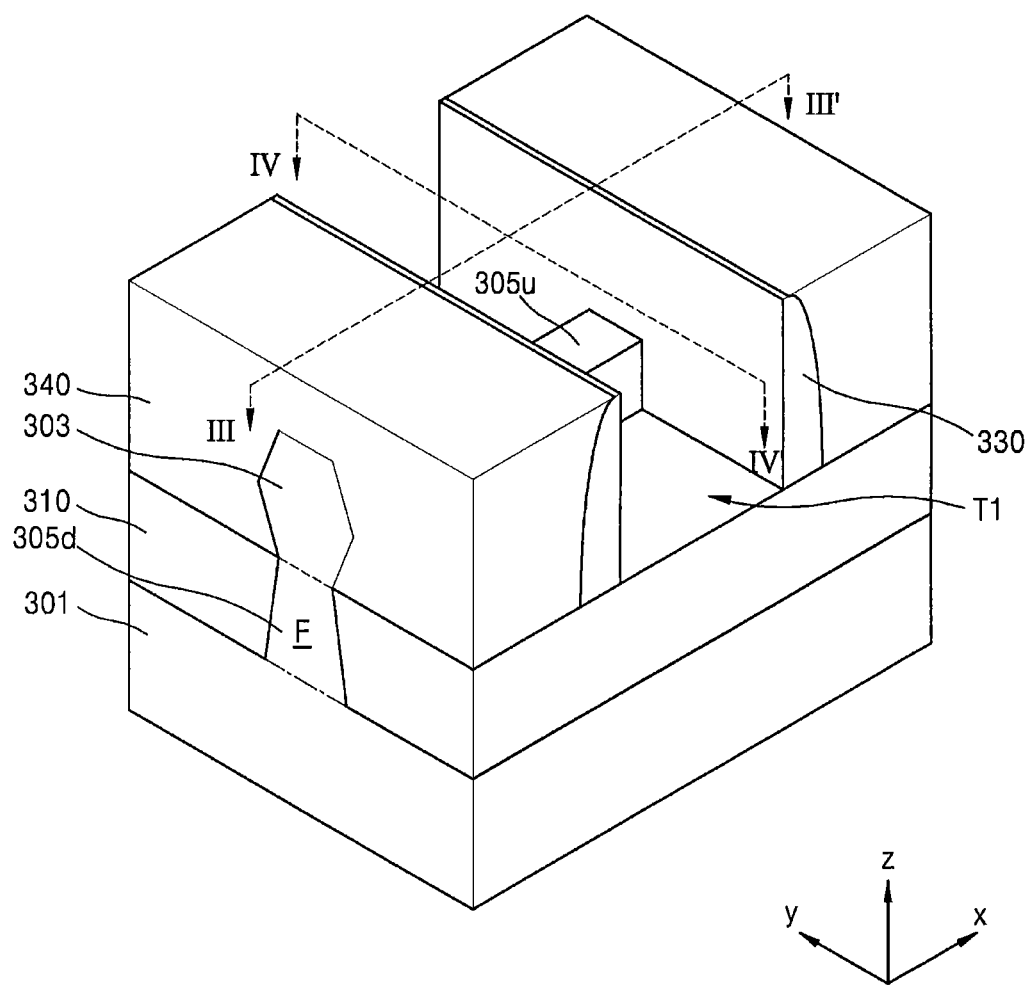
Figure 36B:
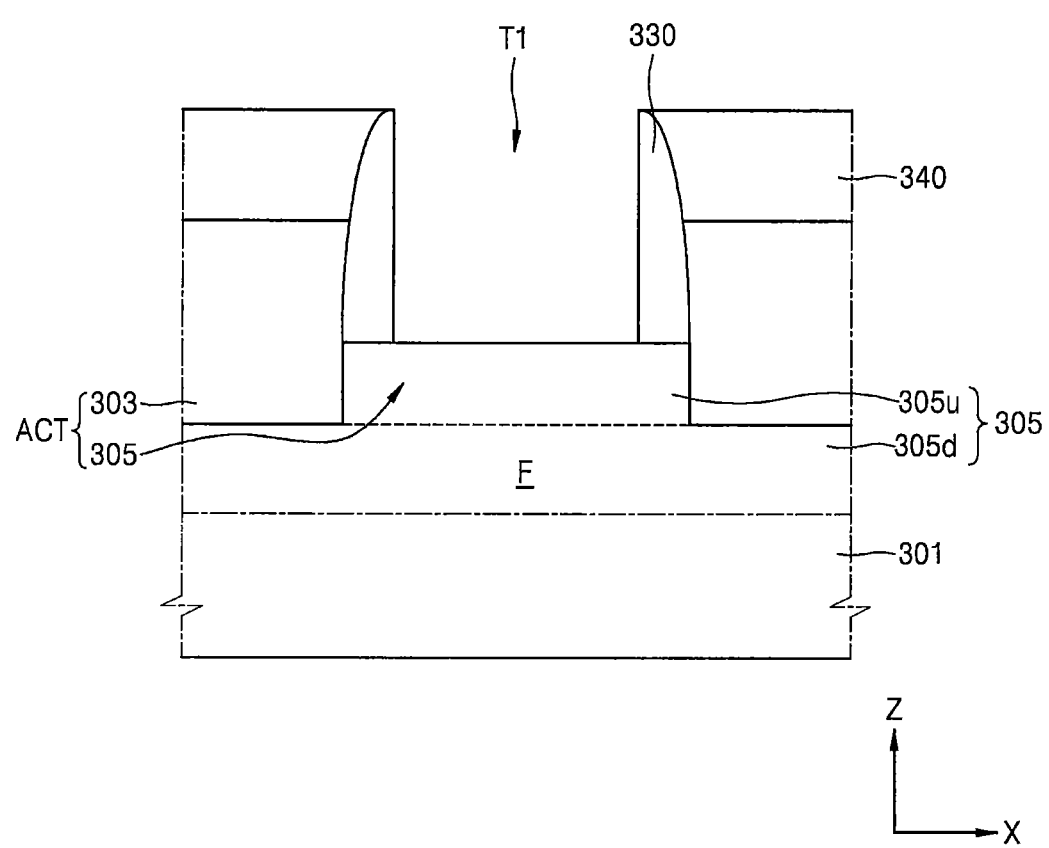
Figure 36C:
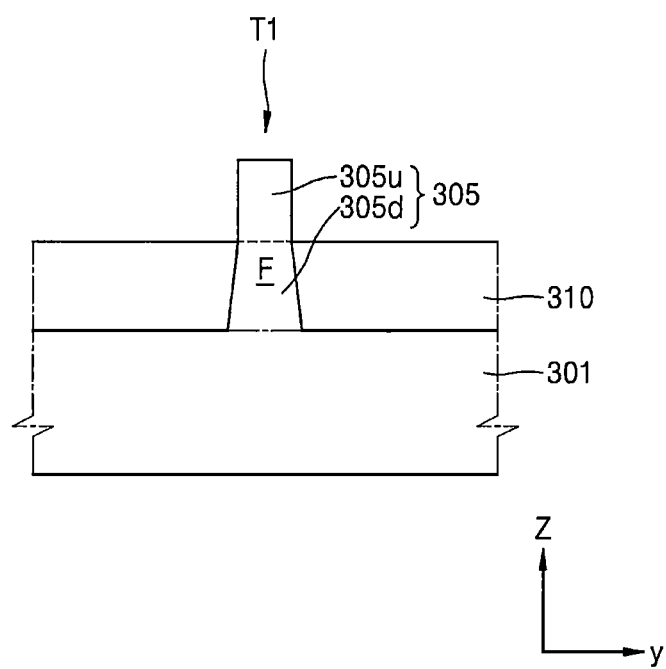

Referring to FIGS. 36A through 36C, after the source/drain area 303 is formed, the insulating layer covering the product/structure of the semiconductor substrate 301 is formed and planarized in order to form the interlayer insulating layer 340. Materials of the interlayer insulating layer 340 are the same as those described with respect to the semiconductor device 300 with reference to FIGS. 15 through 16B.

After the interlayer insulating layer 340 is formed, the dummy gate structure 320d is removed. The removal of the dummy gate structure 320d is the same as described with reference to FIG. 31C. As illustrated in FIG. 36C, the trench T1 formed by the removal of the dummy gate structure 320d may expose the upper surface and the side surfaces of the upper fin portion 305u.

In addition, although not illustrated in FIG. 36C, according to the cross-sectional plane taken along line IV-IV', after the dummy gate structure 320d is removed, the spacer 330 may be seen on the upper surface and the side surfaces of the upper fin portion 305u.

Figure 37A:
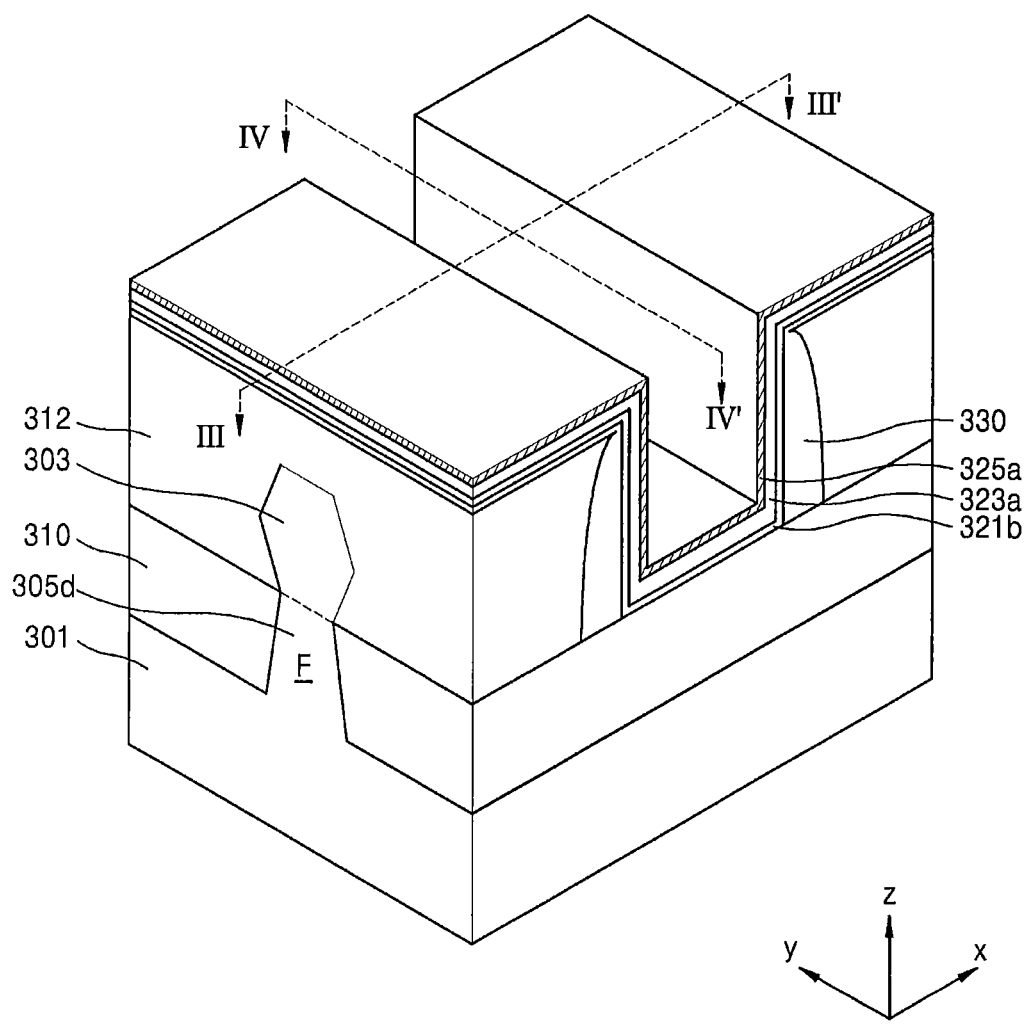
Figure 37B:
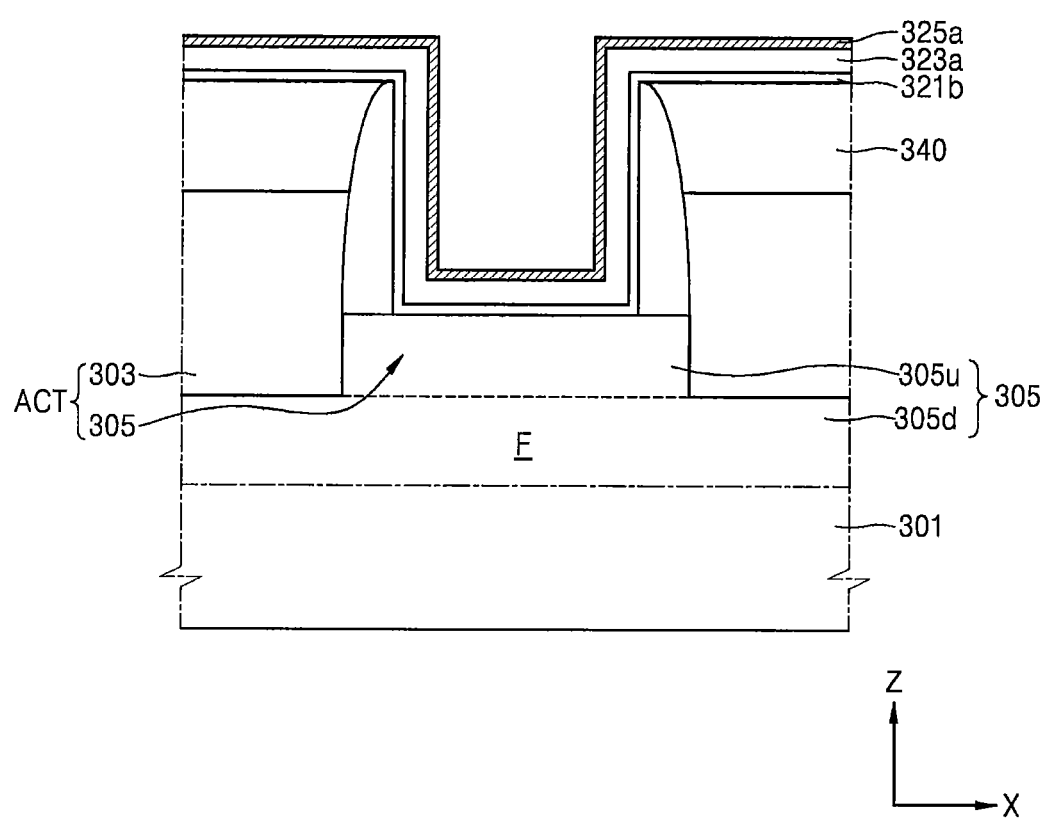
Figure 37C:
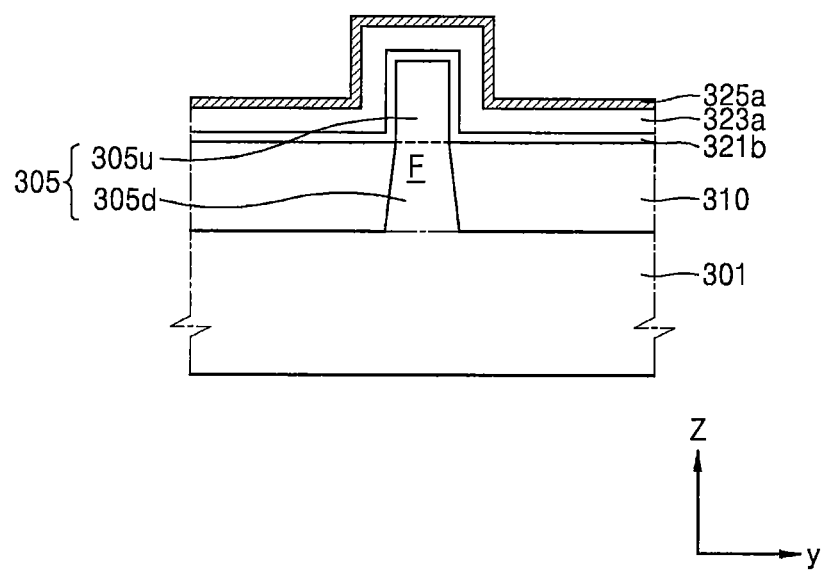

Referring to FIGS. 37A through 37C, an interface layer 321b, a high-dielectric layer 323a, and an RE supply layer 325a are sequentially formed on a product/structure of the semiconductor substrate 301, conformally. Materials and methods of forming of the interface layer 321b, the high-dielectric layer 323a, and the RE supply layer 325a are the same as those described with respect to FIGS. 30A and 30B.

Figure 38A:
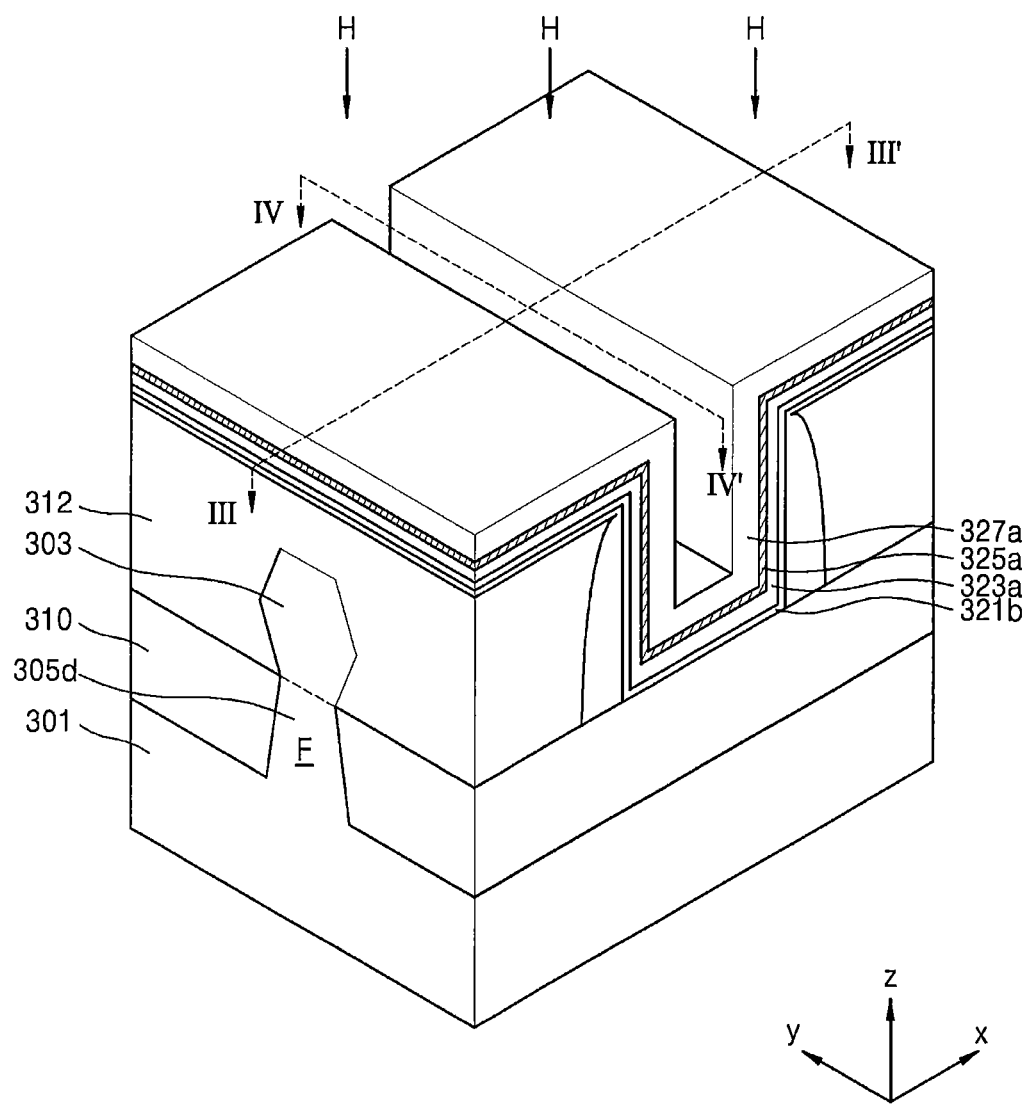
Figure 38B:
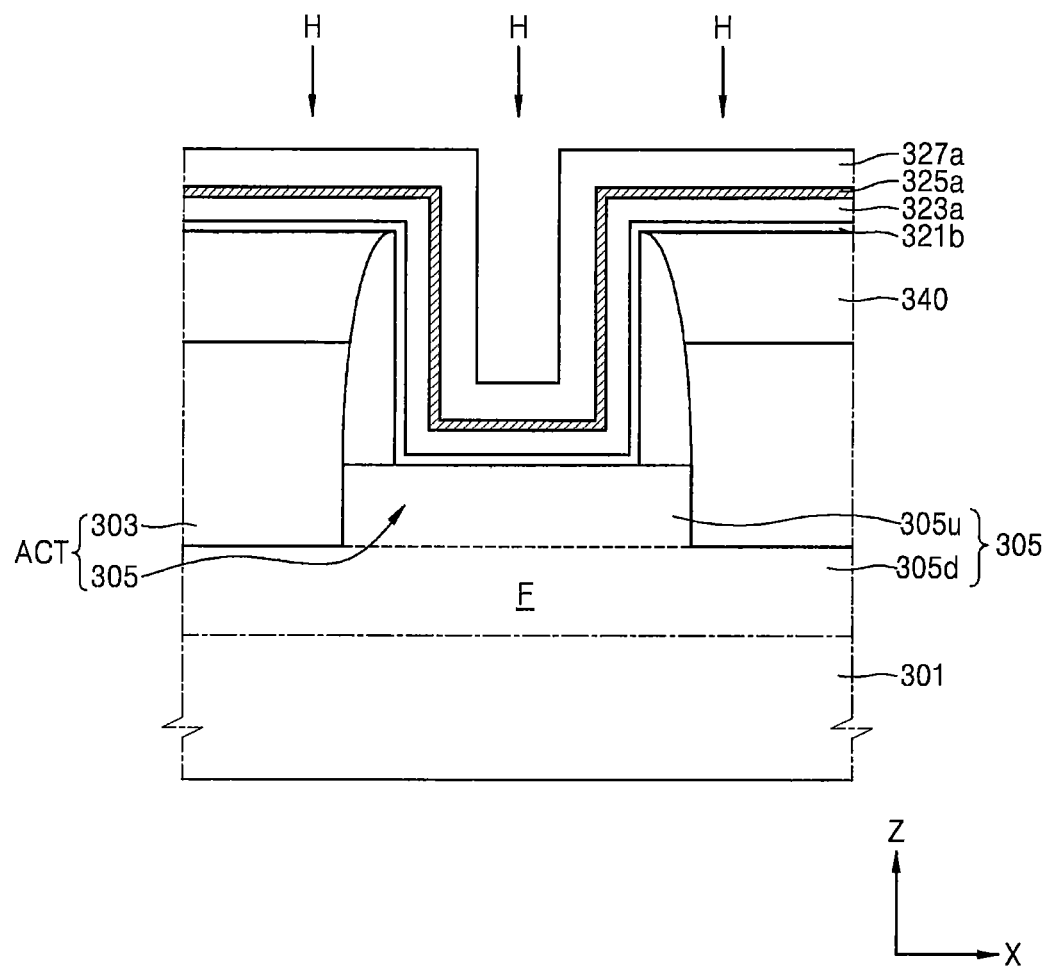
Figure 38C:
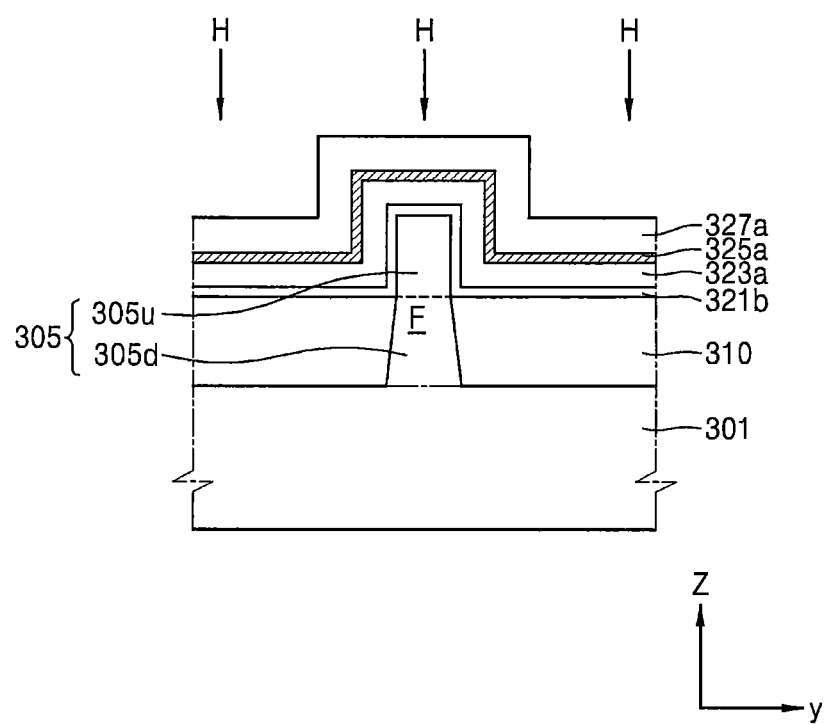

Referring to FIGS. 38A through 38C, after the RE supply layer 325a is formed, a first metal layer 327a is formed, and a heat process H is performed on the first metal layer 327a. Materials and methods of forming the first metal layer 327a are the same as those described with reference to FIG. 30C. Also, objectives of the heat process H are the same as those described with reference to FIG. 30D. According to some example embodiments, the heat process H may be omitted.

Figure 39A:
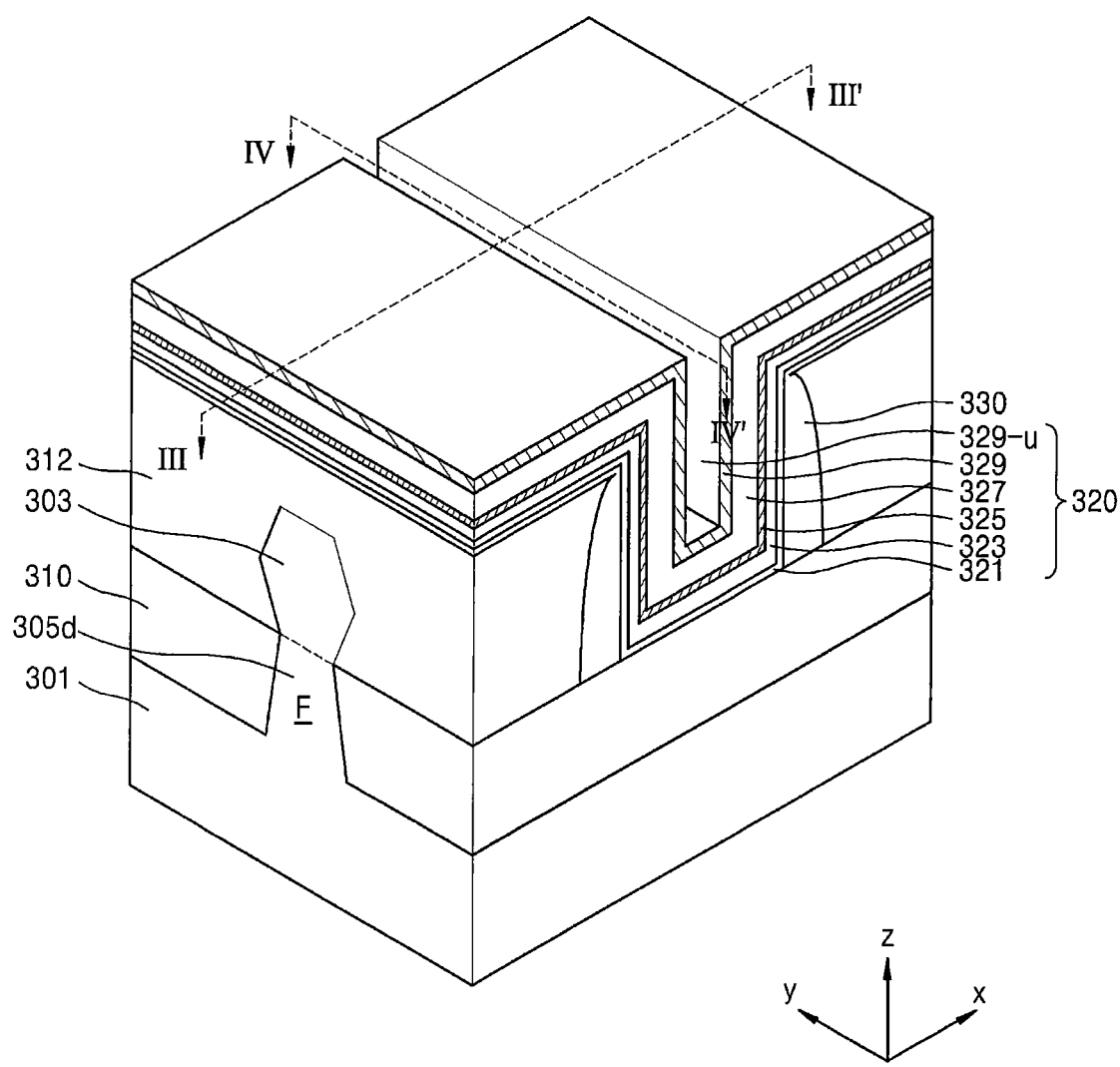
Figure 39B:
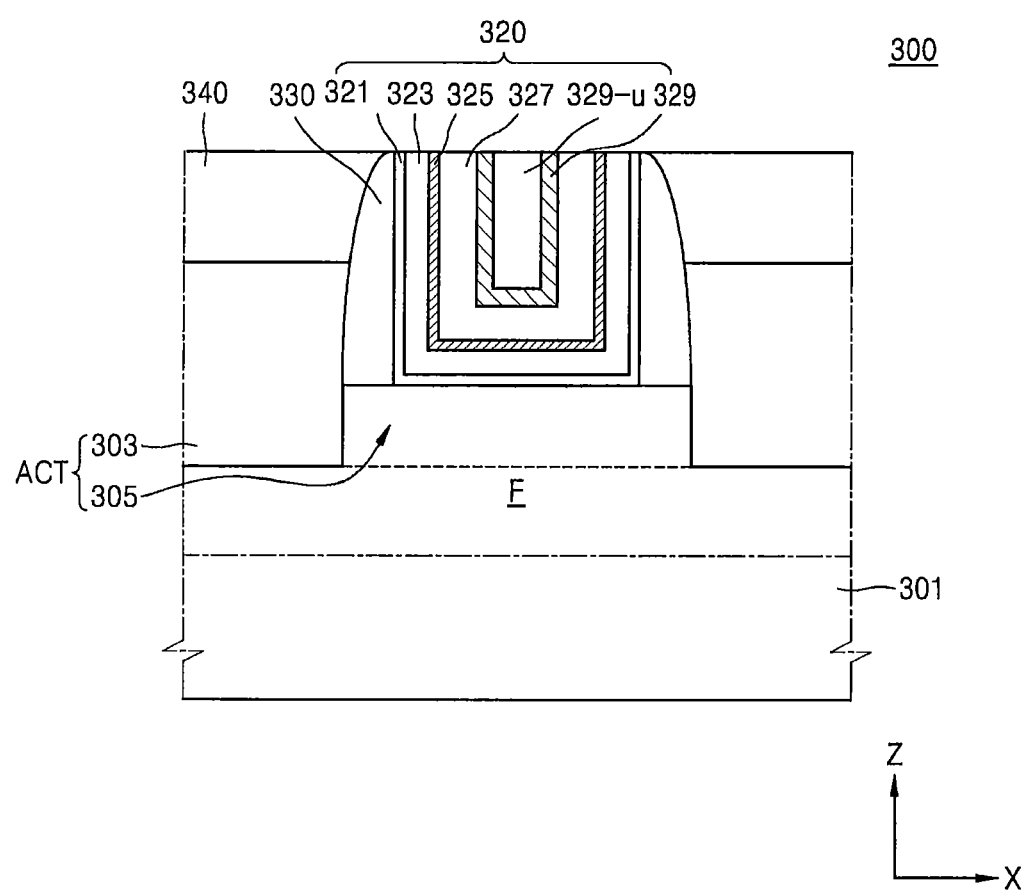
Figure 39C:
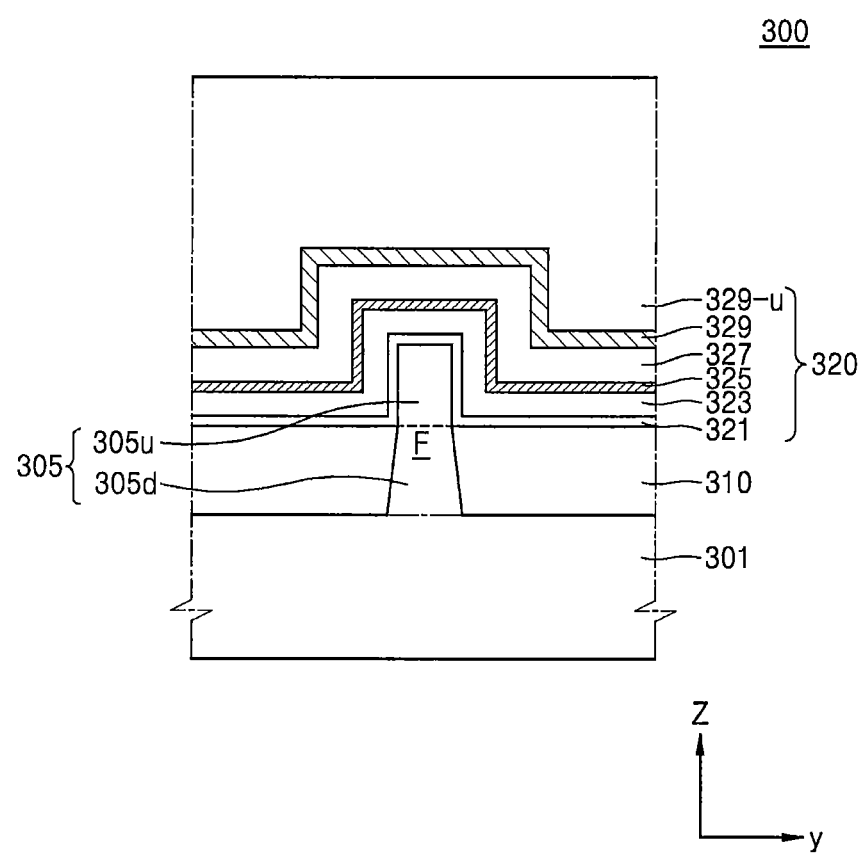

Referring to FIGS. 39A through 39C, after the heat process H (or, when the heat process H is omitted, after the first metal layer 327a is formed), a second metal layer 329a and a gap-fill metal layer 329-u are sequentially formed. Materials and methods of forming the second metal layer 329a and the gap-fill metal layer 329-u are the same as those described with reference to FIGS. 30E and 30F.

After the gap-fill metal layer 329-u is formed, a planarization process is performed. The planarization process may be performed by, for example, a CMP process. The planarization process may be performed so as to expose an upper surface of the interlayer insulating layer 340. By performing the planarization process, a gate structure (e.g., the gate structure 320 of FIG. 16A) may be manufactured.

After the gate structure 320 is formed, a sequential semiconductor process may be performed. The sequential semiconductor process is the same as that described with reference to FIG. 30F.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
 a semiconductor substrate, wherein an upper portion of the semiconductor substrate comprises an active area of the semiconductor substrate; and
 a gate structure on the active area of the semiconductor substrate, the gate structure comprising an interface layer, a high-dielectric layer, a rare earth element (RE) supply layer comprising one or more rare earth elements, a first metal layer comprising the one or more rare earth elements, and a second metal layer, which are sequentially stacked, wherein:
 the first metal layer comprises aluminum (Al);
 the semiconductor device comprises a transistor comprising the active area and the gate structure;
 a threshold voltage of the transistor is determined according to the Al in the first metal layer and a thickness of the first metal layer;
 the threshold voltage is shifted to a first threshold voltage based on the one or more rare earth elements at an interface between the interface layer and the high-dielectric layer; and
 the first threshold voltage is shifted to a second threshold voltage based on the Al and the one or more rare earth elements in the first metal layer.

2. The semiconductor device of claim 1,
 wherein the first threshold voltage is constant due to a constant quantity of atoms of the one or more rare earth elements at the interface between the interface layer and the high-dielectric layer, and
 wherein the second threshold voltage is adjusted based on a composition ratio of the Al to the one or more rare earth elements in the first metal layer.

3. The semiconductor device of claim 1, wherein a quantity of atoms of the one or more rare earth elements at the interface between the interface layer and the high-dielectric layer is independent of a quantity of atoms of the Al in the first metal layer.

4. The semiconductor device of claim 1,
wherein the second metal layer comprises Al, and
wherein the Al of the first metal layer diffused from the second metal layer.

5. The semiconductor device of claim 1, wherein the one or more rare earth elements at the interface between the interface layer and the high-dielectric layer diffused from the RE supply layer.

6. The semiconductor device of claim 1, wherein the RE supply layer comprises one or more of lanthanum (La), scandium (Sc), erbium (Er), strontium (Sr), or yttrium (Yt).

7. The semiconductor device of claim 1,
wherein the high-dielectric layer comprises a hafnium (HO-based material or a zirconium (Zr)-based material,
wherein the first metal layer comprises titanium (Ti) nitride, tantalum (Ta) nitride, Ti oxynitride, or Ta oxynitride, and
wherein the second metal layer comprises an Al compound comprising Ti or Ta.

8. The semiconductor device of claim 1, wherein the second metal layer is free of the one or more rare earth elements.

9. The semiconductor device of claim 1, further comprising:
a barrier metal layer between the first metal layer and the second metal layer; and
a gap-fill metal layer on the second metal layer.

10. A semiconductor device comprising:
a semiconductor substrate;
at least one fin protruding from the semiconductor substrate and extending in a first direction; and,
a gate structure on the at least one fin and extending in a second direction that is perpendicular to the first direction, the gate structure comprising an interface layer, a high-dielectric layer, a rare earth element (RE) supply layer configured to supply one or more rare earth elements, and at least one metal layer comprising the one or more rare earth elements and aluminum (Al), which layers are sequentially stacked, wherein:
the semiconductor substrate comprises a PMOS region and an NMOS region;
the gate structure comprises a first gate structure on the PMOS region;
the semiconductor device further comprises a second gate structure on the NMOS region; and
the first and second gate structures of the PMOS and NMOS regions, respectively, each comprise the RE supply layer and the at least one metal layer.

11. The semiconductor device of claim 10,
wherein a threshold voltage of a fin transistor comprising the at least one fin and the gate structure is determined according to a thickness of the at least one metal layer and an adjustment of a work function of the at least one metal layer due to the Al, and
wherein the threshold voltage is adjusted according to a quantity of atoms of the one or more rare earth elements at an interface between the interface layer and the high-dielectric layer, and according to a composition ratio of the Al to the one or more rare earth elements in the at least one metal layer.

12. The semiconductor device of claim 10,
wherein the at least one metal layer comprises a work function adjusting layer and an Al supply layer,
wherein the work function adjusting layer comprises the one or more rare earth elements and further comprises Al that diffused from the Al supply layer, and
wherein the Al supply layer is free of the one or more rare earth elements diffused from the RE supply layer.

13. The semiconductor device of claim 10,
wherein an interface between the interface layer and the high-dielectric layer comprises the one or more rare earth elements diffused from the RE supply layer, and
wherein the one or more rare earth elements are diffused to the interface independently of a quantity of atoms of the Al that is in the at least one metal layer.

14. A semiconductor device comprising:
an insulating layer comprising a rare earth element;
a rare earth element supply layer on the insulating layer;
a metal electrode that comprises the rare earth element and that is on the rare earth element supply layer, wherein the rare earth element supply layer is between the insulating layer and the metal electrode and is configured to supply the rare earth element to the insulating layer and the metal electrode; and
a semiconductor substrate comprising a PMOS region and an NMOS region, wherein:
the metal electrode is in a first gate structure on the PMOS region;
the semiconductor device further comprises a second gate structure on the NMOS region; and
the first and second gate structures of the PMOS and NMOS regions, respectively, each comprise the rare earth element supply layer.

15. The semiconductor device of claim 14,
wherein the metal electrode comprises first and second metal layers,
wherein the first metal layer is between the rare earth element supply layer and the second metal layer,
wherein the first metal layer comprises the rare earth element and a metal element of the second metal layer,
wherein the insulating layer comprises first and second insulating layers, and
wherein an interface of the first and second insulating layers comprises the rare earth element.

16. The semiconductor device of claim 15, wherein:
the rare earth element comprises lanthanum;
the interface of the first and second insulating layers comprises a plurality of lanthanum elements;
the second insulating layer comprises a high-k dielectric layer;
a peak concentration of lanthanum is at a boundary portion of the high-k dielectric layer and the first metal layer;
the metal element of the second metal layer that is in the first metal layer comprises aluminum;
the first metal layer comprises a work function adjusting layer; and
lanthanum is absent from the second metal layer.

17. The semiconductor device of claim 15, wherein a threshold voltage of a transistor comprising the metal electrode is controlled by:
the rare earth element that is at the interface of the first and second insulating layers; and
the metal element and the rare earth element that are in the first metal layer.

18. The semiconductor device of claim 1, wherein:
the semiconductor substrate comprises a PMOS region and an NMOS region;
the gate structure comprises a first gate structure on the PMOS region;
the semiconductor device further comprises a second gate structure on the NMOS region; and the first and second gate structures of the PMOS and NMOS regions, respectively, each comprise the RE supply layer and the first metal layer.

\* \* \* \* \*